United States Patent [19]
Matsuo et al.

[11] Patent Number: 5,646,885
[45] Date of Patent: Jul. 8, 1997

[54] FAST ACCESSIBLE NON-VOLATILE SEMICONDUCTOR MEMORY DEVICE

[75] Inventors: Ryuichi Matsuo; Makoto Yamamoto, both of Hyogo, Japan

[73] Assignee: Mitsubishi Denki Kabushiki Kaisha, Tokyo, Japan

[21] Appl. No.: 395,249

[22] Filed: Feb. 27, 1995

[30] Foreign Application Priority Data

Apr. 1, 1994 [JP] Japan ................................. 6-064793

[51] Int. Cl.$^6$ .................................................. G11C 11/24
[52] U.S. Cl. ........................ 365/185.05; 365/154; 365/156; 365/185.07; 365/185.28; 365/185.29
[58] Field of Search ........................ 365/185.01, 218, 365/185.05, 185.07, 185.29, 185.28, 154, 156

[56] References Cited

U.S. PATENT DOCUMENTS

| | | | |
|---|---|---|---|
| 4,435,786 | 3/1984 | Tickle | 365/185.07 |
| 5,051,948 | 9/1991 | Watabe et al. | 365/49 |
| 5,051,951 | 9/1991 | Maly et al. | 365/185.07 |
| 5,319,593 | 6/1994 | Wolstenholme | 365/185.05 X |
| 5,463,586 | 10/1995 | Chao et al. | 365/189.09 |

FOREIGN PATENT DOCUMENTS

| | | |
|---|---|---|
| 58-85994 | 5/1983 | Japan . |
| 2-3180 | 1/1990 | Japan . |

OTHER PUBLICATIONS

"A 14-NS 1-MBIT CMOS SRAM with Variable Bit Organization", Kohno et al., IEEE Journal of Solid-State Circuits, vol. 23, No. 5, Oct. 1988, pp. 1060-1066.

*Primary Examiner*—Son T. Dinh
*Attorney, Agent, or Firm*—Lowe, Price, LeBlanc & Becker

[57] ABSTRACT

A non-volatile SRAM cell (MC) includes floating gate type transistors (1a, 1b) arranged between power supply nodes (4a, 4b) and storage nodes (A, B), and flip-flops (2a, 2b) holding signal potentials of the storage nodes. The floating gate type transistor has a drain connected to the power supply node, and a control gate connected to a control electrode node (5). Voltages are applied independently to the drains and the control gate of the floating gate type transistor, whereby a large amount of hot electrons are efficiently generated by avalanche breakdown and are accelerated to be injected into the floating gate. Removal of electrons is achieved by the voltages applied to the control gate and the drain. In the non-volatile SRAM cell utilizing the floating gate type transistor, injection and removal of electrons with respect to the floating gate are efficiently performed to change a threshold voltage for reliably storing information in a non-volatile manner.

27 Claims, 35 Drawing Sheets

MC

| φ2<2> | φ2<1> | φ2<0> | OPERATION CYCLE |
|---|---|---|---|
| 1 | 0 | 0 | DATA LATCH CYCLE |
| 1 | 0 | 1 | HIGH VOLTAGE APPLICATION CYCLE |
| 1 | 1 | 0 | PRE-ERASE WRITE CYCLE |
| 1 | 1 | 1 | ERASE CYCLE |
| 0 | X | X | NORMAL MODE |

| φ4<1> | φ4<0> | OPERATION CYCLE |
|---|---|---|
| 1 | l | ERASE MODE |
| 1 | 1 | HIGH VOLTAGE APPLICATION CYCLE |
| 0 | X | NORMAL OPERATION MODE |

X : ARBITRARY

FAST ACCESSIBLE NON-VOLATILE SEMICONDUCTOR MEMORY DEVICE

BACKGROUND OF THE INVENTION

1. Field of the Invention

The present invention relates to a non-volatile memory device and a non-volatile memory cell which can non-volatilely store information even during power-off, and particularly to a fast accessible non-volatile memory device and a fast accessible non-volatile memory cell. More particularly, the present invention relates to a structure for non-volatilizing stored information during power-off in a semiconductor memory device in which memory cells include flip-flop circuits as components.

2. Description of the Background Art

As a semiconductor device implementing non-volatile storage of information, there has been known a read-only memory (ROM). Among known types of ROMs, a mask ROM stores information by fixedly writing it with a masked interconnection, and an EPROM stores information by electrically writing it. As electrically erasable and programmable memory (EEPROM), there has been known a "flash memory" in which each memory cell is formed of one floating gate type transistor.

FIGS. 54A and 54B schematically show a structure of a memory cell of a conventional flash memory and a sectional structure of the cell, respectively. In FIG. 54A, a memory cell MT is formed of a floating gate type transistor 900 having a floating gate FG for storing electric charges, one conduction terminal connected to a bit line BL, a control gate CD connected to a word line WL and another conduction terminal connected to a source line SL. Although FIG. 54A representatively shows only one memory cell, control gates CG of a plurality of memory cells MT arranged in one row are connected to word line WL, and a plurality of memory cells MT (more specifically, the one conduction terminal of each of transistors 900) arranged in one column are connected to bit line BL.

In FIG. 54B, memory cell MT includes high concentration impurity regions 912 and 914 formed at a surface of a semiconductor substrate 910 (or a well), floating gate FG formed on a region between impurity regions 921 and 914 with a gate insulating film 916 laid therebetween, and control gate CG formed on floating gate FG with an interlayer insulating film 918 interposed therebetween. High concentration impurity region 912 functions as a source region, and is connected to a source line SL. High concentration impurity region 914 functions as a drain region, and is connected to bit line BL. Memory transistor 900 has a threshold voltage which varies depending on a quantity of charges (electrons) existing in floating gate FG. The magnitude of this threshold voltage is made corresponding to "0" or "1". Injection of charges (electrons) into floating gate FG and removal of charges (electrons) from floating gate FG are performed as follows.

When charges are to be injected into the floating gate, a high voltage Vpp, e.g., of about 12 V is applied to control gate CG, and a high voltage Vp, e.g., of about 7 V which is somewhat higher than a normal power supply voltage Vcc is applied to drain region 914 as shown in FIG. 55. A ground potential of 0 V is applied to source region 912 and substrate (well) region 910. In this state, a channel region of a low resistance is formed between drain region 914 and source region 912. Electrons e flow from source region 912 into drain region 914. A high intensity electric field is generated at drain region 914 by the relatively large voltage between the source and drain, and electrons e are excited to be hot electrons by this high electric field at the vicinity of the drain region. Avalanche breakdown increases the quantity of hot electrons generated by the high electric field at the vicinity of the drain region, and the hot electrons near the channel region and drain region 914 are accelerated by the high electric field across control gate CG and substrate region 910 to be supplied into and accumulated in floating gate FG. In the state that a large amount of electrons e are accumulated in floating gate FG, threshold voltage Vth of transistor 900 measured with respect to control gate CG increases.

When electrons are to be removed from floating gate FG, a high voltage Vpa, e.g., of 10 V is applied to source region 912, and drain region 914 is set to an electrical floating state as shown in FIG. 56. The ground potential (0 V) is applied to control gate CG and substrate region 910. In this state, a high voltage between source region 912 and control gate CG is capacitance-divided to be applied across a region between source region 912 and floating gate FG. Owing to the high electric field between source region 912 and floating gate FG, a Fowler-Nordheim tunneling current flows from source region 912 into floating gate FG, so that electrons e stored in floating gate FG flow into source region 912 and electrons are removed from floating gate FG. When electrons accumulated in floating gate FG decreases in quantity, threshold voltage Vth of transistor measured with respect to control gate CG decreases.

More specifically, threshold voltage Vth goes to a value of Vth1 as can be seen from a relationship represented by line I in FIG. 57, when the electrons have been removed from the floating gate. Also, threshold voltage Vth goes to a value of Vth2 and a relationship between the voltage applied to control gate and current between source and drain is represented by a line II when the electrons have been injected into the floating gate.

In the normal operation, i.e., in the data reading operation, the source region is fixed to the ground potential. In a memory cell selecting operation, a predetermined voltage, e.g., at power supply voltage Vcc level is applied to word line WL. The voltage applied to the selected word line is at a level between threshold voltages Vth1 and Vth2. Therefore, the floating gate type transistor is turned on or maintains the off state depending on the quantity of electrons accumulated in the floating gate. The floating gate type transistor maintains the off state even when it is selected, if electrons have been injected into the floating gate and thus the threshold voltage is increased. In this case, a current does not flow through the bit line. Meanwhile, when the floating gate type transistor has a reduced threshold voltage due to removal of electrons from the floating gate, the floating gate type transistor is turned on when selected, and a current flows through the bit line. Data is determined depending on whether the current flows through the bit line or not.

Detection of the current flowing through the bit line is performed by a sense amplifier of a current sense type. The sense amplifier of the current sense type generally converts a current into a voltage, and compares the converted voltage with a reference voltage Vref for reading data. Therefore, as compared with a structure in which a differential amplifier differentially amplifies potentials of signal lines transmitting complementary signals, a long time is required for reading data because voltage change appearing on one data line is sensed, and thus data cannot be read at a high speed.

As a fast accessible semiconductor memory device, there has been known an SRAM (Static Random Access Memory). An SRAM cell includes a flip-flop circuit as a component, as shown in FIG. 59.

In FIG. 59, the SRAM cell is provided corresponding to a crossing between a word line WL and a bit line pair BL and /BL. The SRAM cell includes N-channel MOS transistors 920a and 920b which form the flip-flop circuit and have their gates and drains cross-coupled together, access transistors 922a and 922b which connect storage nodes 923a and 923b to bit lines BL and /BL, respectively, and load elements Z1 and Z2 for pulling up potentials of storage nodes 923a and 923b. Load elements Z1 and Z2 may be formed of resistor elements of a high resistance made of, e.g., polycrystalline silicon, or may be formed of p-channel MOS transistor having a relatively large on-resistance, a thin film transistor or the like.

The flip-flop circuit formed of transistors 920a and 920b latches signal potentials at storage nodes 923a and 923b.

For writing/reading data, the signal potential on word line WL rises to the potential of "H" indicative of the selected state, access transistors 922a and 922b are turned on, and storage nodes 923a and 923b are connected to bit lines BL and /BL. For reading data, the potentials of bit lines BL and /BL change in accordance with the signal potentials held at storage nodes 923a and 923b, and the differential amplifier amplifies the potential difference between bit lines BL and /BL, whereby data is read. For writing data, signal potentials, which correspond to write-data and are logically complementary to each other, are transmitted onto bit lines BL and /BL, and these logically complementary signals corresponding to the write data are transmitted to storage nodes 923a and 923b and latched thereat.

As shown in FIG. 59, the SRAM cell has six elements, and thus is formed of more components than a memory cell, e.g., of an ROM formed of one transistor, resulting in disadvantageous increase of manufacturing cost. However, the storage data is latched by the flip-flop (transistors 920a and 920b), so that the stored information is stably held as long as the power is on, and it is not necessary to perform refreshing which is required, e.g., in a DRAM (Dynamic Random Access Memory) for holding the stored information. Also, a complicated timing control is not required for accessing, and the operation timings can be controlled relatively easily. Further, there are provided paired complementary transmission lines, i.e., bit lines BL and /BL, and the signal potentials on these paired complementary bit lines are differentially amplified, so that a fast operation is implemented. The power supply voltage is applied to storage nodes 223a and 223b of memory cell via load elements Z1 and Z2 of high resistance, and the power consumption of memory cell during a standby state is extremely small, so that backup of the stored information can be performed with a battery (DRAM must perform the refreshing for holding the stored information even during the standby, so that the power consumption thereof is large).

The SRAM having the foregoing advantage, however, loses all the stored information when the power is cut off. Thus, the SRAM shown in FIG. 59 cannot non-volatilely store the information. Therefore, an SRAM with non-volatile storage of information has been proposed.

FIG. 60 shows a structure of a cell of the conventional SRAM having a non-volatile data storage function. In FIG. 60, the non-volatile SRAM includes n-channel MOS transistors QB and QC forming a flip-flop, access transistors QA and QD which are turned on to connect storage nodes A and B to bit lines BL and /BL in response to a signal potential on word line WL, respectively, and floating gate type transistors QF1 and QF2 connected between storage nodes A and B and power potential supply node VC, respectively. Each of floating gate type transistors QF1 and QF2 has a control gate and a drain connected together to a power potential supply node VC. Both floating gate type transistors QF1 and QF2 are kept on and function as load elements during the normal operation (writing and reading of data). In the normal operation, when the signal potential on word line WL attains "H", storage nodes A and B are connected to bit lines BL and /BL, respectively, so that writing or reading of data is performed. Non-volatile storage of data is performed as follows.

The potential of word line WL is set to "L". It is assumed that the potential of storage node A is "H", and the potential of storage node B is "L". The signal potentials of storage nodes A and B are the power supply potential VC level and the ground potential level. In this state, voltage VC applied to power potential supply node VC is raised to a value not lower than a pinch-off voltage of transistors QF1 and QF2. Since the potentials of storage nodes A and B are "H" and "L", respectively, transistor QC is on and transistor QB is off. Therefore, a current does not flow through the floating gate type transistor QF1 regardless of the potential of power voltage supply node VC. Accordingly, the threshold voltage of transistor QF1 does not change.

Meanwhile, a current flows through transistor QF2. Therefore, when the potential of this power voltage supply node VC increases to or above the pinch-off voltage, avalanche breakdown occurs owing to a high drain electric field in transistor QF2, and thus hot electrons are injected into its floating gate, so that the threshold voltage of transistor QF2 increases. Owing to the change of threshold voltages of transistors QF1 and QF2, data "1" is non-volatilely written. The threshold voltages of transistors QF1 and QF2 depend on the quantities of electric charges (electrons) stored in their floating gates, and thus do not change even when the power voltage at power voltage supply node VC is cut off.

When the power supply voltage is supplied to power voltage supply node VC, transistor QF1 is turned on prior to turn-on of transistor QF2, because the threshold voltage of transistor QF1 is lower than that of transistor QF2. Therefore, the potential of storage node A increases above the potential of storage node B, so that transistor QC is turned on prior to turn-on of transistor QB, and the 5 signal potentials of storage nodes A and B are latched by transistors QB and QC forming the flip-flop. Thus, non-volatile data "1" already written is reproduced.

The threshold voltages of transistors QF1 and QF2 are returned to the initial state by ultraviolet ray radiation.

According to the structure of the non-volatile SRAM in the prior art, the floating gates and drains of the floating gate type transistors are connected to the same voltage supply node. A voltage not lower than the pinch-off voltage is applied to the drain to cause the avalanche breakdown for generating hot electrons. Although the avalanche breakdown occurs also at the channel region, hot electrons are generated substantially at the vicinity of the drain region, because a high voltage is applied between the channel and the drain in the pinch-off state. The hot electrons thus generated must be accelerated with a sufficiently large accelerating voltage in order to inject the hot electrons into the floating gate. However, a potential difference is not caused if the same voltage is applied to the control gate and the drain region. Therefore, the hot electrons generated near the drain region cannot be sufficiently accelerated toward the floating gate, and thus the electrons cannot be efficiently injected into the floating gate. In this case, the generated hot electrons are trapped in a gate insulating film, which may impair the reliability of the gate insulating film.

Since the floating gate type transistor is essentially an N-channel MOS transistor of an enhancement type, its current supply capability is set small for achieving a function as a load element. Therefore, the channel current (drain current) is small, and the number of hot electrons generated therein are small. Accordingly, if electrons cannot be injected into the floating gate with a high efficiency, a sufficient amount of electrons cannot be injected into the floating gate, so that necessary and sufficient change of the threshold voltage cannot be caused in the floating gate type transistor, resulting in a problem that reliable non-volatile storage of data is impossible.

Ultraviolet ray radiation is performed for emitting electrons from the floating gate. For this ultraviolet ray radiation, a semiconductor memory device must be accommodated in an expensive package having an ultraviolet ray transparent window, resulting in increase of a cost of the semiconductor memory device.

SUMMARY OF THE INVENTION

An object of the invention is to provide a fast non-volatile memory device.

Another object of the invention is to provide a non-volatile semiconductor memory device in which storage data can be reliably stored in a non-volatile manner.

Still another object of the invention is to provide a non-volatile semiconductor memory cell in which storage data can be reliably stored in a non-volatile manner.

Yet another object of the invention is to provide a non-volatile memory cell for forming a non-volatile memory device allowing fast access.

The present invention provides non-volatile memory devices having various structures, and includes first to third aspects.

A non-volatile semiconductor memory device according to the third aspect includes a plurality of memory cells, each of which includes a pair of MOS transistors cross-coupled to form a flip-flop, and at least one floating gate type transistor coupled as a load element to the MOS transistor pair. The floating gate type transistor stores storage data of the MOS transistor pair. Writing and reading of data is effected on the MOS transistor pair.

A non-volatile semiconductor memory device according to the second aspect includes a plurality of memory cells, each of which includes a pair of MOS transistors cross-coupled to form a flip-flop. The MOS transistor pair includes at least one floating gate type transistor.

A non-volatile semiconductor memory device according to the first aspect includes a plurality of memory cells, each of which includes a pair of floating gate type transistors producing complementary data. The paired floating gate type transistors are connected to a common word line, and are connected in serial between complementary bit lines.

The memory cell or the non-volatile semiconductor memory devices according to the first to third aspects store the complementary data, so that they can transmit complementary data signals in the data writing/reading operation, so that a signal amplitude can be reduced, and thus fast access is allowed.

By programming the floating gate type transistor in accordance with storage data, the data can be non-volatilely stored.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
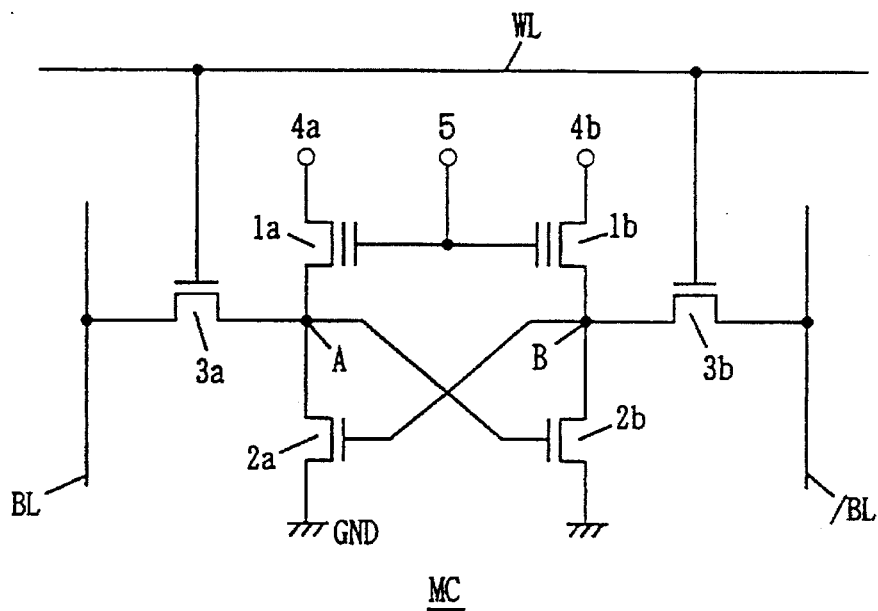
FIG. 1 shows a structure of a memory cell of a non-volatile memory device of a first embodiment of the invention.

FIG. 1 shows a structure of one memory cell in a non-volatile memory device of a first embodiment of the invention.

In FIG. 1, a memory cell MC includes n-channel MOS transistors $2a$ and $2b$ which form a flip-flop for latching signal potentials (storage information) of storage nodes A and B. MOS transistor $2a$ is connected at one of its conduction terminals (drain) to storage node A, and at its gate to storage node B, and is also connected to receive at another of its conduction terminals (source) the ground potential (GND). MOS transistor $2b$ is connected at one of its conduction terminals to storage node B, and at its gate to storage node A, and is also connected to receive the ground potential at another of its conduction terminals.

Memory cell MC further includes a floating gate type transistor $1a$, which is connected between a power supply node $4a$ and storage node A and has a control gate connected to a control electrode node 5, a floating gate type transistor $1b$, which is connected between a power supply node $4b$ and storage node B and has a control gate connected to control gate electrode 5, and access transistors $3a$ and $3b$ which are turned on to connect storage nodes A and B to bit lines BL and /BL in response to the signal potential on word line WL, respectively. Access transistors $3a$ and $3b$ are formed of n-channel MOS transistors.

Floating gate type transistors $1a$ and $1b$ operate as n-channel MOS transistors of the enhancement type. Threshold voltages of floating gate type transistors $1a$ and $1b$ depend on the quantities of electric charges (electrons) stored in the floating gates. Floating gate type transistors $1a$ and $1b$ have relatively large on-resistances, and function as load elements for pulling up the potentials of storage nodes A and B when turned on. Now, an operation of the cell will be described below.

(i) Normal Operation

Figure 2:
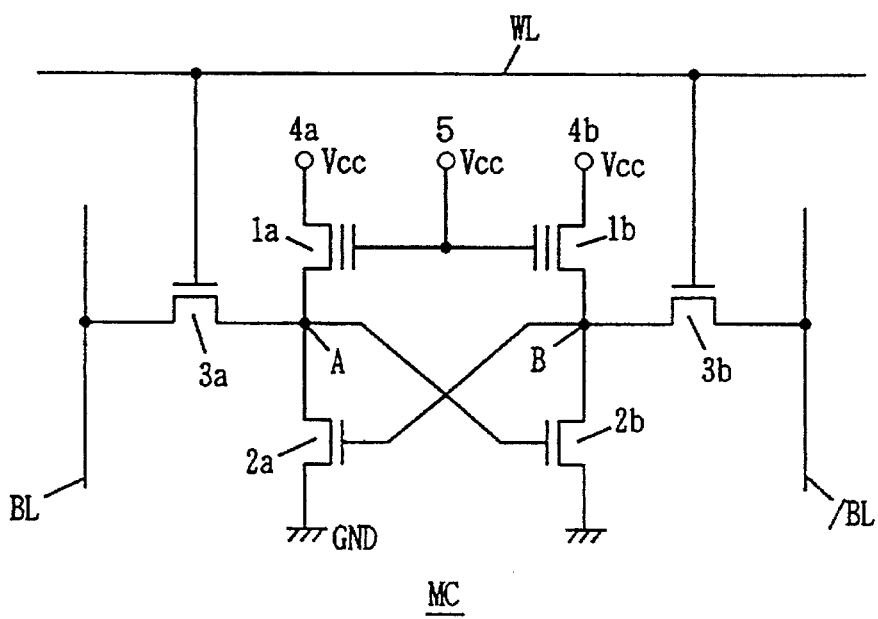
FIG. 2 shows a state of voltage application in an erase mode of the memory cell shown in FIG. 1.

In the normal operation, as shown in FIG. 2, power supply voltage Vcc, e.g., of 5 V is applied to power supply terminals $4a$ and $5b$ and control electrode node 5. Initial threshold voltages Vth of floating gate type transistors $1a$ and $1b$ are set to a value of about 0.7 to about 1.0 V. In this state, both floating gate type transistors $1a$ and $1b$ are on, so that they function as the load elements and can pull up the potentials of storage nodes A and B. When word line WL is selected and its potential rises to "H" of the power supply voltage Vcc level, access transistors 3a and 3b are turned on to connect storage nodes A and B to bit lines BL and /BL, respectively. Then, data is written or read. Therefore, in the normal operation, memory cell MC performs the same operation as an SRAM cell.

(ii) Non-volatile Storage Mode

Figure 3:
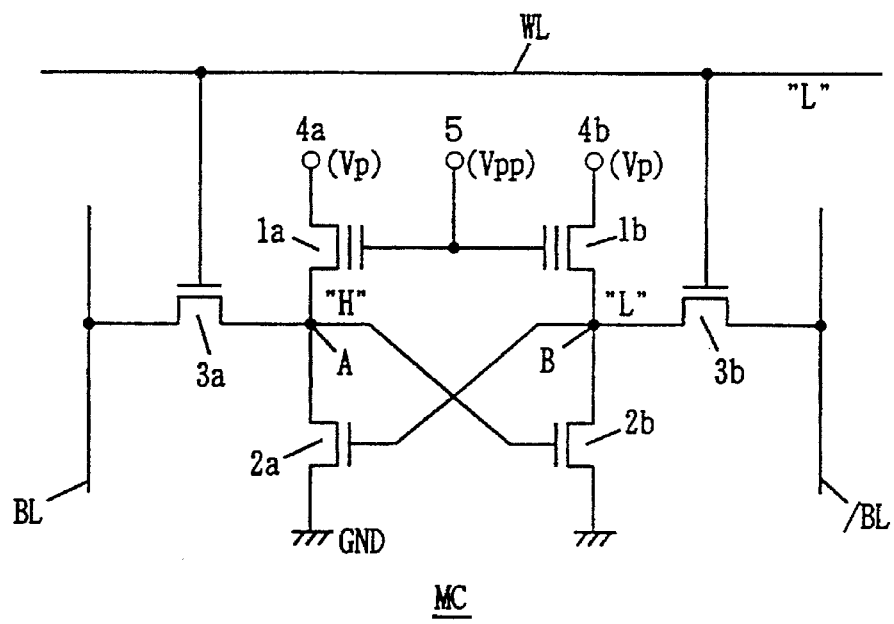
FIG. 3 shows conditions for voltage application in a non-volatile storage mode of the memory cell shown in FIG. 1.

In the non-volatile storage mode, data at storage nodes A and B are non-volatilely stored before cutting off the power. In this non-volatile storage mode, as shown in FIG. 3, a first high voltage Vp (e.g., about 7 V) higher than the power supply voltage Vcc is applied to power supply nodes 4a and 4b, and a second high voltage Vpp (e.g., about 12 V) higher than first high voltage Vp is applied to control electrode node 5. The potential of word line WL is "L". It is assumed that storage node A holds the signal potential of "H", and storage node B holds the signal potential of "L". The signal potentials of "H" and "L" of storage nodes A and B are at the power supply voltage Vcc level and ground potential GND level, respectively. MOS transistor 2a is off, and MOS transistor 2b is on.

In floating gate type transistor 1a, a potential difference of about 2 V exists between power supply node 4a and storage node 1a, and a high electric field is not generated near its drain. Transistor 2a is off, and hence a current does not flow therethrough, so that the avalanche breakdown generating hot electrons does not occur, and hence electrons are not injected into the floating gate. Therefore, the threshold voltage of floating gate type transistor 1a maintains an initial value. On the other hand, in floating gate type transistor 1b, transistor 2b is on, and hence a drain current flows. A potential difference of Vp exists between power supply node 4b and storage node B, and a high electric field is generated near the drain (i.e., region connected to power supply node 4b), so that a large amount of hot electrons are generated near the channel region and drain region owing to the avalanche breakdown. The hot electrons thus generated are accelerated and injected into the floating gate by the high electric field, which is generated by second high voltage Vpp applied to control electrode node 5. This increases the threshold voltage of floating gate type transistor 1b. At this time, a potential difference is present between control electrode node 5 and power supply node 4b, so that the generated hot electrons are surely accelerated and injected efficiently into the floating gate.

As for the change of the threshold voltage, if a difference of about 0.1 V exists, the signal potentials of storage nodes A and B can be non-volatilely stored. It is, however, desirable to change the threshold voltage by about 0.5 V or more in view of fluctuation of the element characteristics caused during manufacturing, fluctuation of the impurity concentration at the channel region, fluctuation of the transistor sizes (channel lengths and channel widths) caused by tolerance in mask alignment and others. For example, the threshold voltage is changed to about 6 or about 7 V by injection of electrons, if high voltages Vpp and Vp are applied for about 10 to 20 microseconds, and the initial threshold voltage is in a range of 0.7 to 1.0 V in the case where a gate insulating film between the floating gate and the channel region has a film thickness Tox (measured as an oxide film) of about 100 Å, first high voltage Vp is about 7 V, and second high voltage Vpp is about 12 V.

Through a series of operations described above, the signal potentials of storage nodes A and B are non-volatilely stored as the threshold voltages of floating gate type transistors 1a and 1b. Thereafter, the power is turned off. Even when the power is off, the floating gates of floating gate type transistors 1a and 1b are electrically floated because they are surrounded by insulating films, so that electrons accumulated in the floating gates are confined in the floating gates, and thus the threshold voltages of floating gate type transistors 1a and 1b do not change. Thereby, data stored in storage nodes A and B can be non-volatilely stored even when the power is off.

When the power is turned on, power supply voltage Vcc is applied to power supply nodes 4a and 4b as well as control electrode node 5. When the threshold voltage of floating gate type transistor 1b has been increased to a value of about 6 to about 7 V, floating gate type transistor 1b is off, and a current does not flow from power supply node 4b to storage node B, even if power supply voltage Vcc is applied to control electrode node 5. Meanwhile, the threshold voltage of floating gate type transistor 1a maintains the initial value within a range of about 0.7 to about 1.0 V, and floating gate type transistor 1a is turned on in accordance with application of power supply voltage Vcc to control electrode node 5, so that storage node A receives the current from power supply node 4a and raises its potential. Thereby, the potential of storage node A is set to "H", and the potential of storage node B is set to "L". MOS transistors 2a and 2b latch the signal potentials of storage nodes A and B. Through a series of operations described above, the signal potentials of storage nodes A and B before the power-off are reproduced.

In the above description, the threshold voltage of floating gate type transistor 1b changes to a value of about 6 to about 7 V. However, as already described, only a difference of 0.5 V or more is required between the threshold voltages of floating gate type transistors 1a and 1b, and hence no problem occurs even when the threshold voltage of floating gate type transistor 1b may be changed only up to a value of 2 to 3 V. Upon power-on, the voltage of control electrode node 5 rises to about 5 V. In this operation, floating gate type transistor 1a having a lower threshold voltage is first turned on and supplies a current to storage node A to raise the potential of storage node A. In accordance with the rise of potential of storage node A, MOS transistor 2b is first turned on to discharge storage node B. Thereby, MOS transistor 2a maintains the off state, and the signal potentials of storage nodes A and B are reliably latched by the flip-flop formed of MOS transistors 2a and 2b.

The threshold voltages of floating gate type transistors 1a and 1b change more largely as higher voltages Vpp and Vp are applied to power supply nodes 4a and 4b as well as control electrode node 5, and/or they are applied for a longer time. Therefore, by appropriately adjusting the values of high voltages Vpp and Vp as well as the time for application of them, it is possible to attain the optimum values of changes of the threshold voltages.

When the non-volatile storage mode described above is executed, the memory device can be utilized as the memory (ROM) storing fixed data. In order to achieve the same operation as an SRAM, floating gate type transistors 1a and 1b must have an equal threshold voltage. For this purpose, the following erase mode is performed.

(iii) Erase Mode

Figure 4:
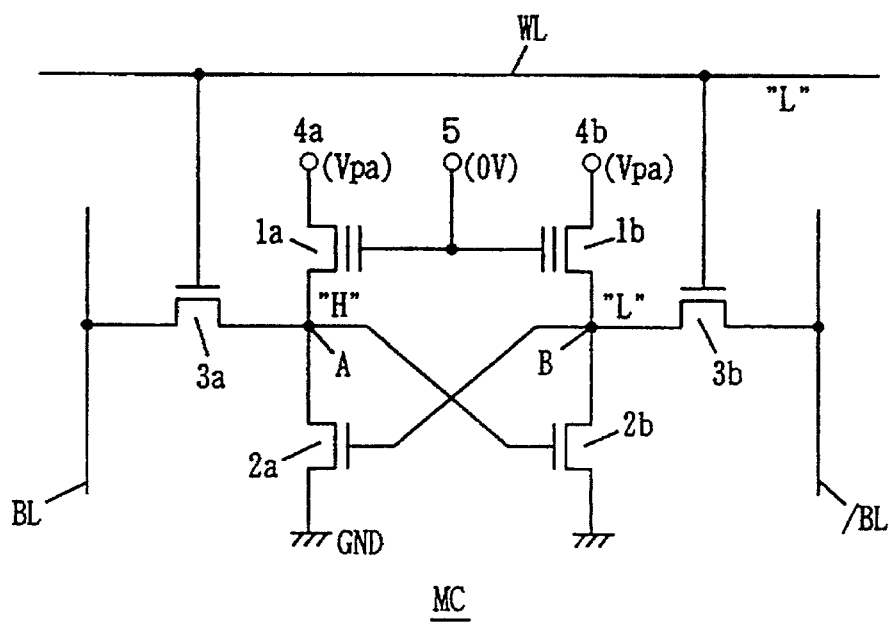
FIG. 4 shows conditions for voltage application in an erase mode of the memory cell shown in FIG. 1.

In the erase mode, as shown in FIG. 4, word line WL is deselected, a high voltage Vpa is applied to power supply nodes 4a and 4b, and a voltage of the ground potential level is applied to control electrode node 5. The voltage level of high voltage Vpa is between first and second high voltages Vp and Vpp, and is, for example, about 10 V. 0 V is applied to the substrate region of transistors 1a and 1b. It is assumed that storage nodes A and B hold the signal potentials of "H" and "L", respectively. In floating gate type transistor 1b, a high electric field between the control gate and the drain causes a Fowler-Nordheim tunneling current, so that electrons accumulated in the floating gate flow to power supply node 4b and the threshold voltage of floating gate type transistor 1b returns to the initial value.

Meanwhile, in floating gate type transistor 1a, a voltage of power supply voltage level Vcc is applied to storage node A, and the floating gate is subjected to the electric field caused by both high voltage Vpa of power supply node 4a and power supply voltage Vcc of storage node A in the floating state. In floating gate type transistor 1a, the high electric field caused by the potential difference between power supply node 4a and control electrode node 5 is relaxed by the "H" potential of storage node A, so that a Fowler-Nordheim tunneling current does not flow, and no (or an extremely small amount of) electron(s) flows from the floating gate. Thereby, floating gate type transistor 1a substantially maintain the threshold voltage of the initial value.

Figure 5:
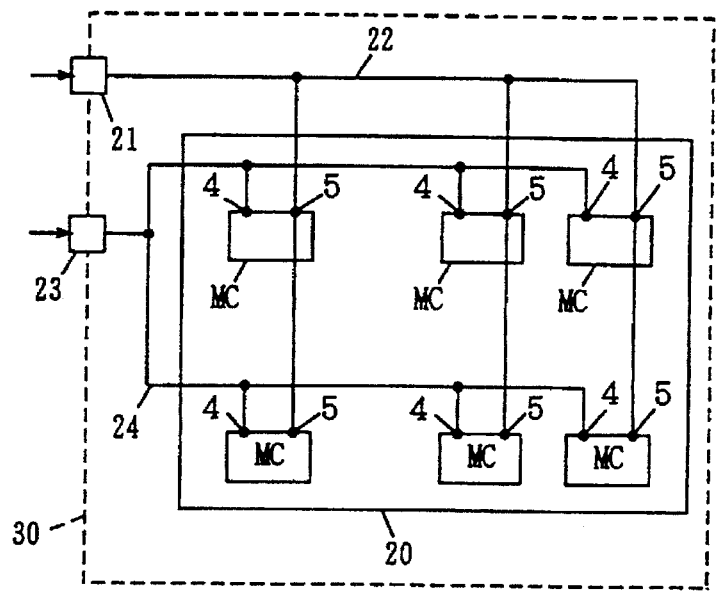
FIG. 5 shows a structure for applying various voltages in accordance with respective operation modes in the first embodiment.

FIG. 5 shows a structure for selectively generating the high voltage. In FIG. 5, a semiconductor memory device includes pads 21 and 23 disposed on a periphery of a chip 30, and a memory cell array 20 including memory cells MC arranged in a matrix of rows and columns. To pad 21 is connected a lead line 22, which is connected to control electrode node 5 of each memory cell MC in memory cell array 20. To pad 23 is connected a lead line 24, which is connected to power supply node 4 (generically indicating the nodes 4a and 4b) of each memory cell MC in memory cell array 20. Predetermined voltages are applied to pads 21 and 23 in accordance with the operation mode. In the non-volatile storage mode, high voltage Vpp is applied to pad 21, and high voltage Vp is applied to pad 23. In the erase mode, ground potential GND of 0 V (or an appropriate voltage which can be higher than 0 V) is applied to pad 21, and high voltage Vpa is applied to pad 23. In the normal operation mode, power supply voltage Vcc is applied to pads 21 and 23.

Figure 6:
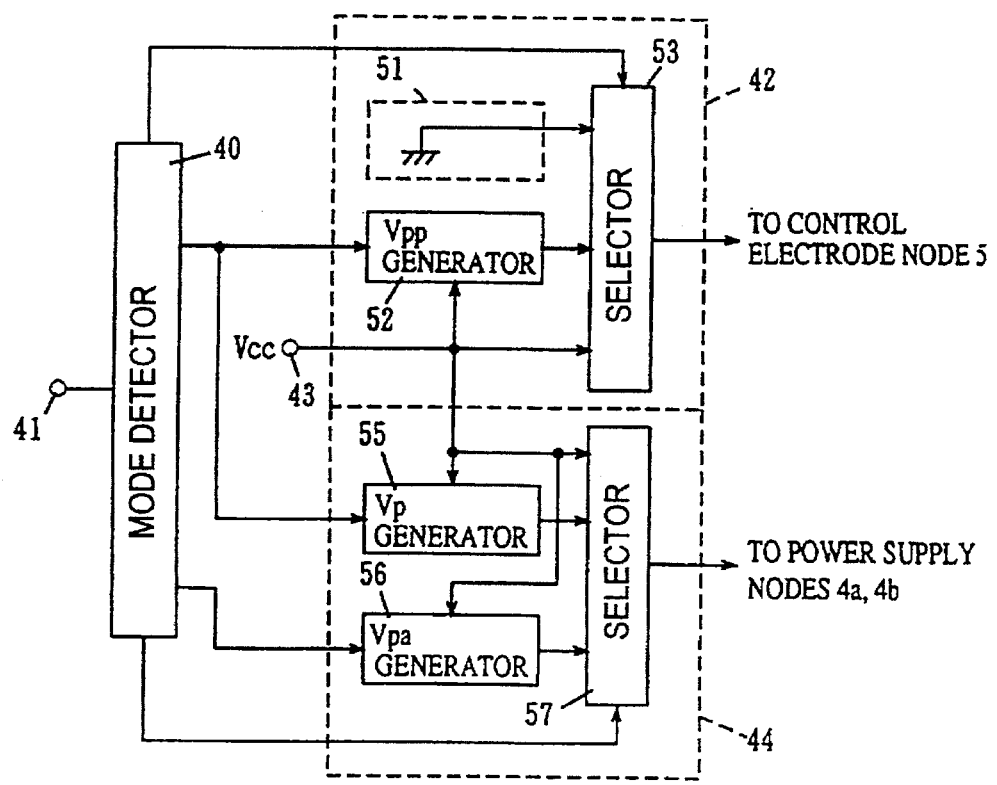
FIG. 6 shows another structure for switching and applying voltages in accordance with respective operation modes in the first embodiment.

FIG. 6 shows another structure of the voltage generating circuit selectively generating the high voltages. In FIG. 6, the high voltage generating circuit includes a mode detecting circuit 40 which detects the designated or specified operation mode in accordance with the control signal applied to a node 41 and generates a control signal indicative of the designated operation mode, a voltage control circuit 42 which generates the voltage to be applied to control electrode node 5 in accordance with the operation mode designating signal sent from mode detecting circuit 40, and a voltage generating circuit 44 which generates the voltage to be applied to power supply nodes 4a and 4b in accordance with the operation mode designating signal sent from the mode detecting circuit 40.

Mode detecting circuit 40 detects a designated operation mode in accordance with a combination of states of, e.g., external control signals such as a chip enable signal/CE and/or an output enable signal/OE and a predetermined address signal applied to a particular address signal input terminal. Voltage generating circuit 42 includes a ground potential generating circuit 51 generating the ground potential level voltage, a Vpp generating circuit 52 which produces high voltage Vpp from power supply voltage Vcc applied to node 43, and a selector circuit 53 which selects one of the output of ground potential generating circuit 51, the output of Vpp generating circuit 52 and power supply voltage Vcc applied to node 43 in accordance with the operation mode designating signal sent from mode detecting circuit 40 and applies the selected voltage to control electrode node 5.

Voltage generating circuit 44 includes a Vp generating circuit 55 producing high voltage Vp from power supply voltage Vcc, a Vpa generating circuit 56 producing high voltage Vpa from power supply voltage Vcc, and a selector circuit 57 which selects one of power supply voltage Vcc and high voltages Vp and Vpa in accordance with the operation mode designating signal sent from mode detecting circuit 40, and transmits the selected voltage to power supply nodes 4a and 4b. Vpp generating circuit 52, Vp generating circuit 55 and Vpa generating circuit 56 are activated to produce the corresponding high voltages from power supply voltage Vcc when they receive the corresponding operation mode designating signals from mode detecting circuit 40. In the structure shown in FIG. 6, the voltages applied to control electrode node 5 and power supply nodes 4a and 4b are produced under the control of mode detecting circuit 40. Therefore, an external circuit is not required to generate selectively several kinds of voltages in accordance with the operation mode, so that a load against the external circuit can be reduced. In FIG. 6, mode detecting circuit 40 receives power supply voltage Vcc applied to node 43, and mode detecting circuit 40 uses power supply voltage Vcc as its operation power voltage.

According to the first embodiment, as described above, the load element of SRAM cell is formed of a floating gate type transistor, and the control electrode node for applying the voltage to the control gate of the floating gate type transistor is provided independently from the power supply node for applying the voltage to one conduction terminal (drain). Therefore, a sufficient potential difference can be provided between the control gate of floating gate type transistor and the one conduction terminal (drain), so that hot electrons generated by avalanche breakdown can be surely accelerated and efficiently injected into the floating gate, and hence the threshold voltage can be reliably changed. Thereby, the SRAM cells and SRAM can be provided which can reliably store the storage information in the non-volatile manner. The erase operation for returning the changed threshold voltage to the initial value can be electrically performed, and hence it is not necessary to provide an ultraviolet ray transparent window for ultraviolet ray radiation, so that SRAM chips can be packaged with inexpensive packages, and thus non-volatile SRAMs can be produced inexpensively.

[Modification]

Figure 7:
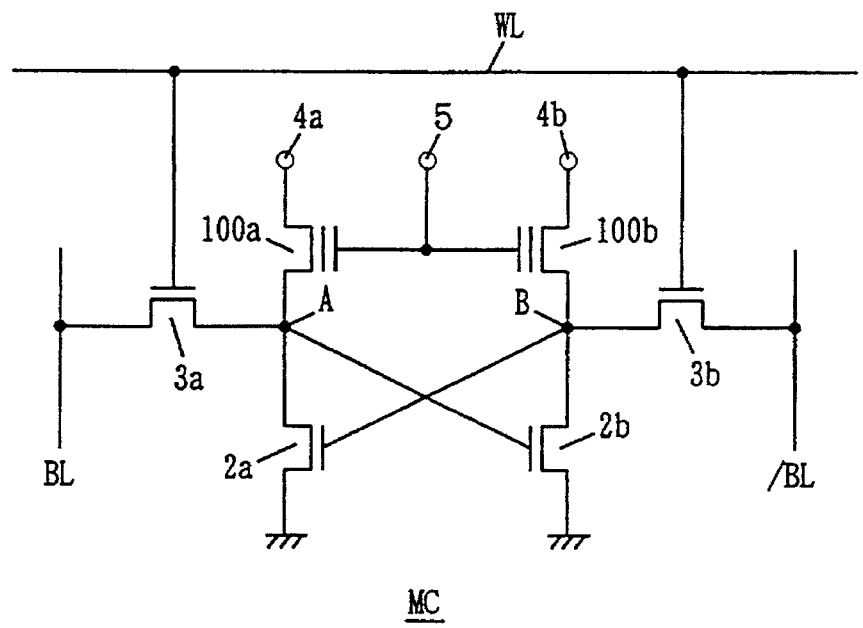
FIG. 7 shows a structure of a memory cell of a non-volatile semiconductor memory device of a modification of the first embodiment of the invention.

FIG. 7 shows a structure of a non-volatile memory cell which is a modification of the first embodiment of the invention. In FIG. 7, non-volatile memory cell MC includes n-channel MOS transistors 2a and 2b cross-coupled together to form a flip-flop, and floating gate type transistors 100a and 100b functioning as load elements. Floating gate type transistor 100a is connected at one of its conduction terminals to power supply node 4a, at its control gate to control electrode node 5 and another (source) of its conduction terminals to storage node A. Floating gate type transistor 100b is connected at one (drain) of its conduction terminal to power supply node 4b, at its control gate to control electrode node 5 and at another (source) of its conduction terminal to storage node B.

The structure of non-volatile memory cell shown in FIG. 7 is the same as that of the non-volatile memory cell shown in FIG. 1 except for that the initial values of threshold voltages of floating gate type transistors 100a and 100b are negative. Thus, floating gate type transistors 100a and 100b function as n-channel MOS transistors of a depletion-type, and is normally on.

Figure 8:
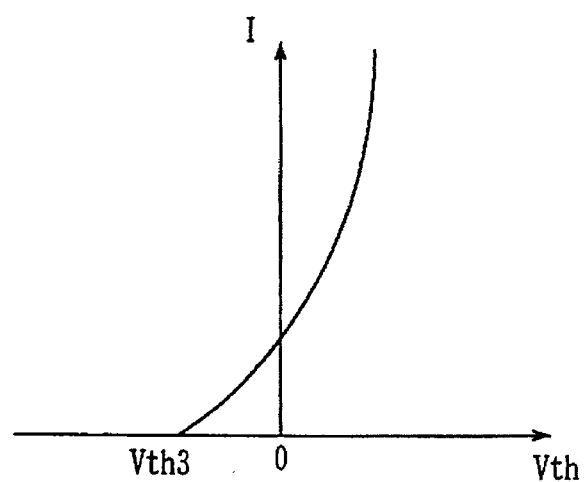
FIG. 8 shows an initial state of a floating gate type transistor included in the memory cell shown in FIG. 7.

More specifically, floating gate type transistors 100a and 100b are set to an "over-erased" state as shown in FIG. 8, and an initial value Vth3 of their threshold voltages are set to a negative voltage Vth3. The "over-erased" state is attained by electrically and excessively removing electrons from the floating gate. Alternatively, the impurity concentration of the channel region may be reduced. By effecting the erase operation on floating gate type transistors 100a and 100b in the initial setting operation, initial threshold voltages Vth of floating gate type transistors 100a and 100b are set to a negative voltage. The threshold voltages of floating gate type transistors 100a and 100b in the "over-erased" state have a substantially constant minimum value. When electrons are removed from the floating gate and holes in the floating gate increase in number, a high electric field caused by a high voltage applied to the source region during the erase operation is mitigated by the increased holes in the floating gate, so that a Fowler-Nordheim tunneling current does not flow, and electrons are not removed. Thereby, the minimum value of the threshold voltage of the floating gate type transistor in the over-erased state can be established, and the threshold voltages of all the floating gate type transistors contained in the semiconductor memory device can be set to a substantially constant negative value.

The on-resistances of floating gate type transistors 100a and 100b are set to a sufficiently large value. Operation of storing the signal potentials of storage nodes A and B in the non-volatile storage mode is the same as that already described with reference to FIG. 3, and also the voltages are applied under the same conditions.

In one of the floating gate type transistors, hot electrons are generated by the avalanche breakdown, and electrons are injected into the floating gate. Thereby, the signal potentials of storage nodes A and B can be converted into threshold voltage information for non-volatile storage.

In the erase mode, control electrode node 5 and power supply nodes 4a and 4b are supplied with the same voltages as those shown in FIG. 4. More specifically, power supply nodes 4a and 4b receive high voltage Vpa, e.g., of about 10 V, and control electrode node 5 receives the ground potential of 0 V. It is assumed that storage nodes A and B hold data of "H" and "L", and more specifically, at the power supply voltage level Vcc and the ground potential level, respectively. The threshold voltage of floating gate type transistor 100b has risen. In floating gate type transistor 100b, a Fowler-Nordheim tunneling current is caused by a high electric field between the control gate and one conduction terminal (drain), and electrons accumulated in the floating gate are removed. In this operation, the erasing time may be increased to some extent or high voltage Vpa may be increased above 10 V, whereby electrons can be excessively removed from the floating gate, so that the initial state of floating gate type transistor 100b is set to the "over-erased" state, and its threshold voltage can be set to a negative voltage.

Floating gate type transistor 100a maintains the on state even if the ground potential (0 V) is applied to control electrode node 5. The potential of storage node A is at power supply voltage Vcc level. Therefore, even if high voltage Vpa is applied to power supply node 4a, only a small difference is caused between the source and the drain (power supply node 4a and storage node A), and a high electric field is not generated, so that a Fowler-Nordheim tunneling current does not flow. The floating gate type transistor 100a maintains the initial state, i.e., "over-erased" state, and its threshold voltage is of a saturated value. Also for these reasons, the tunneling current does not flow in the floating gate type transistor 100a. Thereby, both floating gate type transistors 100a and 100b can be surely set to the initial state.

Figure 9:
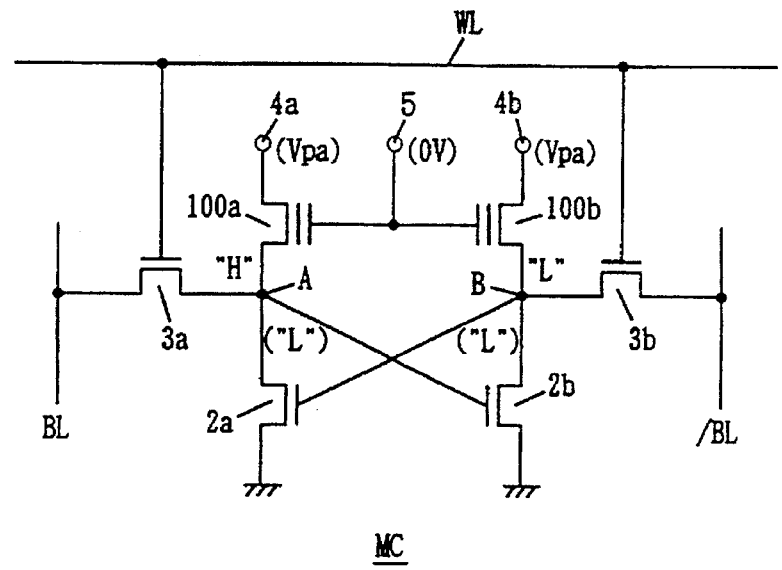
FIG. 9 shows conditions for voltage application in an erase mode in the second embodiment of the invention.

If both floating gate type transistors 100a and 100b are set to the "over-erased" state, both storage nodes A and B may be set to "L" potential as shown in FIG. 9. In this case, the floating gate type transistor in the "over-erased" state has the threshold voltage of a saturated value, the tunneling current does not flow from its floating gate to power supply node 4 (4a or 4b), and the initially set threshold voltage can be held. Therefore, even if the potentials are set under the above conditions, non-volatile storage information can be erased to attain the initial state. (In this case, however, data of storage nodes A and B are destroyed, so that the data must be save on an external storage device or the like before the erase mode if the data is to be used thereafter).

The structure for setting both storage nodes A and B to "L" can be implemented by utilizing a structure which sets all word lines WL and all bit lines BL and /BL to the selected state in the erase operation, and sets both of complementary write data signals supplied from a write circuit (not shown) to "L".

Figure 10:
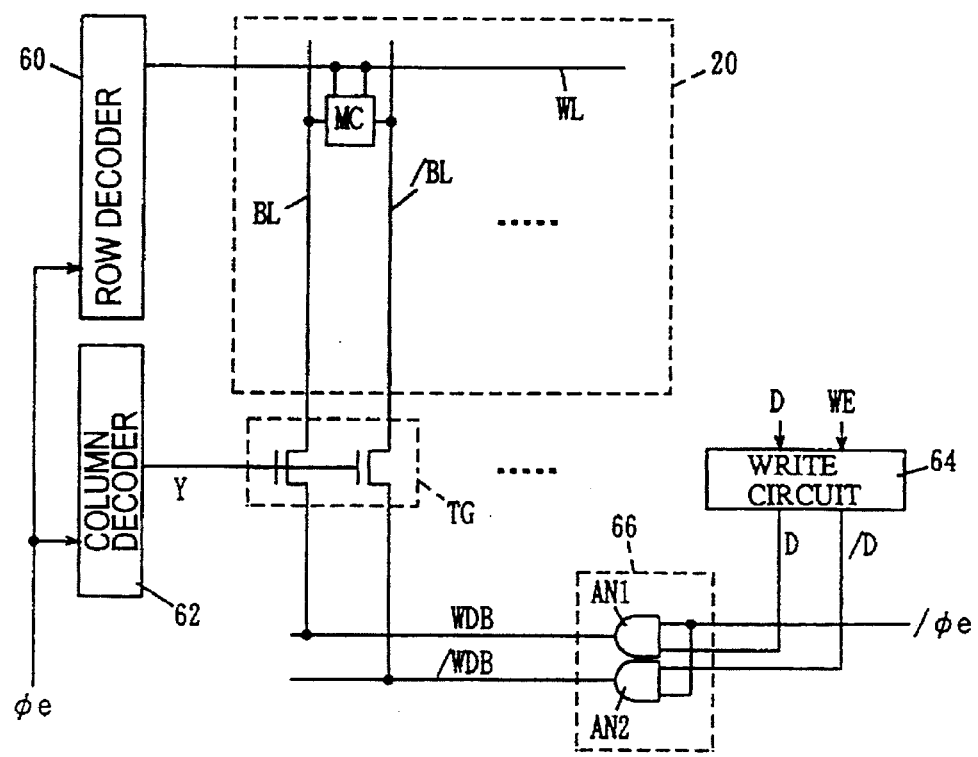
FIG. 10 schematically shows a whole structure of the non-volatile memory device of the first embodiment.

FIG. 10 schematically shows a structure for setting both storage nodes A and B to "L" in the erase operation. FIG. 10 representatively shows one word line WL and a pair of bit lines BL and /BL in memory cell array 20.

In FIG. 10, a row decoder 60 decodes an address signal (not shown) to generate a word line drive signal for selecting the corresponding word line in the memory cell array 20, and transmits the word line drive signal onto the selected word line. A column decoder 62 decodes a column address signal (not shown) and generates a column select signal Y for selecting the corresponding column (bit line pair) in memory cell array 20. A column select gate TG is arranged between bit line pair BL and /BL and an internal write data line pair WDB and /WDB. Column select gate TG is provided corresponding to each bit line pair BL and /BL. Column select signal Y sent from column decoder 62 is applied to column select gate TG, and column select gate TG receiving the column select signal in the selected state is turned on, so that bit lines BL and /BL are connected to internal write data line pair WDB and WDB. A write circuit 64 and a write control circuit 66 are provided for internal write data line pair WDB and WDB. Write circuit 64 produces internal write data in response to write data D and write enable signal WE, and applies the internal write data to write control circuit 66. Write circuit 64 is activated to produce complementary internal write data D and /D from write data D when write enable signal WE is active and hence "H".

Write control circuit 66 is responsive to an erase mode instruction signal /φe to transmit internal write data D and /D sent from write circuit 64 onto internal write data line pair WDB and /WDB. Write control circuit 66 includes an AND circuit AN1 provided for internal write data line WDB and an AND circuit AN2 provided for internal write data line /WDB. AND circuit AN1 receives internal write data D from write circuit 64 and also receives erase mode instruction signal /φe. AND circuit AN2 receives internal write data /D from write circuit 64 and also receives erase mode instruction signal /φe. Erase mode instruction signal /φe attains "L" during the erase mode, and attains "H" during the modes other than the erase mode. Therefore, during the erase mode, erase mode instruction signal /φe attains "L", and the potentials of internal write data lines WDB and /WDB attain "L".

Row decoder 60 and column decoder 62 receive an erase mode instruction signal φe which is logically complementary to erase mode instruction signal /φe. Erase mode instruction signal φe attains "H" during the erase mode operation. Row decoder 60 and column decoder 62 generate signals for selecting all of word lines WL and bit line pairs BL and /BL in memory cell array 20, when erase mode instruction signal φe is active (i.e., "H"). Thereby, all the word lines in memory cell array 20 are selected, and all bit line pairs BL and /BL are connected to internal write data lines WDB and /WDB through column select gates TG. Thereby, the potentials of "L" can be transmitted to storage nodes A and B as indicated within brackets "( )" in FIG. 9.

As described above, in this second embodiment, floating gate type transistors 100a and 100b of which initial state is the "over-erased" state are employed, whereby the ground potential can be applied to control electrode node 5 in the normal operation mode, so that a current consumption can be reduced. The structure of the first embodiment shown in FIG. 6 can be utilized in this modification as the structure for controlling the voltages applied to power supply nodes 4a and 4b as well as control electrode node 5. More specifically, the structure can be utilized in which selector circuit 53 shown in FIG. 6 selects the ground potential generated by ground potential generating circuit 51 in accordance with the mode detection instructing signal sent from mode detection circuit 40 in the normal operation mode.

[Embodiment 2]

Figure 11A:
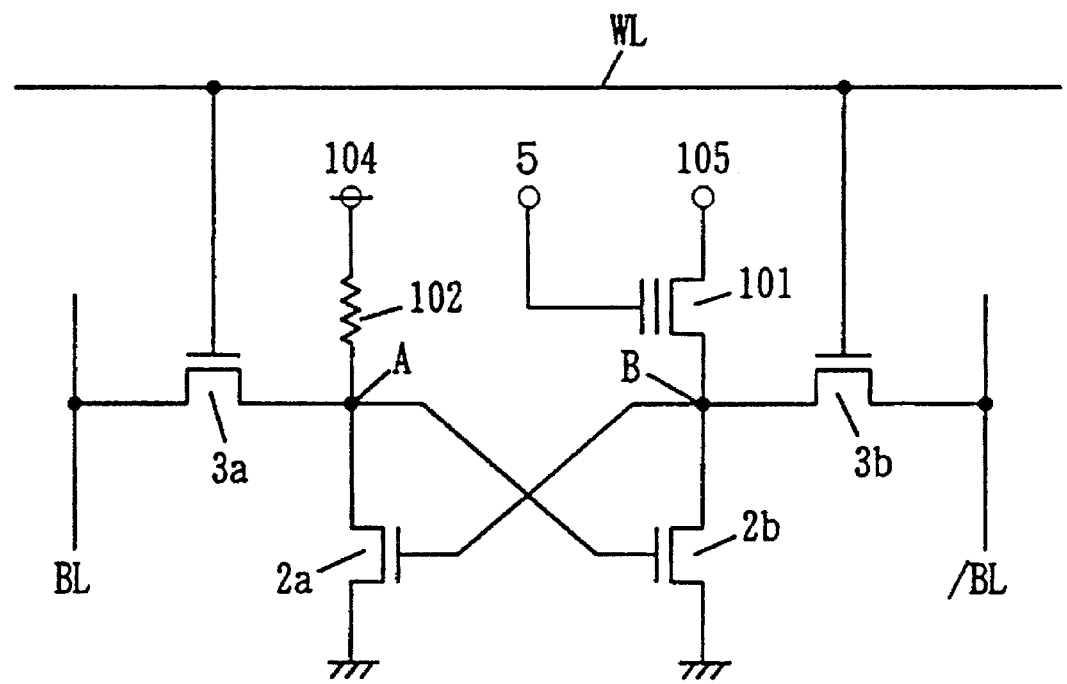
FIGS. 11A and 11B show a structure of the non-volatile memory cell of a second embodiment and conditions for voltage application in the non-volatile storage mode of the same.
Figure 11B:
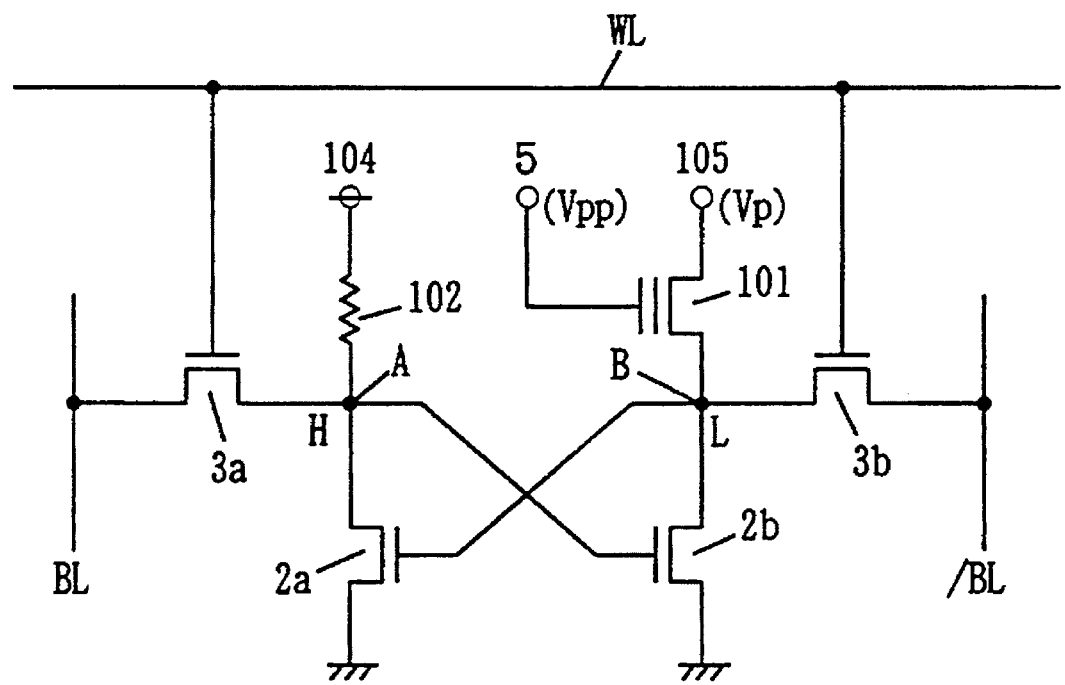

FIGS. 11A and 11B show a structure of a non-volatile memory device of a second embodiment of the invention. In FIG. 11A, a non-volatile memory cell includes n-channel MOS transistors 2a and 2b cross-coupled together to form a flip-flop for latching signal potentials of storage nodes A and B, a high resistance load element 102 connected between a power supply node 104 and storage node A, a floating gate type transistor 101 which is connected at one (drain) of its conduction terminal to a power supply node 105, at its control gate to control electrode node 5 and at another (source) of its conductive terminals to storage node B, and access transistors 3a and 3b which are turned on in response to the signal potential on word line WL to connect storage nodes A and B to bit lines BL and /BL, respectively.

Floating gate type transistor 101 in the initial state has an on-resistance equal to that of high resistance load element 102. Generally, a drain current Ids flowing through an MOS transistor can be expressed by the following formula:

$$Ids = \beta \cdot f(Vgs - Vth)$$

where f() represent a certain function, β represents a constant depending on a size of the MOS transistor, Vgs represents a voltage between gate and source, and Vth represents a threshold voltage. As |Vgs−Vth| increases, drain current Ids increases. Drain current Ids can be changed by changing threshold voltage Vth. Therefore, information can be non-volatilely stored by changing threshold voltage Vth of floating gate type transistor 101 in accordance with the signal potential to be stored at storage node B. This is because currents flowing into storage nodes A and B at power-on are required only to be variable depending on non-volatilely stored information. Now, an operation of the cell will be described below.

(i) Non-volatile Storage Mode (a) In the case where the signal potential of storage node A is "H", and the signal potential of storage node B is "L":

As shown in FIG. 11B, high voltage Vpp is applied to control electrode node 5, and high voltage Vp is applied to power supply node 105. Power supply node 104 is at the normal power supply voltage Vcc level. Word line WL is set to the nonselected state of "L". A substrate of floating gate type transistor 101 is set to the ground potential GND (0 V). Under these conditions, hot electrons are generated by the avalanche breakdown in floating gate type transistor 101, and the hot electrons thus generated are accelerated by high voltage Vpp applied to control electrode node 5 and are injected into the floating gate. Thereby, the threshold voltage Vth of floating gate type transistor 101 shifts to a higher voltage side. Thereafter, the power is turned off.

In the next use, the power is turned on. Upon this power-on, power supply voltage Vcc is applied to nodes 5, 104 and 105. A current is supplied to storage node A via high resistance load element 102. Threshold voltage Vth of floating gate type transistor 101 has shifted to a higher value. After power supply voltage Vcc applied to nodes 5 and 105 exceeds threshold voltage Vth of floating gate type transistor 101, floating gate type transistor 101 is turned on to supply the current to storage node B. The amount of current supplied from floating gate type transistor 101 is smaller than the amount of current supplied from the same at the initial state, because threshold voltage Vth has shifted to the higher value. Therefore, owing to the facts that the timing of current supply by floating gate type transistor 101 is delayed from the timing of current supply by resistor element 102, and that the quantity of current supplied by floating gate type transistor 101 is smaller than that supplied by resistor element 102, the potential of storage node A rises more rapidly than the potential of storage node B, and MOS transistor 2b is turned on to discharge the potential of storage node B. As a result, when power supply voltage Vcc reaches a predetermined value, the signal potentials of storage nodes A and B are set to "H" and "L", respectively, (owing to the latch operation of transistors 2a and 2b).

Figure 12:
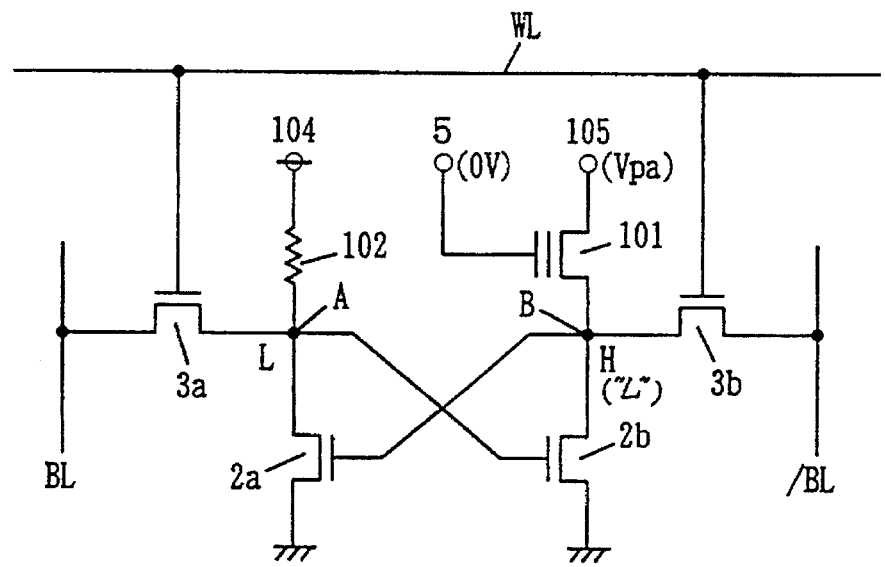
FIG. 12 shows conditions for voltage application in the non-volatile storage mode of the non-volatile memory cell in the second embodiment.

(b) In the case where the signal potential of storage node A is "L", and the signal potential of storage node B is "H":

As shown in FIG. 12, control electrode node 5 is set to ground potential GND (0 V), and power supply node 105 is set to high voltage Vpa, e.g., of about 10 V. Storage node B is set to ground potential GND (0 V). The substrate of floating gate type transistor 101 is set to ground potential GND (0 V). Power supply voltage Vcc is supplied to power supply node 104. In this state, a Fowler-Nordheim tunneling current is generated in floating gate type transistor 101, and electrons accumulated in the floating gate flow to power supply node 105. The floating gate type transistor 101 is set to the "over-erased" state, and its threshold voltage is set to a negative level. Floating gate type transistor 101 becomes equivalent to a depletion type MOS transistor. Thereafter, the power is turned off.

When the power is turned on, power supply voltage Vcc is applied to nodes 5, 104 and 105. The floating gate type transistor 101 is operating as the depletion type transistor, and is turned on similarly to high resistance resistor element 102 and supplies the current to storage node B when it receives power supply voltage Vcc. In this state, the floating gate type transistor 101 has the threshold voltage set to a negative value, and supplies a current flow greater than the current flow which it can supply at the initial state, i.e., the current supplied by resistor element 102. Therefore, the potential of storage node B rises more rapidly than the potential of storage node A, the signal potential of storage node B attains "H", and the signal potential of storage node A attains "L". Thereby, information which was stored before power-off is reproduced.

(ii) Erase Mode

Figure 13:
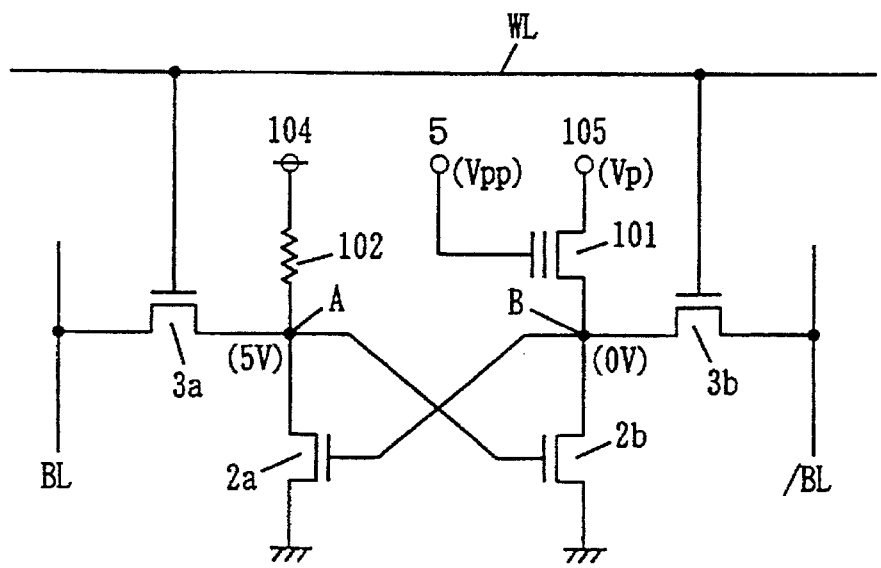
FIG. 13 shows conditions for voltage application during the erase operation of the memory cell in the second embodiment.

In the erase mode, an operation including two steps is effected on every memory cell. More specifically, the operation includes a so-called "pre-erase write (write before erasure)" cycle and an "erase" cycle. As shown in FIG. 13, a high voltage Vpp is applied to control electrode node 5, and a high voltage Vp is applied to power supply node 105. Storage node B is set to ground potential GND (0 V). The substrate of floating gate type transistor 101 is set to ground potential GND. In floating gate type transistor 101 set to this state, electrons are injected into the floating gate, and the threshold voltage changes to a higher value. Due to the "pre-erase write" cycle, the threshold voltages of floating gate type transistors 101 contained in all the memory cells are set to the higher value, and thus the threshold voltages of the floating gate type transistors are set to a constant value.

Then, the "erase" cycle is executed.

Figure 14:
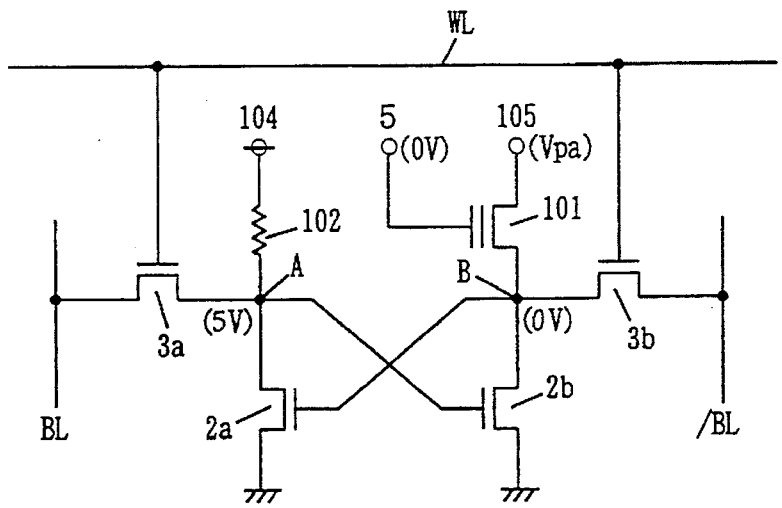
FIG. 14 shows conditions for voltage application in the erase mode of the second embodiment.

In the "erase" cycle, as shown in FIG. 14, high voltage Vpa is applied to power supply node 105, and ground potential GND (0 V) is applied to control electrode node 5. Storage node B is set to ground potential GND (0 V), and storage node A is set to power supply voltage Vcc level (about 5 V). The substrate of floating gate type transistor 101 is set to ground potential GND (0 V). In floating gate type transistor 101 set to this state, a Fowler-Nordheim tunneling current flows from the floating gate to power supply node 105, and electrons accumulated in the floating gate flow to power supply node 105. Thereby, the threshold voltage of floating gate type transistor 101 changes to the initial value.

(iii) Normal Operation Mode

In the normal operation mode performing write and read of data, power supply voltage Vcc is applied to control electrode node 5 as well as power supply nodes 104 and 105. Floating gate type transistor 101 receives the same voltage at its control gate and one of its conduction terminals, and functions as a load element. The on-resistance of floating gate type transistor 101 is set to a value equal to the resistance of high resistance resistor element 102. Therefore, write and read of data can be performed similarly to an ordinary SRAM.

The threshold voltage and on-resistance of floating gate type transistor 101 in the initial state are set to appropriate values by adjusting an impurity concentration of the channel region of floating gate type transistor 101.

Figure 15:
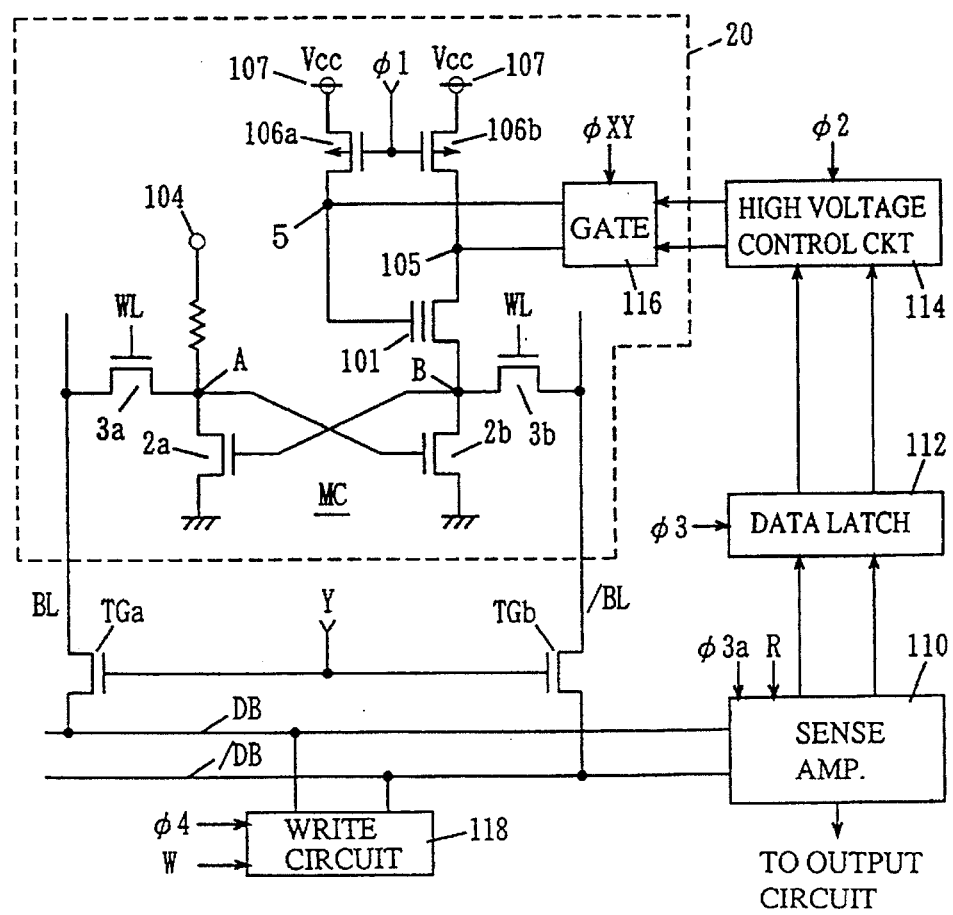
FIG. 15 schematically shows a whole structure of the non-volatile memory device of the second embodiment.

FIG. 15 shows a structure of a portion related to generation of a high voltage in the second embodiment. FIG. 15 shows only the structure of a portion related to a memory cell of one bit.

In FIG. 15, high voltage generating circuitry includes a sense amplifier 110 which is activated to differentially amplify signal potentials on internal data lines DB and /DB in response to a non-volatile storage mode instructing signal φ3a and a data read mode instructing signal R, a data latch 112 which is activated to latch internal read data amplified by sense amplifier 110 in response to a non-volatile storage mode instructing signal φ3, a high voltage control circuit 114 which generates required high voltages in accordance with the latch data latched by data latch 112 and an operation mode instructing signal φ2, and a gate 116 which is turned on to transmit the high voltage generated by high voltage control circuit 114 to nodes 5 and 105 in response to a memory cell select signal φXY.

When sense amplifier 110 receives data read mode instructing signal R, it amplifies and transmits the internal read data to an output circuit (not shown). Operation mode instructing signal φ2 applied to high voltage control circuit 114 includes a signal of 2 bits, and selectively designates the non-volatile storage mode and erase mode. Select signal φXY is produced from the logical product of a row select signal sent from the row decoder (not shown) and a column select signal Y sent from the column decoder (not shown), or alternatively is produced in accordance with one of these select signals.

The high voltage generating circuitry further includes a p-channel MOS transistor 106a connected between control electrode node 5 and power voltage supply node 107, and a p-channel MOS transistor 106b connected between power supply node 105 and power voltage supply node 107. These p-channel MOS transistors 106a and 106b are turned off, when an operation mode designating signal φ1 attains the active state ("H") designating the non-volatile storage mode or erase mode. In the normal operation mode, operation mode designating signal φ1 is "L", and p-channel MOS transistors 106a and 106b are on and supplies power supply voltage Vcc to nodes 5 and 105, respectively.

A write circuit 118 transmits internal write data to internal data lines DB and /DB in accordance with a write enable signal W and an operation mode designating signal φ4. Write circuit 118 produces the internal write data, which are logically complementary to each other, from external write data when write enable signal W indicates the data write operation. Write circuit 118 transmits data of "L" and "H" to internal data lines DB and /DB, respectively, when operation designating signal φ4 becomes active ("H"). In memory cell MC, storage node A may be set to "H" to turn on MOS transistor 2b by the data which write circuit 118 generates at the non-volatile storage mode and erase mode. Word line WL is set to "L" when the high voltages are applied to nodes 5 and 105.

Figure 16:
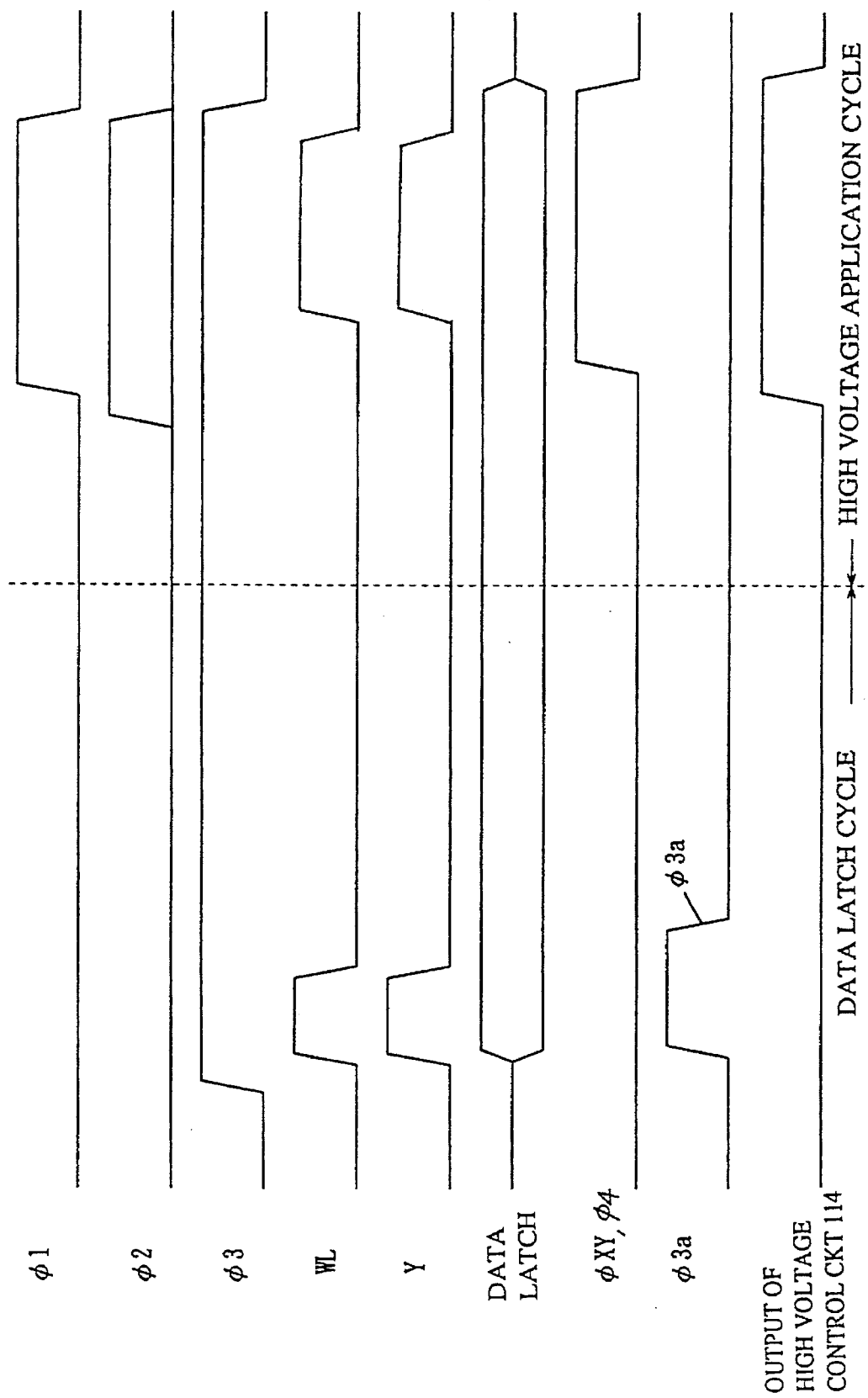
FIGS. 16 and 17 are waveform diagrams showing operations in the non-volatile storage mode in the second embodiment.

FIG. 16 is a signal waveform diagram representing the operation of the circuit shown in FIG. 15 at the non-volatile storage mode. Now, the operation of the circuit shown in FIG. 15 at the non-volatile storage mode will be described below.

In the non-volatile storage mode, non-volatile storage mode designating signal φ3 first becomes active ("H") to activate data latch 112. The row decoder and column decoder (not shown) are activated, so that word line WL is selected, and column select signal Y is activated. In the row and column selecting operations by the row decoder and column decoder, a counter or the like is used to generate address signals designating the addresses of memory cells. In this state, access transistors 3a and 3b are turned on, and the signal potentials on storage nodes A and B are transmitted onto bit lines BL and /BL, respectively. The signal potentials on bit lines BL and /BL are transmitted onto internal data lines DB and /DB via column select gates TGa and TGb which are turned on in response to column select signal Y.

In parallel with the operation of reading data from the selected memory cell, sense amplifier activation signal φ3a is activated, so that sense amplifier 110 is activated and differentially amplifies the signal potentials on internal data lines DB and /DB to transmit the differentially amplified potentials to data latch 112. Data latch 112 latches the signal potentials supplied from sense amplifier 110. When sense amplifier 110 and data latch 112 complete the latch operation for data of memory cell MC, word line WL is deselected brought to the state, column select signal Y is deactivated, and column select gates TGa and TGb are turned off. Through a series of operations described above, the data latch cycle is completed. Subsequent to completion of the data latch cycle, a high voltage application cycle starts to apply a high voltage in accordance with the data latched by data latch 112.

In the high voltage application cycle, storage nodes A and B hold the signal potential of "H" or "L" in accordance with storage information. First, operation mode designating signal $\phi 2$ becomes active, and high voltage control circuit 114 is activated to generate required high voltage and/or ground potential in accordance with data latched by data latch 112. In parallel with the high voltage generating operation of high voltage control circuit 114, operation mode designating signal $\phi 1$ attains the active state of "H" to turn off p-channel MOS transistors 106a and 106b. Thereby, control electrode node 5 and power supply node 105 are disconnected from power voltage supply node 107. A memory cell select signal $\phi XY$ applied to gate 116 is activated, and the high voltage generated by high voltage control circuit 114 and/or ground potential are transmitted to nodes 5 and 105. Word line WL is again brought to the selected state, column select signal Y is activated, and write circuit 118 transmits data "H" and "L" to data lines DB and /DB in response to control signal $\phi 4$, respectively. If storage node B has held the signal potential of "L", high voltage Vpp is applied to control electrode node 5, and high voltage Vp is applied to power supply node 105. MOS transistor 2b is on in accordance with the signal potential of "H" of storage node A. Therefore, a drain current flows in floating gate type transistor 101, and hot electrons are injected into the floating gate to increase the threshold voltage of floating gate type transistor 101.

Conversely, if storage node B has held the signal potential of "H", ground potential GND (0 V) is applied to control electrode node 5, and high voltage Vpa is applied to power supply node 105. Therefore, in floating gate type transistor 101, electrons flow from the floating gate to power supply node 105 and the threshold voltage thereof decreases. Thereby, the storage information of memory cell MC is converted into the non-volatile form. Subsequent to the non-volatile information storage by memory cell MC, operation of non-volatilely storing information is then effected on another memory cell. When non-volatile information storage is completed in all the memory cells, the non-volatile storage mode is completed.

Figure 17:
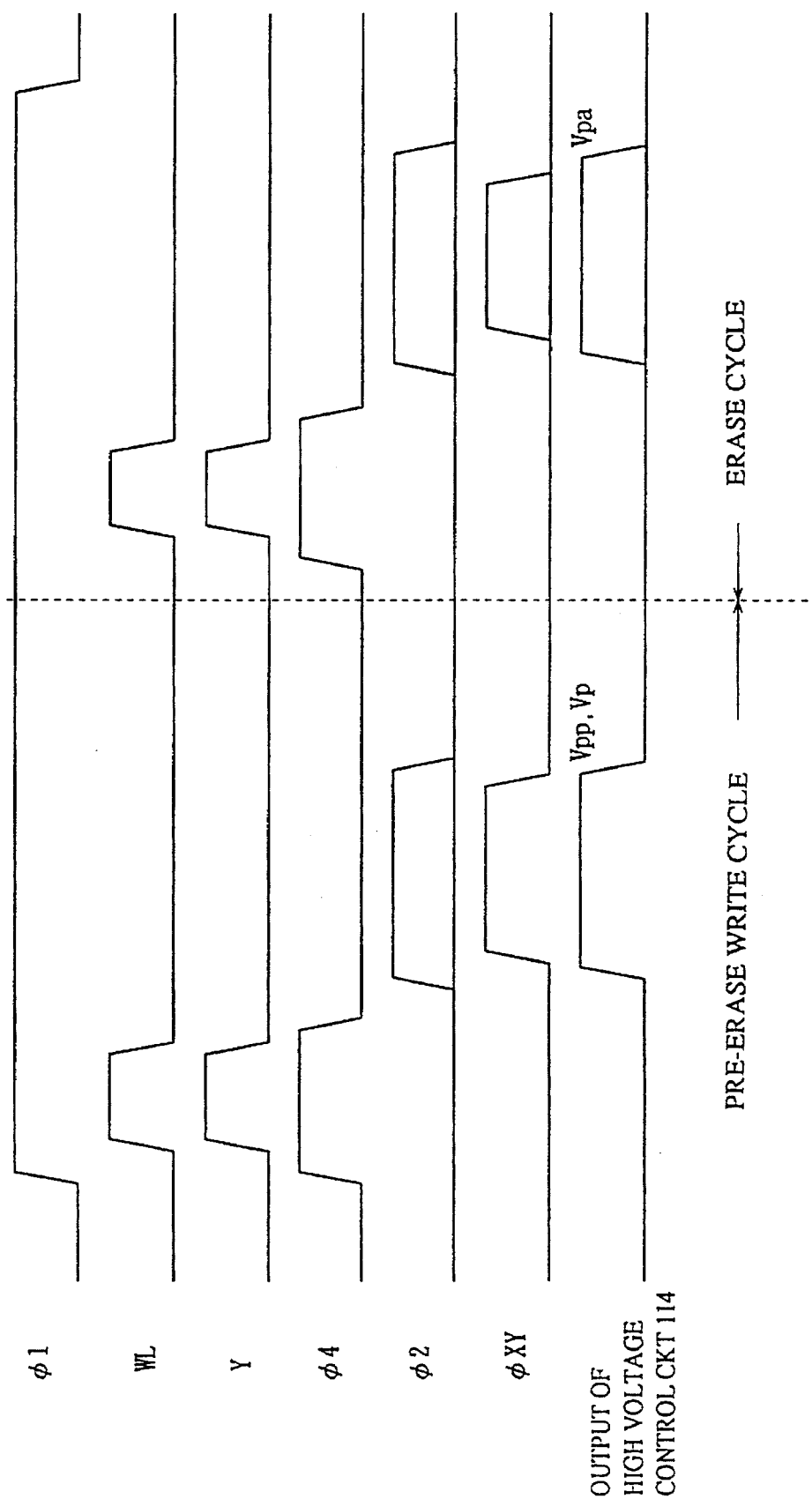

FIG. 17 is a signal waveform diagram representing operation of the circuit shown in FIG. 15 in the erase mode. In the "pre-erase write" cycle, the following operation is performed. First, operation mode designating signal $\phi 1$ is set to "H", and p-channel MOS transistors 106a and 106b are turned off. In this state, signal $\phi 4$ is activated, and write circuit 118 transmits the signal of "H" onto internal data line DB and also transmits the signal of "L" onto internal data line /DB. In parallel with this internal write data producing operation by write circuit 118, the row decoder and column decoder operate to set word line WL and column select signal Y to the selected state, respectively. Thereby, storage node A is set to "H" of power supply voltage Vcc level, and storage node B is set to ground potential GND (0 V). When the operation of setting the potentials of storage nodes A and B is completed, word line WL and column select signal Y are set to the nonselected (deselected) state.

Then, operation mode designating signal $\phi 2$ is activated. At this time, high voltage control circuit 114 generates a high voltage which sets the control electrode node 5 to high voltage Vpp and sets power supply node 105 to high voltage Vp level. Memory cell select signal $\phi XY$ is activated, and the high voltage generated by high voltage control circuit 114 is transmitted to control electrode node 5 and power supply node 105 via gate 116. While high voltage control circuit 114 is generating the high voltage, MOS transistor 2b is on (storage node A maintains the potential of "H"), and a tunneling current flows in floating gate type transistor 101, so that hot electrons are injected into the floating gate of the transistor 101. Through a series of operations described above, the "pre-erase write" cycle is completed.

In the "erase" cycle, the following operation is executed. Write circuit 118 transmits a signal of "L" onto internal data line DB and also transmits a signal of "L" onto internal data line /DB in response to signal $\phi 4$. In parallel with the internal write data producing operation by write circuit 118, the row decoder and column decoder operate again to set word line WL and column select signal Y to the selected state. Thereby, storage node A is set to "H", and storage node B is set to "L". At this time, control signal $\phi 1$ may be set to "L", and thereby a current may be supplied to storage nodes A and B via p-channel MOS transistors 106a and 106b. When the operation of setting the potentials of storage nodes A and B is completed, word line WL and column select signal Y are set to the inactive state. Then, operation mode designating signal $\phi 2$ is asserted again, and high voltage control circuit 114 generates a voltage which sets control electrode node 5 and power supply node 105 to ground potential GND (0 V) and high voltage Vpa, respectively. Thereby, in the floating gate type transistor 101, electrons flow from the floating gate to power supply node 105, and the threshold voltage thereof decreases. Through a series of operations described above, the "erase" cycle is completed.

The erase mode may be effected successively on the respective memory cells. Alternatively, the "pre-erase write" cycle and the "erase" cycle may be effected collectively on all the memory cells. Since the erase operation will destroy the reproduced storage information, the reproduced storage information is saved in an external storage device, if necessary, for later use. Specific structure of each circuit will be described below.

Figure 18:
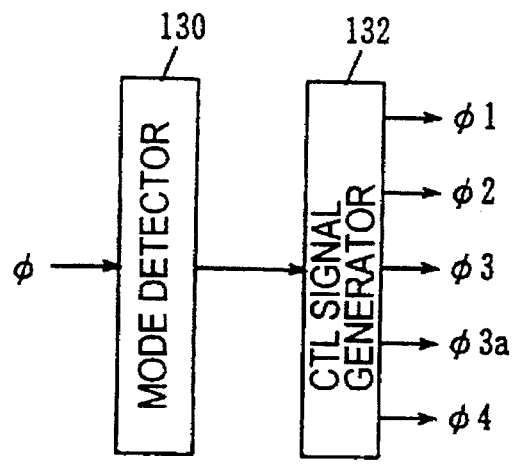
FIG. 18 shows a structure for generating a control signal in the second embodiment.

FIG. 18 shows a structure generating various control signals. In FIG. 18, the control signal generating circuitry includes a mode detecting circuit 130 which detects a designated mode in response to a mode designating signal $\phi$, and a control signal generating circuit 132 which generates various control signals in accordance with the mode designating signal $\phi$ sent from mode detecting circuit 130. The mode designating signal $\phi$ applied to mode detecting circuit 130 may be a signal applied via a specific control pin, or may be a combination of external control signals (chip enable signal /CE, write enable signal /WE, output enable signal /OE or the like) and a signal applied to a specific address signal input pin. Control signal generating circuit 132 has, for example, a structure of a sequence controller and generates signals $\phi 1$, $\phi 2$, $\phi 3$, $\phi 3a$ and $\phi 4$. Control signal generating circuit 132 also controls the operation of generating the address signals used for selecting the memory cells (forms and manners of generation of address signals in the non-volatile storage mode and erase mode will be described later).

Figure 19:
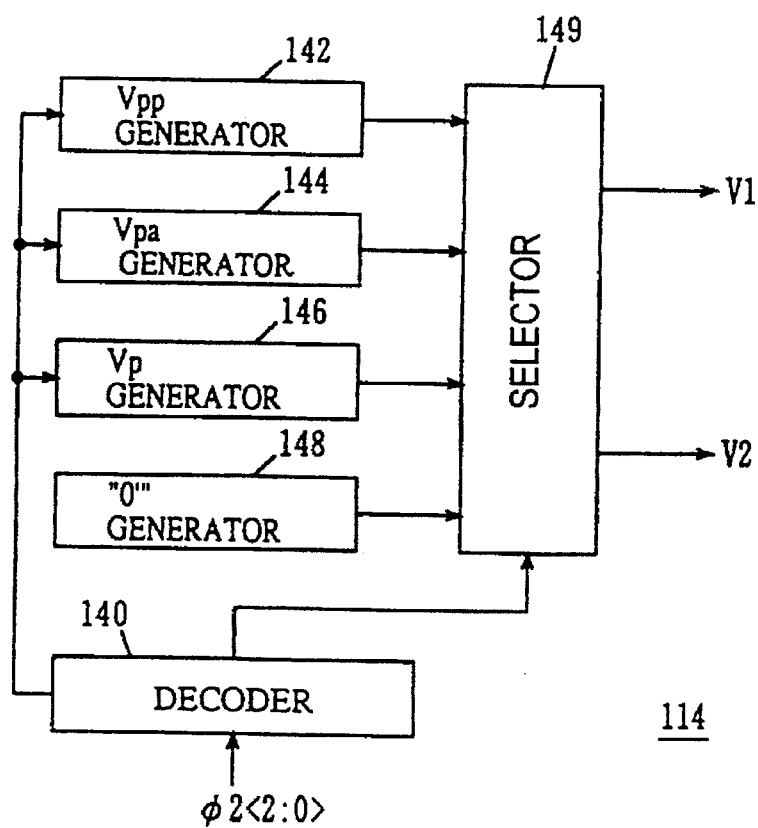
FIG. 19 is a block diagram schematically showing a structure of a high voltage control circuit shown in FIG. 15.

FIG. 19 schematically shows a structure of high voltage control circuit 114 shown in FIG. 15. In FIG. 19, high voltage control circuit 114 includes a decoder 140 which decodes control signal $\phi 2$ (which is a signal of 3 bits and represented by "$\phi 2<2:0>$") applied from control signal generating circuit 132, a Vpp generating circuit 142 generating high voltage Vpp, Vpa generating circuit 144 generating high voltage Vpa, Vp generating circuit 146 generating high voltage Vp, "0" generating circuit 148 generating ground potential GND (0 V), and a selector circuit 149 which selects the outputs of Vpp generating circuit 142, Vpa generating circuit 144, Vp generating circuit 146 and "0" generating circuit 148 to generate voltages V1 and V2 in response to the output of decoder 140.

Figures 20, 21:
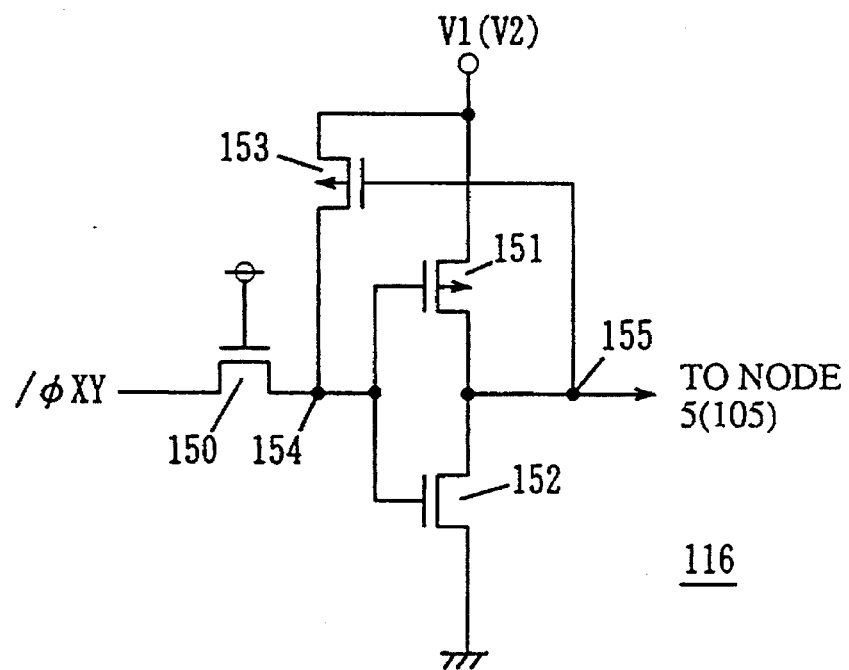
FIG. 20 shows control signals applied from the high voltage control circuit shown in FIG. 19.
FIG. 21 shows an example of the structure of gate shown in FIG. 15.

Vpp generating circuit 142, Vpa generating circuit 144 and Vp generating circuit 146 are activated in response to the output of decoder 140. FIG. 20 represents decoding operation of the decoder shown in FIG. 19. As shown in FIG. 20, decoder 140 activates Vpp generating circuit 142, Vpa generating circuit 144 and Vp generating circuit 146 when the highest order bit φ2<2> of signal φ2<2:0> of 3 bits is "1" which represents that the non-volatile storage mode or the erase mode is designated. When the highest order bit φ2<2> is "0" representing designation of the normal operation mode, decoder 140 does not perform a decoding operation, and Vpp generating circuit 142, Vpa generating circuit 144 and Vp generating circuit 146 are deactivated. Each operation cycle is designated by signals φ2<1> and φ2<0>. The data latch cycle is designated when both signals φ2<1> and φ2<0> are "0". The high voltage application cycle is designated when signals φ2<1> and φ2<0> are "0" and "1", respectively. The "pre-erase write" cycle is designated when signals φ2<1> and φ2<0> are "1" and "0", respectively. The "erase" cycle is designated when both signals φ2<1> and φ2<0> are "1".

The above relationship of the logic of the control signals and the operation cycles is provided merely as an example, and another combination of signal data may be used.

FIG. 21 shows an example of a structure of the gate shown in FIG. 15. FIG. 21 shows only a gate portion connected to control electrode node 5 or power supply node 105. In FIG. 21, gate 116 includes an n-channel MOS transistor 150 receiving an inverted signal /φXY of memory cell select signal φXY, a p-channel MOS transistor 151 having conduction terminal connected to receive voltage V1 (or V2) transmitted from selector circuit 149 shown in FIG. 19, another conduction terminal connected to an output node 155 and a gate connected to an internal node 154, an n-channel MOS transistor 152 having one conduction terminal connected to output node 155, a gate connected to internal node 154 and another conduction terminal connected to receive the ground potential, and a p-channel MOS transistor 153 having one conduction terminal connected to receive voltage V1 (or V2), a gate connected to output node 155 and another conduction terminal connected to internal node 154. Output node 155 is connected to control electrode node 5 (or power supply node 105). MOS transistor 150 has a gate receiving power supply voltage Vcc. Operation of the arrangement will now be described below.

When signal /φXY attains "L", this signal /φXY is transmitted to internal node 154. Since the potential of internal node 154 is "L", MOS transistor 152 is turned off, and p-channel MOS transistor 151 is turned on, so that voltage V1 (or V2) transmitted from selector circuit 149 is transmitted to output node 155. When voltage V1 (or V2) is high, p-channel MOS transistor 153 is off, and internal node 154 maintains the potential of "L". Thereby, in the selecting operation, an intended voltage can be transmitted to control electrode node 5 (or power supply node 105).

When signal /φXY is "H", n-channel MOS transistor 152 is turned on, and output node 155 attains the ground potential level of "L". At this time, p-channel MOS transistor 153 is turned on to transmit voltage V1 (or V2) to internal node 154. Thereby, p-channel MOS transistor 151 has the same potential at its gate and at the one conduction terminal, and hence is surely turned off. Therefore, even when the high voltage (Vpp, Vp or Vpa) is generated, "L" can be surely transmitted to the nonselected memory cells.

Figures 22A, 22B:
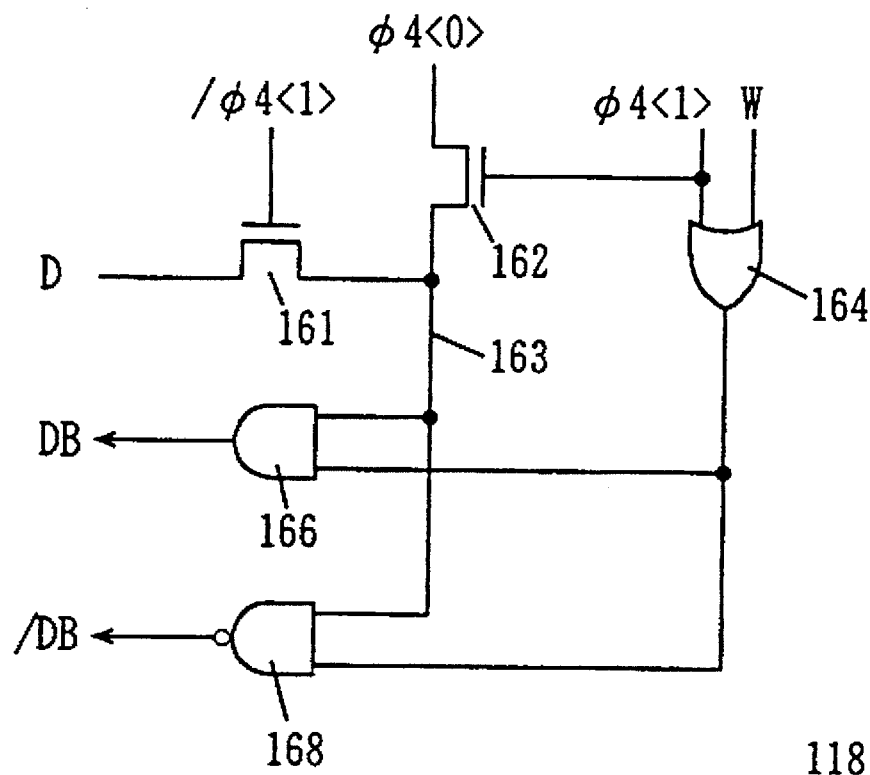
FIGS. 22A and 22B represent a structure and operation of a write circuit shown in FIG. 15, respectively.

FIGS. 22A and 22B represent the structure and operation of the write circuit shown in FIG. 15, respectively. As shown in FIGS. 22A and 22B, signal 64 is formed of two bits of signals φ4<1> and φ4<0>.

In FIG. 22A, write circuit 118 includes a transfer gate 162 which is enabled to pass signal φ4<0> in response to signal φ4<1>, a transfer gate 161 which is enabled to pass internal write data D in response to an inverted signal /φ4<1> of signal φ4<1>, an OR circuit 164 receiving signal φ4<1> and write enable signal W, an AND circuit 166 receiving the signal potential on a node 163 and the output of OR circuit 164, and an NAND circuit 168 receiving the signal potential on node 163 and the output of OR circuit 164. Node 163 receives signals from transfer gates 161 and 162. Internal write data D may be write data D applied to an external pin terminal, or write data generated via a buffer circuit. The output of AND circuit 166 is transmitted to internal data line DB, and the output of NAND circuit 168 is transmitted to internal data line /DB.

As shown in FIG. 22B, signal φ4<1> is set to "1" in the erase mode and the non-volatile storage mode. In this state, transfer gate 161 is off, and transfer gate 162 is on. The output of OR circuit 164 attains "H" ("1"). AND circuit 166 functions as a buffer, and NAND circuit 168 functions as an inverter. If signal φ4<0> is "1", AND circuit 166 outputs a signal of "L" ("0"), and NAND circuit 168 outputs a signal of "H" ("1") to internal data line /DB.

In the normal operation mode, signal φ4<1> is set to "0". Transfer gate 161 is on, and transfer gate 162 is off. OR circuit 164 outputs a signal in accordance with write enable signal W. In the normal operation mode, therefore, the potentials of internal data lines DB and /DB are decided in accordance with internal write data D.

Figure 23:
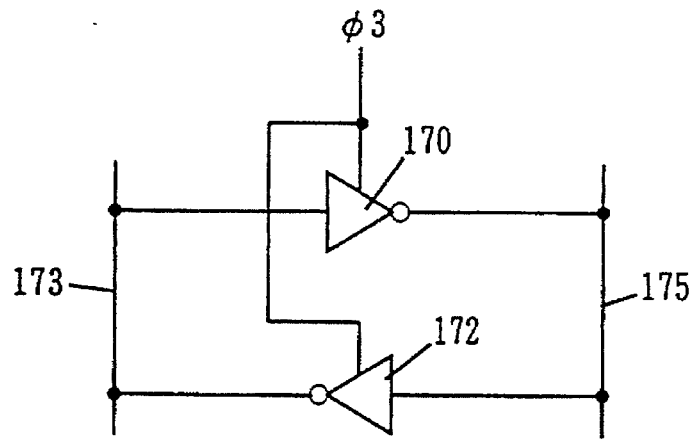
FIG. 23 shows an example of a structure of a data latch shown in FIG. 15.

FIG. 23 shows an example of the structure of data latch shown in FIG. 15. In FIG. 23, data latch 112 includes clocked inverters 170 and 172 which are activated in response to signal φ3. Clocked inverter 170 in the active state inverts the signal on a node 173 for transmission to a node 175. Clocked inverter 172 inverts a signal potential on node 175, for transmission to node 173. Therefore, clocked inverters 170 and 172 form an inverter latch when they are active. When control signal φ3 is inactive, clocked inverters 170 and 172 are inactive and maintain an output high-impedance state.

Figure 24:
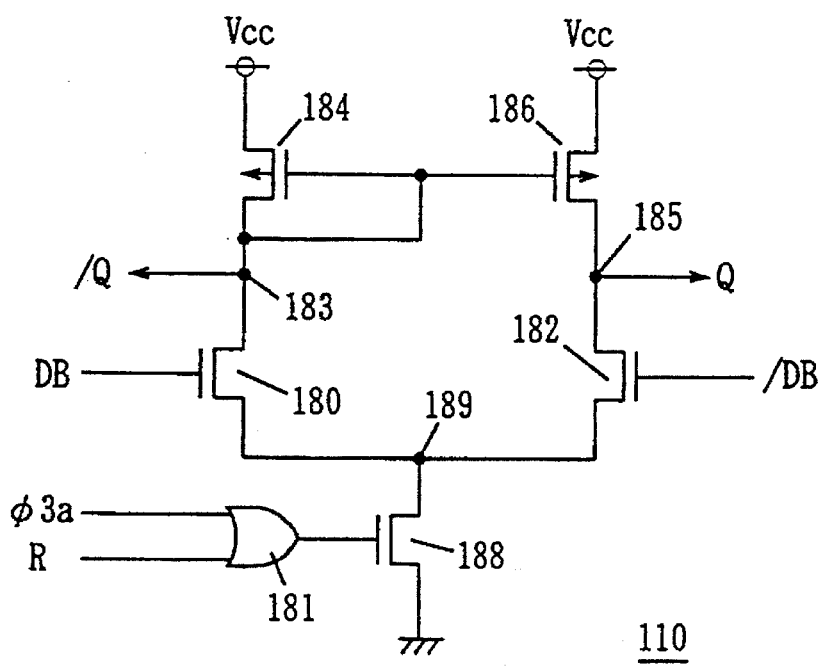
FIG. 24 shows an example of a structure of a sense amplifier shown in FIG. 15.

FIG. 24 shows an example of the structure of sense amplifier shown in FIG. 15. Particularly, FIG. 24 shows, as an example, a structure of a sense amplifier of a current mirror type.

In FIG. 24, sense amplifier 110 includes n-channel MOS transistors 180 and 182 receiving at their gates the signal potentials on internal data lines DB and /DB, respectively, a p-channel MOS transistor 184 arranged between a power voltage supply node and an internal node 183, a p-channel MOS transistor 186 connected between the power voltage supply node and an internal node 185, and an n-channel MOS transistor 188 arranged between an internal node 189 and a ground potential supply node.

Gates of p-channel MOS transistors 184 and 186 are connected to internal node 183. n-channel MOS transistor 188 receives at its gate an output of an OR circuit 181 receiving signal φ3a and read enable signal R. Sources of n-channel MOS transistors 180 and 182 are connected to internal node 189. Operation will now be described below.

If the output of OR circuit 181 is "L", MOS transistor 188 is off, and sense amplifier 110 is inactive.

When the output of OR circuit 181 attains "H", MOS transistor 188 is turned on, so that a current path is formed in sense amplifier 110, and sense amplifier 110 is activated. If the signal potential of internal data line DB is higher than the signal potential of internal data line /DB, the current flowing through MOS transistor 180 exceeds the current flowing through MOS transistor 182. Therefore, the potential of internal node 183 is discharged via n-channel transistor 180 and thus lowers. Since sources of n-channel MOS transistors 180 and 182 are commonly connected to internal node 189, and a current hardly flows through MOS transistor 182. When the signal potential of internal node 183 lowers, the gate potentials of p-channel MOS transistors 184 and 186 lower, so that the current flowing through MOS transistors 180 and 186 increases, and the potential of internal node 185 rises. Thereby, the potentials of internal nodes 183 and 185 are decided.

The structure shown in FIG. 24 is a mere example, and another structure of the sense amplifier may be utilized.

Figure 25:
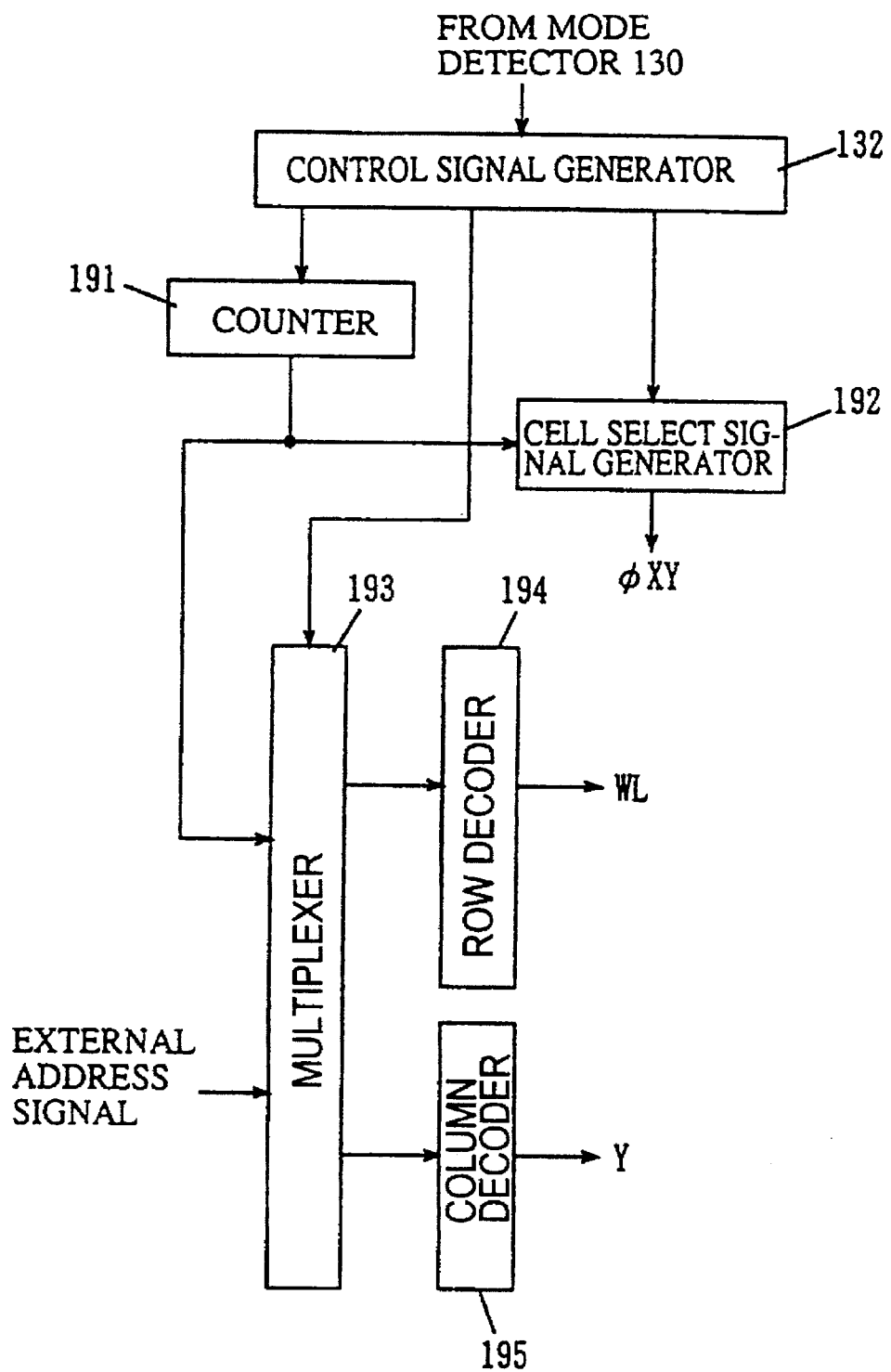
FIG. 25 schematically shows a structure of peripheral circuitry of the non-volatile semiconductor memory device of the second embodiment.

FIG. 25 shows a structure of a portion generating a signal used for selecting the memory cell in the second embodiment of the invention. In FIG. 25, select signal generating circuitry includes a counter 191 which is activated to perform the counting for outputting the count in response to the control signal sent from control signal generating circuit 183 (see FIG. 18), a cell select signal generating circuit 192 which receives the count from counter 191 and generates cell select signal φXY at a predetermined timing, a multiplexer 193 which is controlled by control signal generating circuit 132 to select either the count supplied from count 191 or an externally applied address signal (external address signal), and a row decoder 194 and a column decoder 195 which perform the decoding using the signal applied from multiplexer 193 as the address signal. Row decoder 194 generates and transmits a word line drive signal onto a corresponding word line WL. Column decoder 195 generates and applies column select signal Y to column select gates TGa and TGb shown in FIG. 15.

Counter 191 is controlled by control signal generating circuit 132, and is activated to increment sequentially the count in the non-volatile storage mode and the erase mode. If erasing is to be effected collectively and simultaneously on all the memory cells in the erase mode, such a structure may be employed, instead of activation of counter 191, that a control signal is applied to row decoder 192 and column decoder 195 for setting all the word lines WL and all the column select signals Y to the selected state.

Cell select signal generating circuit 192 decodes the count supplied from counter 191 and generates memory cell select signal φXY. In order to prevent complication of a layout of interconnection lines, cell select signal generating circuit 192 may be configured to generate a cell select signal which simultaneously sets the memory cells in one row or one column to the selected state. Cell select signal generating circuit 192 may have the structure similar to those of row decoder 194 and column decoder 195, and specifically may have such a structure that memory cell select signals are generated for the row and the column separately and memory cell select signal φXY is generated from the logical product of the row and column memory cell select signals at the memory cell portion.

[Modification 1]

Figure 26:
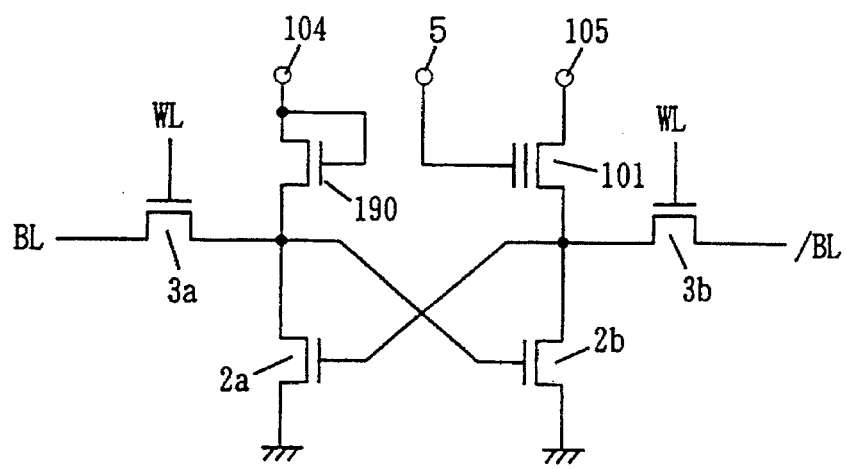
FIG. 26 shows a modification of the second embodiment.

FIG. 26 shows a modification of the structure of the non-volatile memory device according to the second embodiment of the invention. A non-volatile memory cell shown in FIG. 26 includes, as a high resistance load element, a resistance-coupled n-channel MOS transistor 190. Other specific structures are the same as those shown in FIG. 11A, and corresponding portions bear the same reference numbers. According to the structure shown in FIG. 26, both of floating gate type transistor 101 and load element, i.e., n-channel MOS transistor 190 can be formed by an MOS manufacturing process. Therefore, it is easy to set the threshold voltage at the initial state of floating gate type transistor 101 and the threshold voltage of n-channel MOS transistor 190 to the same value. In the structure shown in FIG. 26, all the non-volatile memory cells can be formed by the n-channel MOS process, so that the manufacturing processes can be made simple. The operation manner is the same as that of the non-volatile memory cell shown in FIG. 11A.

As described above, according to the structure of the non-volatile memory cell of the second embodiment, since the floating gate type transistor is used only as one of the load elements of the non-volatile memory cell, the number of transistor elements to which a high voltage is applied is small, and current consumption during the high voltage generating operation can be made small.

[Embodiment 3]

Figure 27:
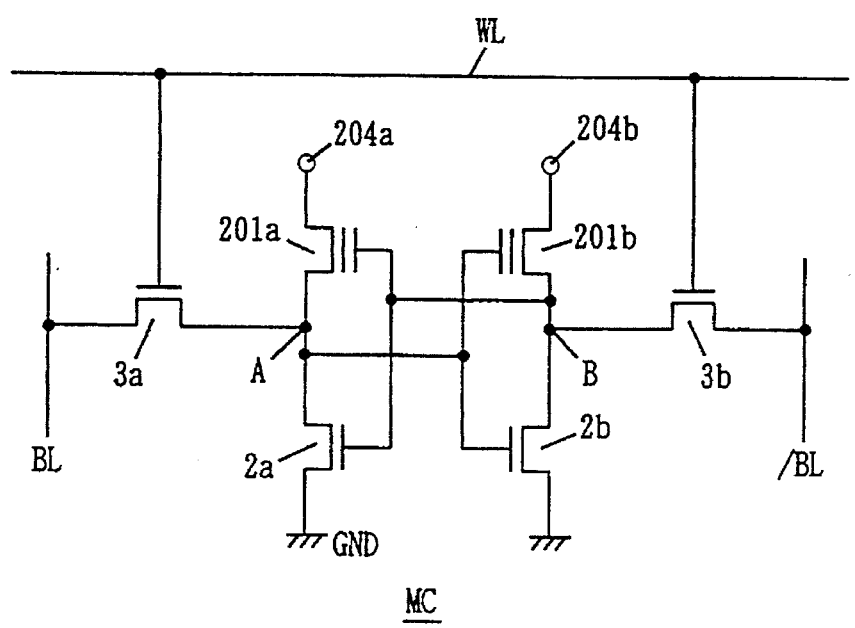
FIG. 27 shows a structure of a memory cell of a non-volatile semiconductor memory device of a third embodiment of the invention.

FIG. 27 shows a structure of a memory cell of a non-volatile memory cell device according to a third embodiment of the invention. In FIG. 27, non-volatile memory cell MC includes a floating gate type transistor 201a connected such that one of its conduction terminals is connected to a power supply node 204a, its control gate is connected to storage node B and another conduction terminal is connected to storage node A, a floating gate type transistor 201b connected such that one of its conduction terminals is connected to a power supply node 204b, its control gate is connected to storage node A and another conduction terminal is connected to storage node B, an n-channel MOS transistor 2a connected such that one of its conduction terminals is connected to storage node A, its gate is connected to storage node B and another of its conduction terminal is connected to receive ground potential GND, and an n-channel MOS transistor 2b connected such that one of its conduction terminals is connected to storage node B, its gate is connected to storage node A and another of its conduction terminal is connected to receive ground potential GND. Floating gate type transistors 201a and 201b are initially set to the "over-erased" state, and function as depletion type MOS transistors. On-resistances of these floating gate type transistors 201a and 201b are set to sufficiently large values. Therefore, transistors 201a and 2a form a D/E inverter circuit, and transistors 201b and 2b form another D/E inverter circuit.

Memory cell MC further includes access transistors 3a and 3b which are turned on to connect storage nodes A and B to bit lines BL and /BL respectively in response to the signal potential on word line WL. Memory cells in a row are disposed along word line WL. Memory cells in each column are disposed along bit line pair BL and /BL.

In the normal operation mode, power supply voltage Vcc, e.g., of about 5 V is applied to power supply nodes 204a and 204b. Floating gate type transistors 201a and 201b are depletion type MOS transistors and function as load elements. If the signal potential of storage node A is "H" and the signal potential of storage node B is "L", MOS transistor 2a is off and MOS transistor 2b is on. Even if the signal potential of storage node B is "L" (ground potential level), floating gate type transistor 201a is on and pulls up storage node A to power supply voltage Vcc.

When memory cell MC is selected, the signal potential of word line WL rises to "H" (power supply voltage Vcc level), and access transistors 3a and 3b are turned on. Thereby, storage nodes A and B are connected to bit lines BL and /BL, respectively, and writing or reading of data is executed. The non-volatile storage mode and the erase mode will be described below.

(i) Non-volatile Storage Mode

Figure 28:
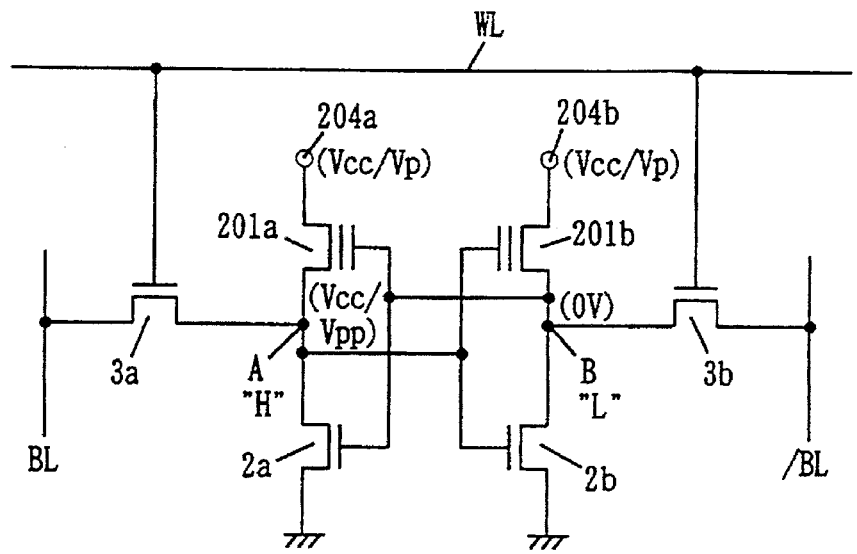
FIG. 28 shows a state of voltage application in a non-volatile storage mode of the memory cell of the third embodiment.
Figure 29:
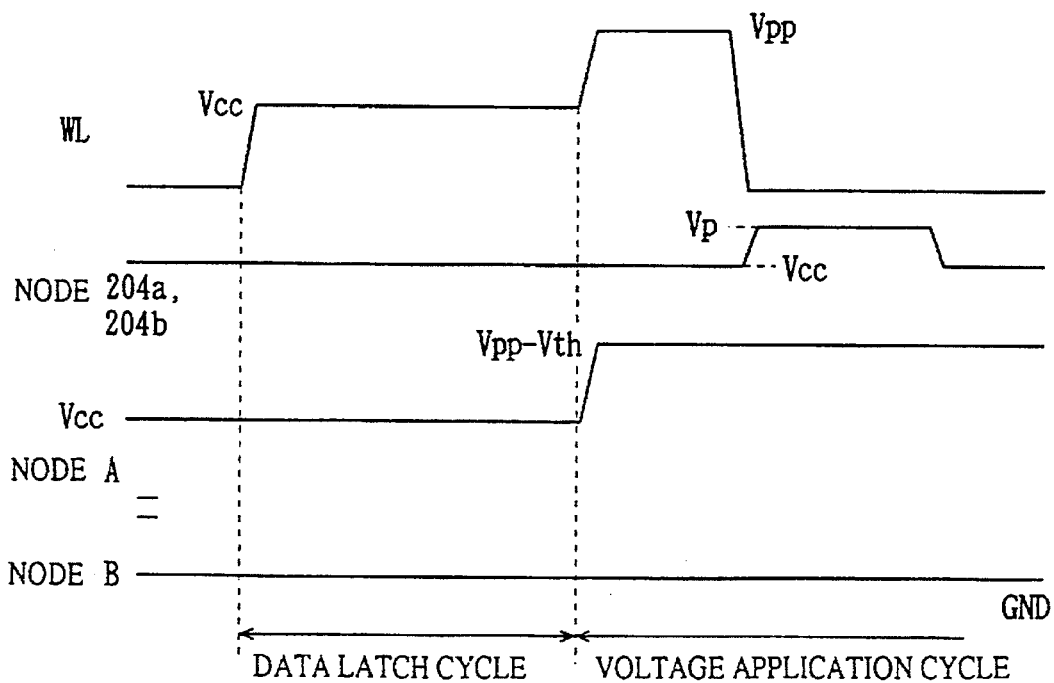
FIG. 29 is a signal waveform diagram showing the non-volatile storage mode of the non-volatile memory cell of the third embodiment.

The non-volatile storage mode requires two operation cycles as will be described later in greater detail. One is a data latch cycle for reading and latching data stored in the memory cell, and the other is a voltage application cycle for setting the potentials of storage nodes A and B in accordance with the latched data. Each operation cycle will be described below with reference to FIG. 28 showing applied voltages and FIG. 29 showing operation waveform.

In the data latch cycle, word line WL is first selected, and its potential is set to power supply voltage Vcc level. At this time, the voltage applied to nodes 204a and 204b are at power supply voltage Vcc level. Access transistors 3a and 3b are on, and the signal potentials held at storage nodes A and B are transmitted to bit lines BL and /BL, respectively. In the state shown in FIG. 28, storage node A holds the signal potential of "H" (power supply voltage Vcc level), and storage node B holds the signal potential of "L" (ground potential level).

The signal potentials read onto bit lines BL and /BL are amplified, and are latched by the data latch as will be described later, whereby the data latch cycle is completed.

In the voltage application cycle, the potential of word line WL is raised to high voltage Vpp level. The signal potentials of high voltage Vpp level and ground potential level are transmitted onto bit lines BL and /BL respectively in accordance with data latched in the former data latch cycle. The potential of storage node A rises to Vpp-Vth. Vth is a threshold voltage of access transistor 3a. The signal potential of storage node V maintains the ground potential level. Power supply nodes 204a and 204b maintain power supply voltage Vcc level.

When setting of the potentials of storage nodes A and B is completed, the potential of word line WL falls to "L", and access transistors 3a and 3b are turned off. The signal potential of storage node A is at high voltage Vpp level, and MOS transistor 2b is on. When high voltage Vp is applied to power supply nodes 204a and 204b, hot electrons are generated in floating gate type transistor 201b by avalanche breakdown and are injected into the floating gate. Meanwhile, in floating gate type transistor 201a, the potential of storage node B is at the ground potential level of "L", MOS transistor 2a is off, storage node A is in the floating gate state, and a current does not flow through floating gate type transistor 201a. Therefore, in floating gate type transistor 201a, hot electrons which may be caused by avalanche breakdown due to the drain current do not generate, and its threshold voltage maintains the initial value. Upon expiration of a period for applying the high voltage to floating gate type transistors 201a and 201b, the potentials of nodes 204a and 204b lower to power supply voltage Vcc level. Through a series of operations described above, the cycle for applying the voltages to memory cell MC is completed. Signal potentials (storage data) of "H" and "L" of storage nodes A and B are non-volatilely stored by the state that the threshold voltage of floating gate type transistor 201a is lower than the threshold voltage of floating gate type transistor 201b. After storage information of each memory cell is changed into a non-volatile form, the power supply is turned off.

Upon power-on, the potential of storage node A rises prior to the rise of potential of storage node B, because the threshold voltage of floating gate type transistor 210b is higher than the threshold voltage of floating gate type transistor 201a. Therefore, MOS transistor 2b attains the on state and MOS transistor 2a attains the off state, so that information stored before the power-off is reproduced.

(iii) Erase Mode

In the second embodiment, the erase operation is performed after the storage data was saved on an external storage device, and the saved data will be stored in the respective memory cells. Although the third embodiment can employ the similar manner, the following description will be given on the structure in which rewrite of data is performed after the memory device internally performed reading and erasing of the stored data in each memory cell.

Figure 30:
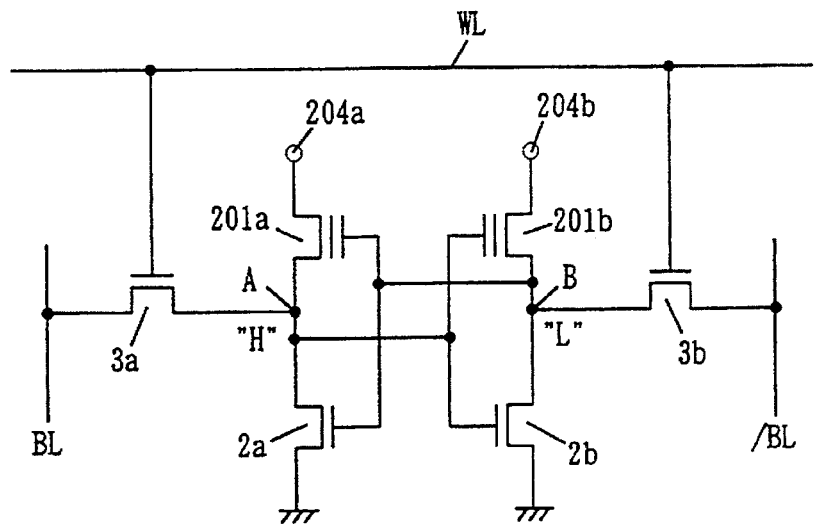
FIG. 30 represents an erase mode in the third embodiment.

It is assumed that, as shown in FIG. 30, the signal potential held by storage node A is "H" and the signal potential held by storage node B is "L". The threshold voltage of transistor 201b has shifted.

Figure 31:
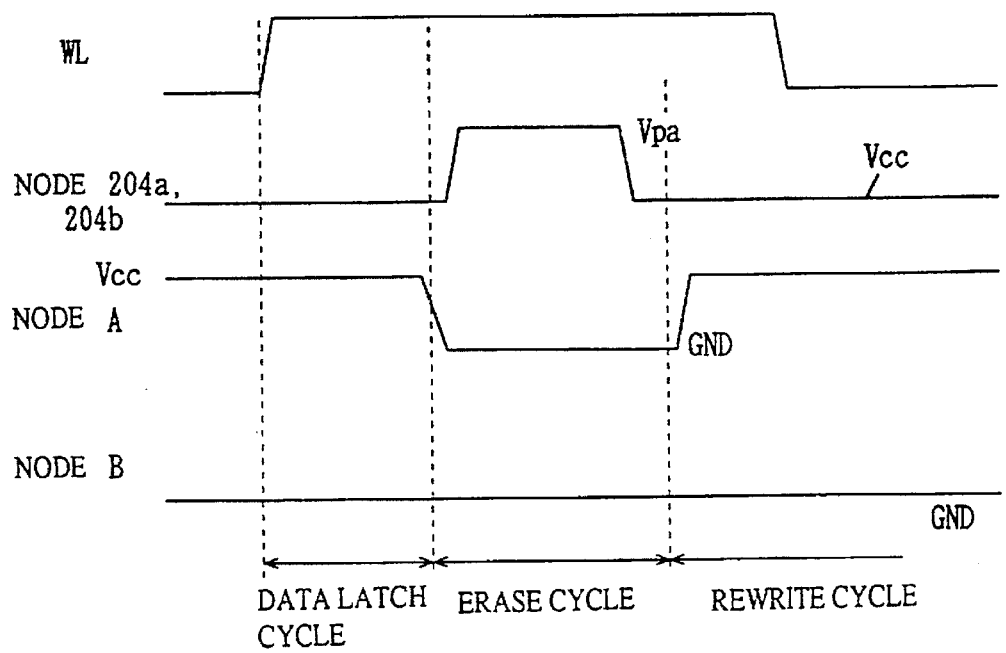
FIG. 31 is a signal waveform diagram representing the erase mode in the third embodiment.

As shown in FIG. 31, power supply nodes 204a and 204b are at power supply voltage Vcc level. The potentials of nodes A and B are at power supply voltage Vcc level and ground potential GND level, respectively. First, word line WL is selected, and signal potentials held by storage nodes A and B are read and latched. When this data latch cycle is completed, the signal potentials of bit lines BL and /BL are forcedly set to "L", and the signal potentials of storage nodes A and B are set to "L", while maintaining word line WL at the selected state. In the erase cycle, the potentials of storage nodes A and B are set to the ground potential level, and thereafter the voltages of storage nodes 204a and 204b are set to high voltage Vpa. In both of floating gate type transistors 201a and 201b, a high voltage is applied between the control gate and one conduction terminal (drain). Floating gate type transistor 201a is in the over-erased state, and its threshold voltage has converged to a saturated value. In floating gate type transistor 201b, a Fowler-Nordheim tunneling current is generated, so that electrons flow from the floating gate to power supply node 204b. Thereby, the threshold voltage of floating gate type transistor 201b returns to the initial value.

After completion of this erase cycle, the data which has been read and latched in the last data latch cycle is written via bit lines BL and /BL while maintaining word line WL in the selected state. The voltage applied to power supply nodes 204a and 204b return to power supply voltage Vcc again. In the state that this rewrite cycle is completed, storage nodes A and B of the memory cell latch the original data, and floating gate type transistors 201a and 201b are set to the initial state.

The data latch cycle, erase cycle and rewrite cycle shown in FIG. 31 are successively effected on a memory cell. A structure performing this operation sequence will be described below.

Figure 32:
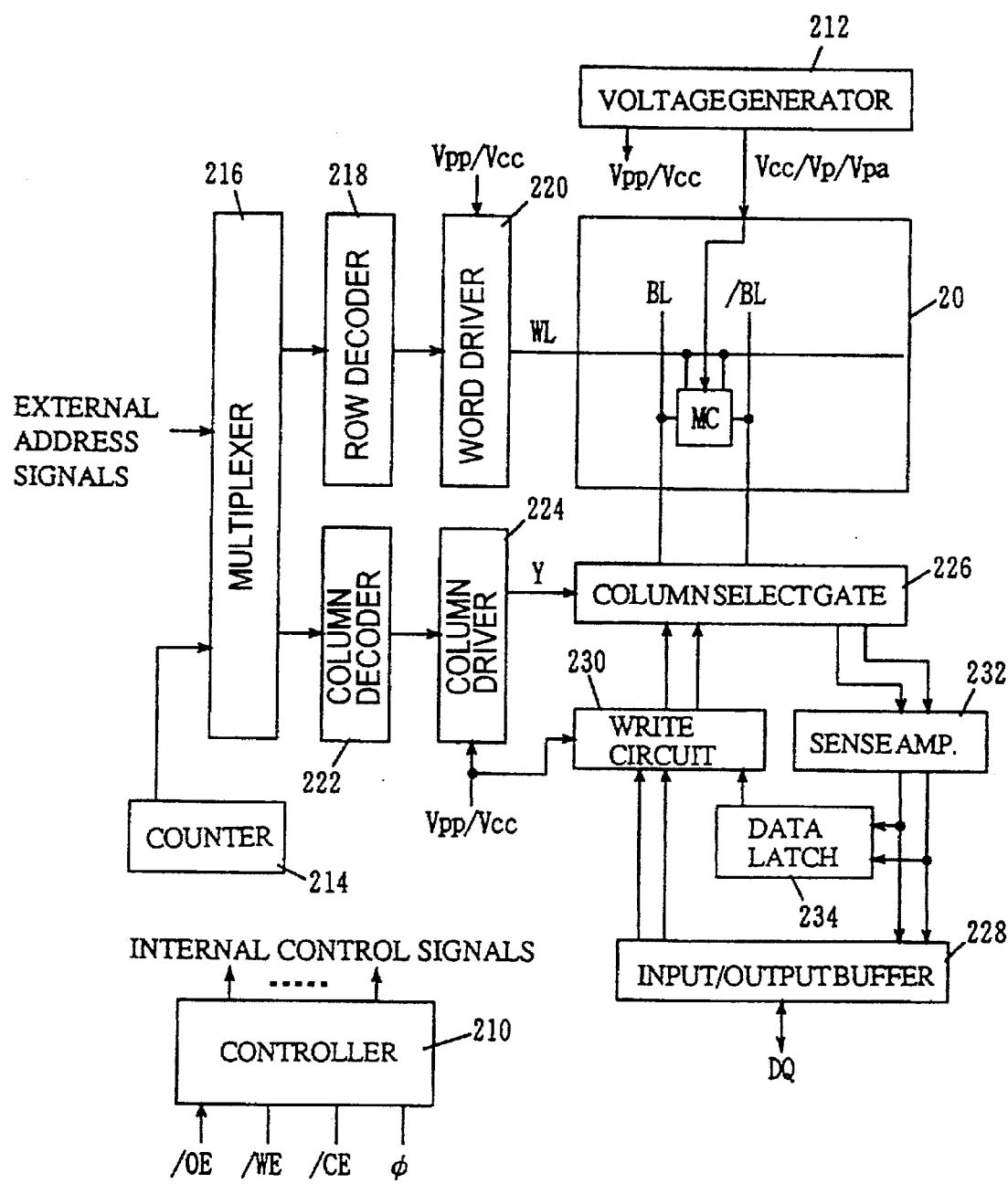
FIG. 32 schematically shows a whole structure of the non-volatile semiconductor memory device of the third embodiment of the invention.

FIG. 32 schematically shows a whole structure of a non-volatile memory device according to the third embodiment of the invention. FIG. 32 shows, as an example, a structure performing input/output of data on a unit of one bit. A structure performing input/output of data on a unit of multiple bits may be employed.

In FIG. 32, the non-volatile memory device includes a control circuit 210 which produces various internal control signals in accordance with output enable signal /OE designating a data reading, write enable signal /WE designating a data writing, chip enable signal /CE indicating that this memory device is selected, and control signal φ designating a special operation mode (non-volatile storage mode and erase mode). Control signal φ applied to control circuit 210 may be a particular address signal among the external address signals. In this structure utilizing a so-called "address key", such a structure may be employed that control circuit 210 detects that the special operation mode is designated in accordance with a combination of the signal states of signals /OE, /WE and /CE, and that the specific mode of the non-volatile operation mode and the erase mode is represented by the state of currently produced control signal φ. Although internal control signals generated by control circuit 310 are transmitted to various circuit elements shown in FIG. 32, paths of these control signals are not shown in the figure.

The memory device further includes a counter 214 which performs the counting operation under the control of control circuit 210, a multiplexer 216 which selects and passes either the count supplied from counter 214 or the external address signal under the control of control circuit 210, a row decoder 218 which receives as the row address signals the address signals sent from multiplexer 216 and decodes the same to produce a signal for selecting a corresponding word line in memory cell array 20, and a column decoder 220 which decodes the address signals applied from multiplexer 216 to produce a column select signal for selecting a column in memory cell array 20. Multiplexer 216 may be arranged upstream to an address buffer (not shown) or may be arranged downstream to the address buffer.

The memory device further includes a voltage generating circuit 212 which generates necessary voltages Vpp, Vp, Vpa and Vcc under the control of control circuit 210, a word driver 220 which is responsive to the word line select signal sent from row decoder 218 to produce and transmit word line drive signal WL at the level of voltage Vpp/Vcc transmitted from voltage generating circuit 212 to the corresponding word line WL, and a column driver 224 which receives voltage Vpp/Vcc from voltage generating circuit 212 and converts the column select signal sent from column decoder 222 into a voltage signal at the level of voltage Vpp/Vcc for generating the column select signal. Here, "Vpp/Vcc" means that either high voltage Vpp or power supply voltage Vcc is selectively generated in accordance with the operation mode.

The memory device further includes an input/output buffer 228 performing external input/output of data, a column select gate 226 selecting corresponding bit lines BL and /BL in memory cell array 20 in response to the column select signal Y sent from column driver 224, a sense amplifier 232 differentially amplifying the signal potentials on bit lines BL and /BL selected by column select gate 226, a data latch 234 latching the signal potentials amplified by sense amplifier 232, and a write circuit 230 which selects either the internal write data sent from an input buffer contained in I/O buffer 228 or data latched by data latch 234 and transmits the write data at a predetermined level onto selected bit lines BL and /BL via column select gate 226. Write circuit 230 receives voltage Vpp/Vcc and produces the write data at high voltage Vpp level in the non-volatile storage operation mode. The output of sense amplifier 232 is also transmitted to an output buffer contained in I/O buffer 228.

Voltage Vcc/Vp/Vpa generated by voltage generating circuit 212 is commonly applied to the power supply node of memory cell MC contained in memory cell array 20. In the non-volatile storage mode, the memory cells are successively selected, and the memory cells which have non-volatilely stored the data have power supply nodes receiving the high voltage Vp. However, the threshold voltage, which is to be changed, out of the threshold voltages of floating gate type transistors shifts to a value higher than this high voltage Vp. Therefore, no influence is applied to the non-volatile information storage. Also in the erase mode, the potentials of storage nodes A and B of nonselected memory cells are at the power supply voltage Vcc level or ground potential level, and no change occurs in the threshold voltages of floating gate type transistors in the nonselected memory cells, because the threshold voltage of floating gate type transistor has changed into the minimum value after completion of the erase cycle.

Structures of respective portions will be described below.

Figure 33:
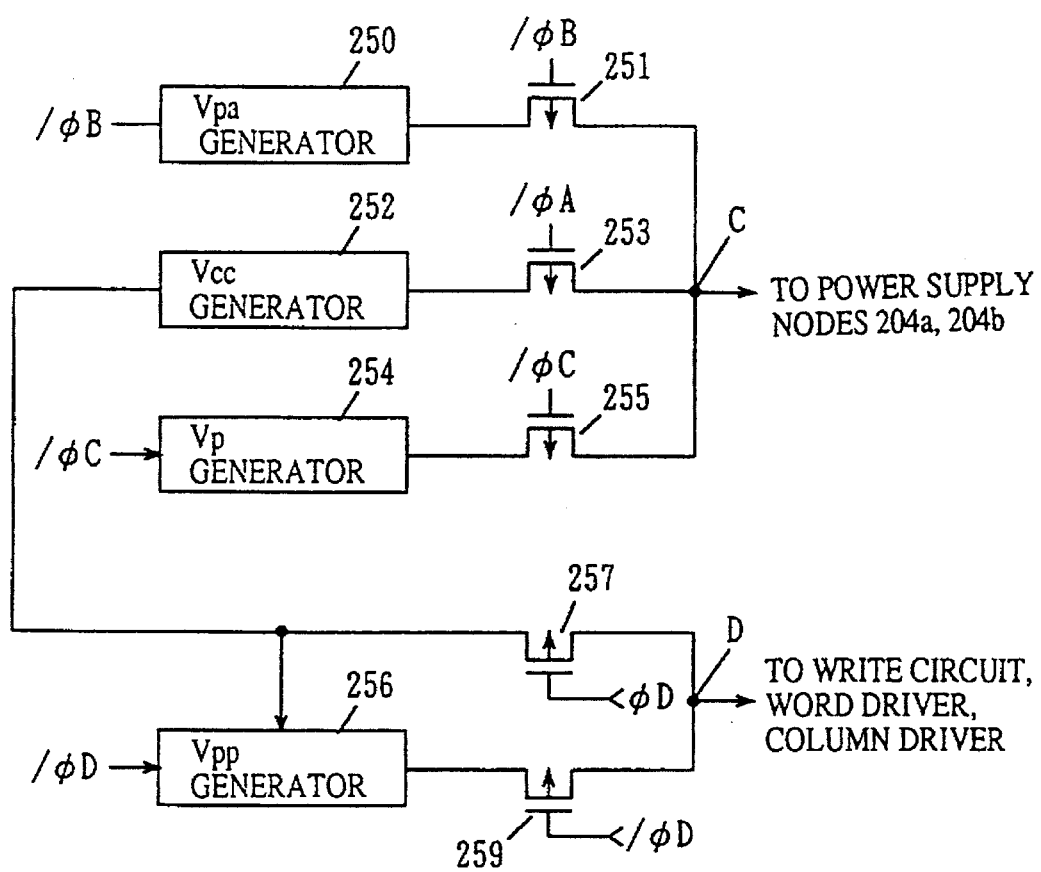
FIG. 33 shows an example of a structure of a voltage generating circuit shown in FIG. 32.

FIG. 33 shows an example of a structure of the voltage generating circuit shown in FIG. 32. In FIG. 33, voltage generating circuit 212 includes a Vcc generating circuit 252 generating power supply voltage Vcc, a Vpa generating circuit 250 which receives power supply voltage Vcc from Vcc generating circuit 252 and is activated to generate high voltage Vpa in response to a control signal /φB, a Vp generating circuit 254 which receives power supply voltage Vcc from Vcc generating circuit 252 and is activated to generate high voltage Vp in response to a control signal /φC, and a Vpp generating circuit 256 which receives power supply voltage Vcc from Vcc generating circuit 252 and is activated to generate high voltage Vpp in response to a control signal /φA. Vcc generating circuit 252 may be a pad receiving an externally applied power supply voltage, or may be a power supply line transmitting power supply voltage Vcc. Vpa generating circuit 250, Vp generating circuit 254 and Vpp generating circuit 256 may be formed of charge pump circuits utilizing charge pump operation of capacitors.

Voltage generating circuit 212 further includes a p-channel MOS transistor 251 which is turned on to pass the high voltage generated by Vpa generating circuit 250 in response to control signal /φB, a p-channel MOS transistor 253 which is turned on to pass power supply voltage Vcc generated by power supply voltage Vcc generating circuit in response to control signal /φA, a p-channel MOS transistor 255 which is turned on to pass high voltage Vp generated by Vp generating circuit 254 in response to control signal /φC, a p-channel MOS transistor 257 which is turned on to pass voltage Vcc generated by Vcc generating circuit 252 in response to a control signal φD, and an n-channel MOS transistor 259 which is turned on to pass high voltage Vpp generated by Vpp generating circuit 256 in response to control signal /φD. The outputs of transistors 251, 253 and 255 are applied to power supply nodes 204a and 204b of the memory cell. The voltage which is passed by one of transistors 257 and 259 is transmitted to the write circuit, word driver and column driver (a structure for this will be described later). Control signals /φC and /φD are activated to attain "L" in the voltage application cycle. Control signal /φB is activated to attain "L" in the erase cycle. Control signal /φA is set to the active state of "L" during operation other than the high voltage application cycle and erase cycle.

Vpa generating circuit 250, Vp generating circuit 254 and Vpp generating circuit 256 output the signals of "L" when they are inactive. Control signals /φA, /φB, /φC and /φD are set to "H" (power supply voltage level) when they are inactive. When high voltage Vpa or Vp is generated, if MOS transistor 253 is turned on, and the generated high voltage Vpa or Vp may adversely affect Vcc generating circuit 252. In order to prevent this, diodes may be arranged between transistors 253 and 255, and node C, and a diode may be arranged between transistor 257 and node D, in which case these diodes are set to the off state when the high voltage is generated, so that the generated high voltage does not adversely affect other circuits.

Figure 34:
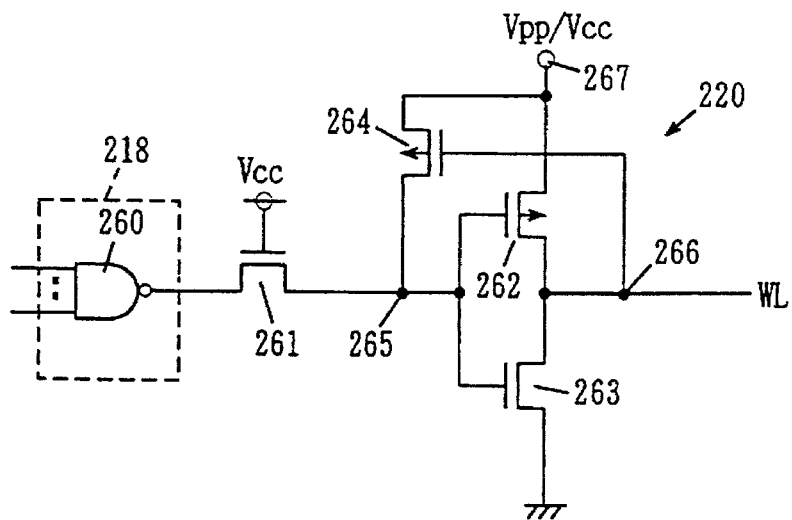
FIG. 34 shows an example of structures of a row decoder and a word driver shown in FIG. 32.

FIG. 34 shows a structure of a portion including the row decoder and word driver shown in FIG. 32. The column decoder and column driver has the same structure as the row decoder and word driver shown in FIG. 34. Here, the structure of only the row decoder and word driver will be described below.

Row decoder 218 includes a NAND type unit decoder circuit 260. Upon selection, the output of unit decoder circuit 260 is "L", and, upon non-selection, it is "H". Word driver 220 includes an n-channel MOS transistor 261 which transmits the output of unit decoder 260 to a node 265, and a p-channel MOS transistor 262 and an n-channel MOS transistor 263 which are complementarily connected between a node 267 and the ground potential node, and receive at their gates the signal potential on node 265. Node 267 connected to one conduction terminal (drain) of p-channel MOS transistor 262 is supplied with voltage Vpp/Vcc.

Word driver 220 further includes a p-channel MOS transistor 264 which is turned on to transmit voltage Vpp/Vcc, which is applied to node 267, to node 265 when the signal potential on a node 266 is "L". MOS transistor 261 receives, on its gate, power supply voltage Vcc, and high voltage Vpp does not adversely affect the output of decoder 218 even if the potential of internal node 265 attains high voltage Vpp.

The structure of word driver shown in FIG. 34 is the same as the structure of gate 116 shown in FIG. 21, and word driver 220 transmits the signal at voltage Vpp/Vcc level onto word line WL when the output of unit decoder circuit 260 is "L". If the output of unit decoder circuit 260 is "H", transistor 263 is turned on, and word line WL is set to the ground potential level.

The structure shown in FIG. 34 is provided for each word line WL. Owing to provision of word driver 220 and column driver 224 for voltage conversion, it is possible to set the signal potential on the word line and the voltage level of column select signal to intended levels in accordance with the operation cycle.

Figure 35:
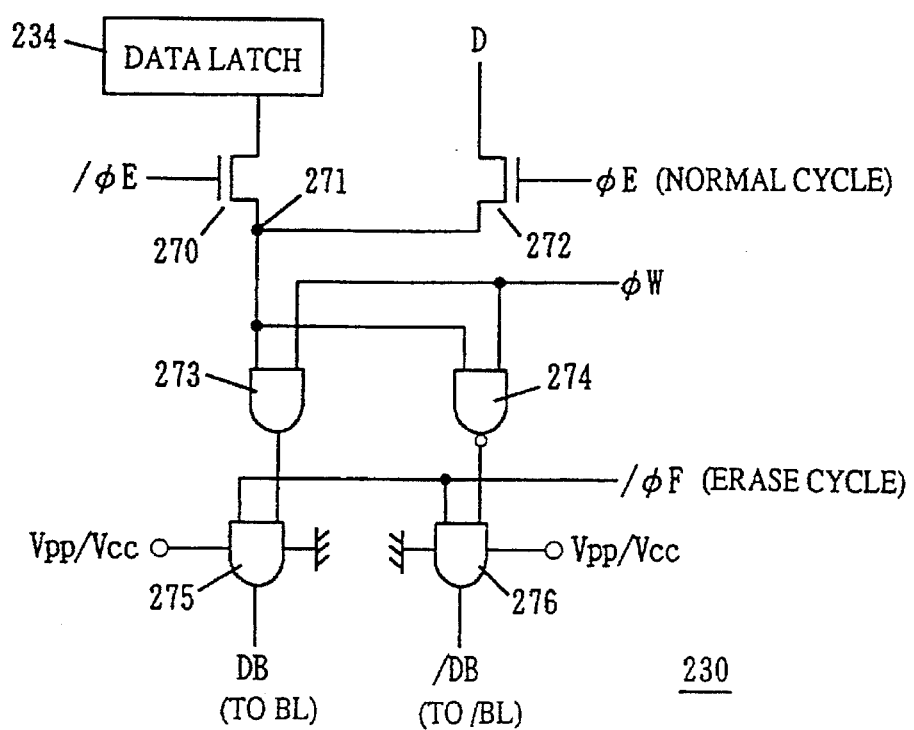
FIG. 35 shows an example of a structure of a write circuit shown in FIG. 32.

FIG. 35 shows an example of a structure of write circuit 230 shown in FIG. 32. In FIG. 35, write circuit 230 includes an n-channel MOS transistor 270 which is turned on to transmit data latched by data latch 234 (i.e., data transmitted onto bit line BL) to a node 271 in response to a control signal φ/E, an n-channel MOS transistor 272 which is turned on to pass internal write data D to node 271 in response to control signal φE, an AND circuit 273 receiving signal potential on node 271 and control signal φW, an NAND circuit 274 receiving signal potential on node 271 and control signal φW, an AND circuit 275 receiving a control signal /φF and an output of AND circuit 273, and an AND circuit 276 receiving an output of NAND circuit 274 and control signal /φF.

An output of AND circuit 275 is transmitted onto bit line BL via internal data line DB. The output of AND circuit 276 is transmitted onto bit line /BL via internal data line /DB. Control signal φE is made active (i.e., "H") in the normal cycle. Control signal φW attains the active state of "H" when it is necessary to write data into the memory cell (i.e., at the data write mode in the normal operation cycle, and in the high voltage application cycle and rewrite cycle). Control signal /φF is set to the active state of "L" in the erase cycle.

AND circuits 275 and 276 operate using voltage Vpp/Vcc as the operation power supply voltage. Therefore, when high voltage Vpp is generated, the signal potentials of the high level supplied from AND circuits 275 and 276 attain high voltage Vpp level. Thus, AND circuits 275 and 276 have the function of converting the voltage level of the signal at the high level. Owing to provision of AND circuits 275 and 276 having the level converting function, high voltage Vpp can be transmitted onto bit line BL or /BL in the non-volatile operation mode.

Owing to provision of the circuit structure described above, the embodiment can provide the memory device which surely stores the storage information in the non-volatile manner. Various control signals are generated from the control circuit shown in FIG. 32.

In the third embodiment, the rewrite cycle shown in FIG. 31 is eliminated if such a structure is employed that the reproduced memory cell data is temporarily saved on an external storage device in the erase cycle. In this case, the memory cell data saved on the external storage device is successively rewritten.

As described above, the third embodiment can provide the SRAM which can non-volatilely hold the storage information.

[Embodiment 4]

Figure 36:
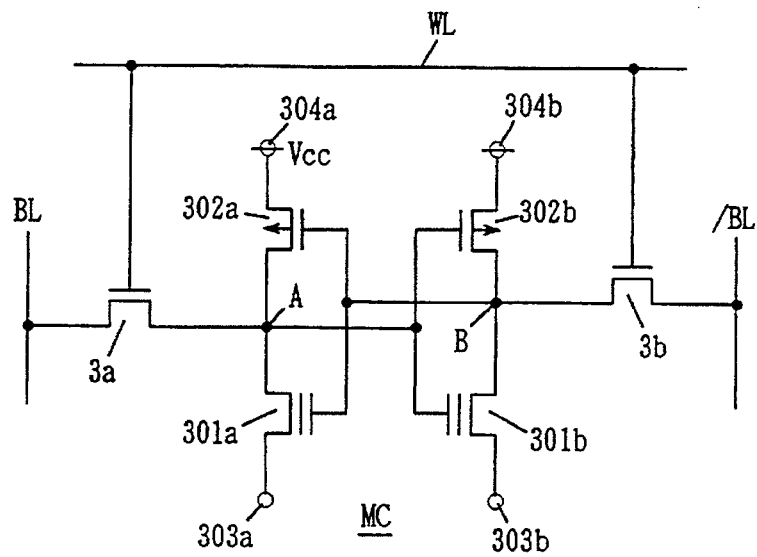
FIG. 36 shows a structure of a memory cell of a non-volatile semiconductor memory device of a fourth embodiment of the invention.

FIG. 36 shows a structure of a memory cell portion of a non-volatile memory device according to a fourth embodiment of the invention. In FIG. 36, non-volatile memory cell MC includes a floating gate type transistor 301a connected between storage node A and a node 303a, a p-channel MOS transistor 302a connected between node A and a power supply node 304a, a floating gate type transistor 301b connected between storage node B and a node 303b, and a p-channel MOS transistor 302b connected between storage node B and a power supply node 304e. Gates of transistors 301a and 302a are connected to storage node B, and gates of transistors 301b and 302b are connected to storage node A. Nodes 303a and 303b are supplied with the ground potential in the normal operation mode, and are supplied with a predetermined high voltage or the ground potential in the non-volatile storage mode and the erase mode (a structure for this will be described later). Floating gate type transistors 301a and 301b operate as enhancement type n-channel MOS transistors in the normal operation. Therefore, memory cell MC has a CMOS inverter latch structure.

Memory cell MC further includes access transistors 3a and 3b which are turned on to connect storage nodes A and B to bit lines BL and /BL in response to the signal potential on word line WL, respectively. Operation will be described later.

In the normal operation mode, nodes 303a and 303b are supplied with the ground potential. Floating gate type transistors 301a and 301b have predetermined threshold voltages, and are equivalent to an n-channel MOS transistor. When the potential of storage node A is "H", transistor 301b is on, transistor 302b is off, and storage node B is set to the potential of "L". Since the potential of storage node B is "L", transistor 302a is on, and transistor 303a is off. Therefore, the potentials of storage nodes A and B are set to "H" of power supply voltage Vcc level and "L" of ground potential level, respectively.

When the potential of word line WL rises, access transistors 3a and 3b are turned on, and storage nodes A and B are connected to bit lines BL and /BL, respectively. Thereby, data can be read or written. Thus, in the normal operation mode, memory cell MC operates similarly to the ordinary SRAM.

Figure 37:
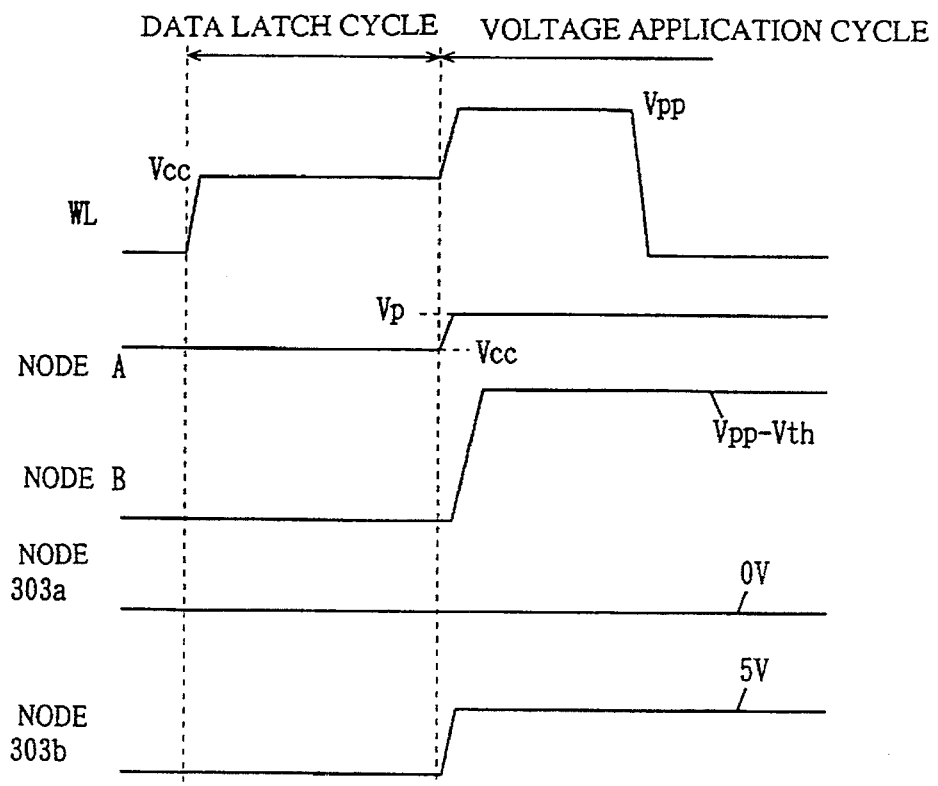
FIG. 37 is a signal waveform diagram representing operation in a non-volatile storage mode in the fourth embodiment of the invention.

In order to store the signal potentials of storage nodes A and B in the non-volatile manner, an operation sequence is executed, for example, as shown in FIG. 37.

In the following description, it is assumed that the signal potential held at storage node A is "H" of power supply voltage Vcc level, and the signal potential held at storage node B is "L" of the ground potential level. First, data stored in memory cell MC is read, and the read data is latched by a data latch which will be described later. Thereby, the data latch cycle is completed. Subsequent to completion of the data latch cycle, the potential of selected word line WL is further raised to high voltage Vpp level as shown in FIG. 37. Meanwhile, the potential of bit line BL is set to high voltage Vp level in accordance with the signal potential latched by the data latch, and the potential of bit line /BL is set to high voltage Vpp level. The signal potential of node 303a is set to the ground potential level of 0 V in accordance with the data latched by the data latch, the potential of node 303b is set to 5 V in accordance with the data latched by the data latch.

Figure 38:
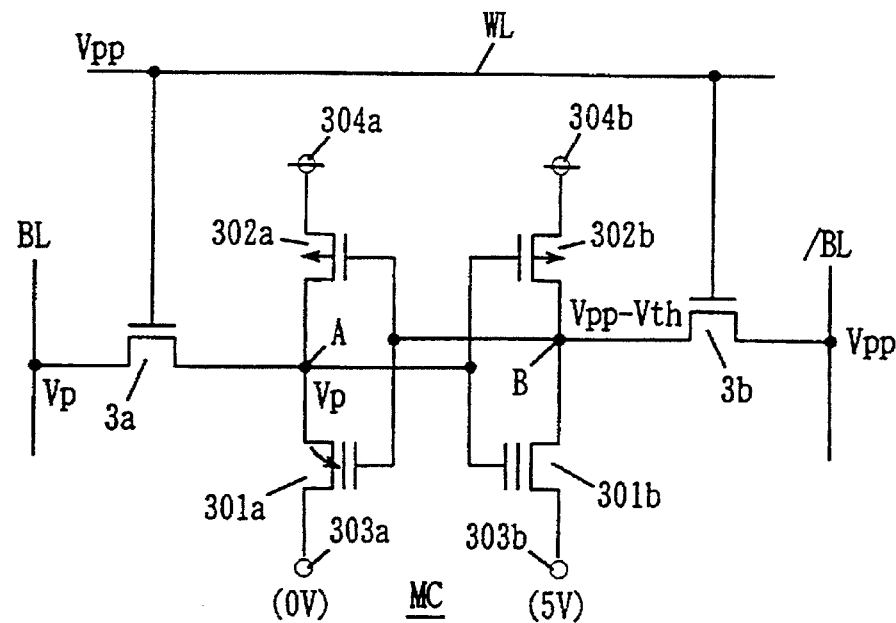
FIG. 38 shows conditions for voltage application in the non-volatile storage mode in the fourth embodiment.

Under the above conditions for voltage application, as shown in FIG. 38, the potential of node A attains high voltage Vp, and the potential of node B attains Vpp–Vth. Vth is the threshold voltage of access transistor 3b. In the floating gate type transistor 301a, since node 303a is at the ground potential level, a high electric field is generated at the vicinity of the drain, so that hot electrons are generated, and the generated hot electrons are accelerated by high voltage Vpp toward the floating gate and accumulated therein. Thereby, the threshold voltage of floating gate type transistor 301a rises. In the floating gate type transistor 301b, high voltage Vpp–Vth is applied to storage node B, the potential of node 303b is about 5 V, and the control gate maintains high voltage Vp applied to storage node A. Meanwhile, in the floating gate type transistor 301b, the potential difference between the source and control gate is about 2 V (high voltage Vp is about 7 V), and a high voltage is not applied between the drain and source, so that a high electric field is not generated at the vicinity of the drain region (MOS transistor transmits the voltage of Vgs–Vth). Therefore, hot electrons are not generated in the floating gate type transistor 301b, and its threshold voltage maintains the initial value. Thereby, only the threshold voltage of floating gate type transistor 301a rises. After this voltage application cycle, word line WL is deselected to attain "L", and the operation sequence of non-volatilizing the information is executed for the next memory cell.

When the non-volatilization of information is completed for all the memory cells, nodes 303a and 303b of all the memory cells are coupled to the ground potential. After the non-volatilization of information is completed for all the memory cells, the power is turned off.

Upon power-on, potentials of power supply nodes 304a and 304b rise. Initially, currents are supplied to storage nodes A and B via transistors 302a and 302b, respectively. Since the threshold voltage of floating gate type transistor 301a is higher than the threshold voltage of floating gate type transistor 301b, floating gate type transistor 301b is turned on prior to turn on of transistor 301a, and discharges the potential of storage node B to the ground potential level. Floating gate type transistor 301a maintains the off state in accordance with the potential of storage node B, and transistor 302a charges storage node A. Owing to this rise of potential, transistor 302b changes to the off state, and transistor 301b attain a stronger on state. Thereby, the potential of storage node A is latched at "H" level, and the potential of storage node B is latched at "L" level. Thus, the storage information which existed before the power-off is reproduced.

(ii) Erase Mode

Figure 39:
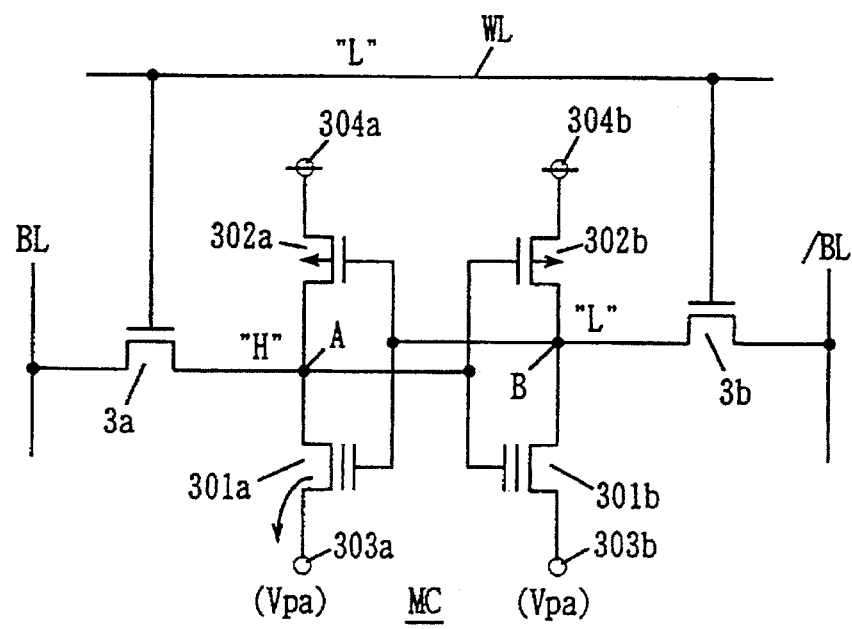
FIG. 39 shows conditions for voltage application in the erase mode in the fourth embodiment.

In the erase mode, as shown in FIG. 39, high voltage Vpa, e.g., of about 12 V is applied to nodes 303a and 303b while maintaining the potential of word line WL at the nonselected state of "L". Storage nodes A and B hold the signal potential of "H" at the power supply voltage Vcc level and the signal potential of "L" at the ground potential level, respectively. Meanwhile, in floating gate type transistor 301a, the potential of the control gate is at the ground potential level, and high voltage Vpa is set high even if the potential of storage node A is "H", so that a high electric field is generated between the floating gate and the source, and electrons flow from the floating gate toward node 303a owing to the tunneling current. Although a current flows into storage node A via transistor 302a, this current flowing from storage node A does not adversely affect the tunneling current generated in floating gate type transistor 301a, because the control gate of floating gate type transistor 301a is at the ground potential level. Transistors 301a and 301b are drive transistors different from and larger in size than load transistors as shown in FIG. 1, and therefore "H" potential at node A does not affect the high electric field in the transistor 301a.

Meanwhile, in floating gate type transistor 301b, the potential of its control gate is at power supply voltage Vcc level, and a high electric field is not formed between the floating gate and the source, so that electrons do not flow from the floating gate. Thereby, only the high threshold voltage raised at the non-volatile storage mode can be returned to the initial value.

Figure 40:
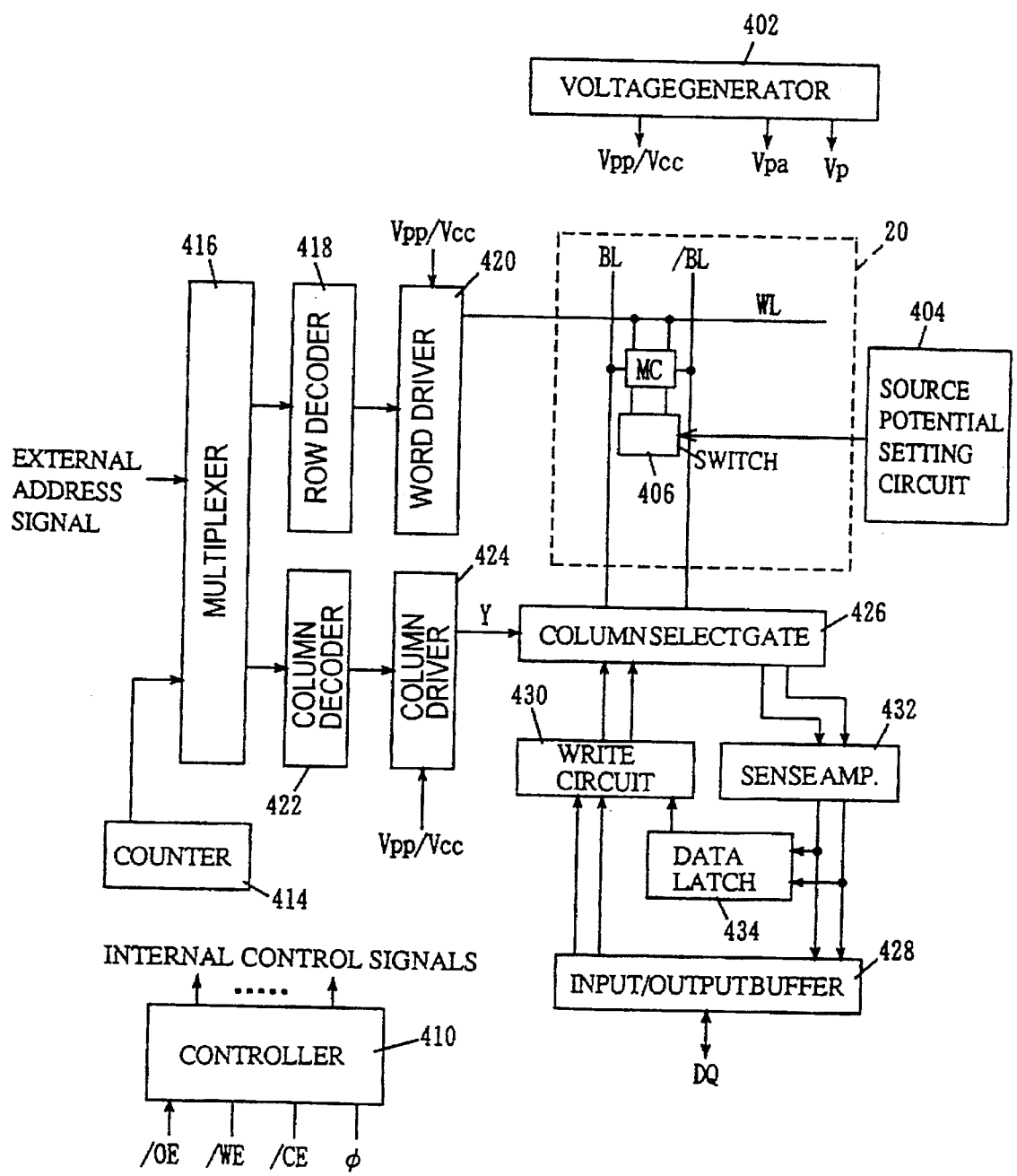
FIG. 40 shows a whole structure of the non-volatile memory device of the fourth embodiment.

FIG. 40 schematically shows a whole structure of a non-volatile memory device according to a fourth embodiment of the invention. In FIG. 40, the non-volatile memory device includes a control circuit 410 which receives external control signals /OE, /WE, /CE and φ and generates various internal control signals, a counter 414 which is activated under the control of control circuit 410 to execute the counting operation in the non-volatile storage mode, a multiplexer 416 which is controlled by control circuit 410 to select one of the output of counter 414 and the externally applied address signal, a row decoder 418 which receives, as a row address signal, an address signal applied from multiplexer 416, a word driver 420 which operates in accordance with a row select signal sent from row decoder 418 to transmit a signal at voltage Vpp level or Vcc level onto a corresponding row (word line), a column decoder 422 which receives, as a column address signal, the address signal from multiplexer 416 and decodes the same for generating a column select signal, a column driver 424 which receives the column select signal generated by column decoder 422 and changes the potential level in the active state into power supply voltage Vcc level or high voltage Vpp level, and a column select gate 426 which operates in accordance with the output of column driver 424 to select a corresponding bit line pair in memory cell array 20. Counter 412, multiplexer 416, row decoder 418, word driver 420, column decoder 422 and column driver 424 as well as column select gate 426 have the same structures as those of the third embodiment except for a timing of control signals generated from control circuit 410.

Memory device further includes a voltage generating circuit 402 which selectively generates the voltages Vcc and Vpp and also selectively generates another high voltages Vpa and Vp under the control of control circuit 410, a source potential setting circuit 404 for setting the source potential of memory cell MC, a switching circuit 406 which operates to set the source potential of a corresponding memory cell MC in accordance with the potential determined by source potential setting circuit 404, a sense amplifier 432 which amplifies the signal potentials on the bit lines selected by column select gate 425 to produce the internal read data, a data latch 434 which latches the internal read data amplified by sense amplifier 432, an I/O buffer 428 performing external input/output of data, and a write circuit 430 which produces the internal write data in accordance with one of the internal write data supplied from the input buffer contained in I/O buffer 428 and the data latched by data latch 434. The sense amplifier 432, data latch 434 and I/O buffer 428 have the same structures as those employed in the third embodiment. Under the control of control circuit 410, application of required high voltages is performed in the non-volatile storage mode and the erase mode, and the timing of memory cell selection is controlled.

Voltage generating circuit 402 has the same structure as that in the third embodiment. The structures shown in FIG. 40 are the same as those in the third embodiment except for source potential setting circuit 404, ground circuit 406 and write circuit 430. These will be now described below.

Figure 41:
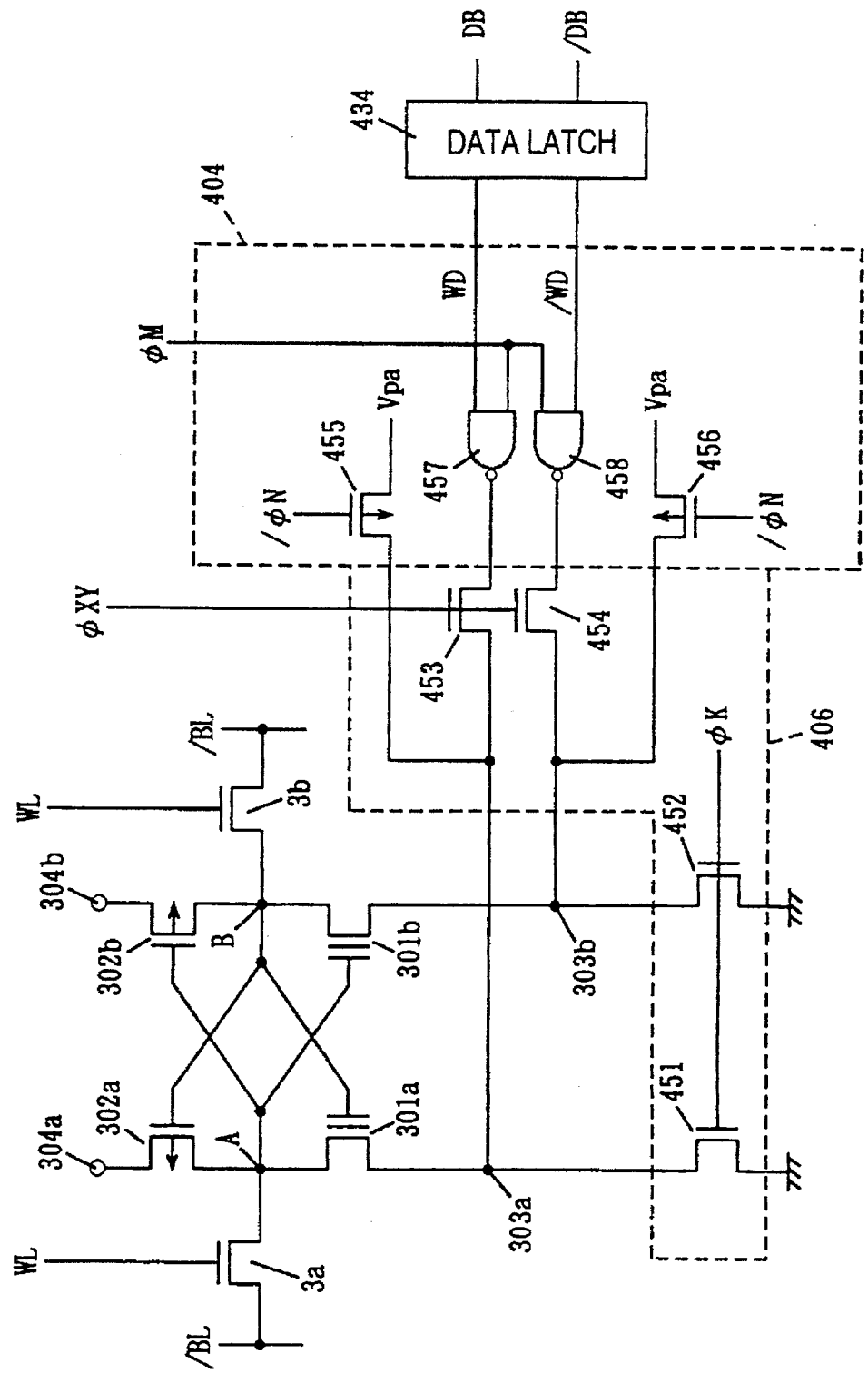
FIG. 41 shows an example of structures of a source potential setting circuit and a switch circuit shown in FIG. 40.

FIG. 41 shows an example of the structure of source potential setting circuit and switch circuit shown in FIG. 40. Switch circuit 406 includes an n-channel MOS transistor 451 arranged between node 303a and the ground potential supply node, an n-channel MOS transistor 452 arranged between node 303b and the ground potential supply node, and n-channel MOS transistors 453 and 454 which are turned on in response to memory cell select signal φXY (which is the same as that in the second embodiment). These transistors 451, 452, 453 and 454 may be formed of CMOS transmission gates instead of transfer gates. A control signal φK applied to gates of transistors 451 and 452 is "H" in the normal operation mode, and is "L" in the non-volatile storage mode and erase mode.

Source potential setting circuit 404 includes p-channel MOS transistors 455 and 456 which are turned on to transmit high voltage Vpa to nodes 303a and 303b in response to signal /φN, an NAND circuit 457 which receives a data signal latched by data latch 434 (signal appearing on internal data line DB, i.e., bit line BL) at one input, and also receives control signal φM at the other input, and an NAND circuit 458 which receives control signal φM and the complementary signal latched by data latch 434 (corresponding to signal potential appearing on data line /DB, i.e., bit line /BL). Control signal /φN attains the active state of "L" in the erase mode. Control signal φM is activated at the voltage application cycle in the non-volatile storage mode. At this time, NAND circuits 457 and 458 function as inverters. Memory cell select signal φXY is generated to successively select the memory cells (i.e., is generated each time the output of counter 414 is decoded).

According to this structure, as shown in FIG. 38, the source potential of the floating gate type transistor, of which threshold voltage is to be raised, i.e., in which electrons are to be injected into the floating gate, can be set to the ground potential, and the threshold voltage can be changed surely in accordance with the data to be held.

In the structure shown in FIG. 41, high voltage Vpa is commonly generated for all the memory cells in the erase mode. Alternatively, such a structure may be employed that the above operation is performed individually for each group of multiple bits or each row (so as to reduce the power consumption of data generating circuit 402 shown in FIG. 40). The voltage applied to the sources of floating gate type transistors 301a and 301b may be at Vp level instead of Vcc level.

Figure 42:
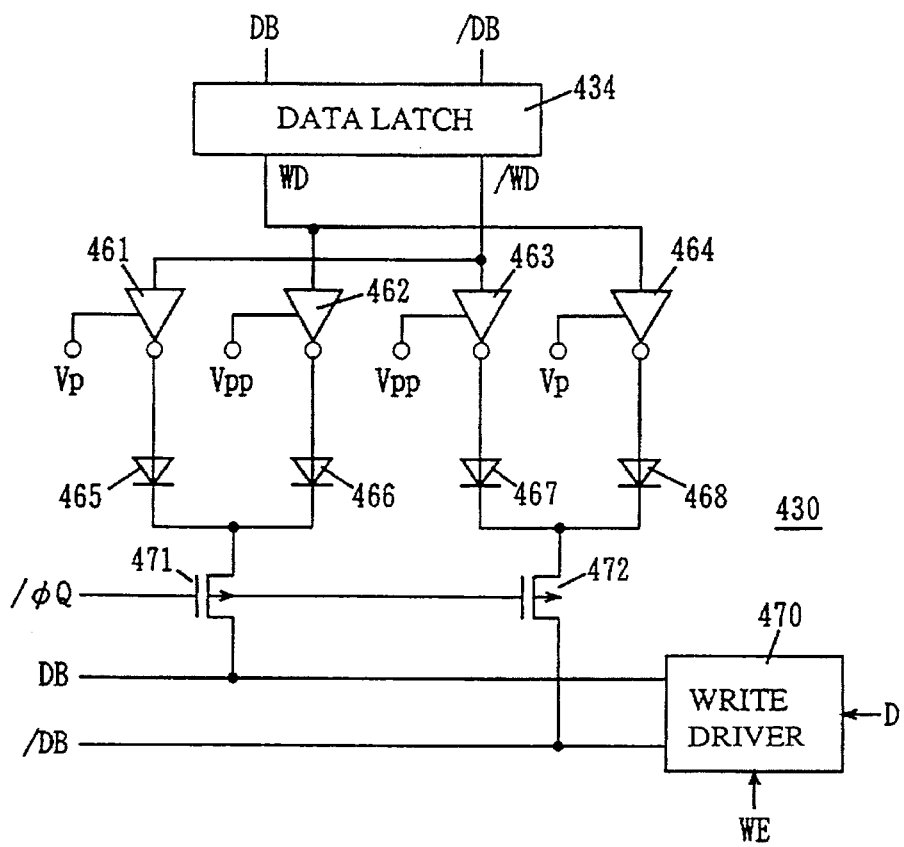
FIG. 42 shows an example of a structure of a write circuit shown in FIG. 40.

FIG. 42 shows an example of the structure of the write circuit shown in FIG. 40. In FIG. 42, write circuit 430 includes inverters 462 and 464 receiving a signal WD from data latch 434, and inverters 461 and 463 receiving a data signal /WD from data latch 434. True data signal WD supplied from data latch 434 corresponds to the signal potential appearing on data line DB. The false data signal corresponds to the signal potential appearing on data line /DB.

Inverters 461 and 464 operate using high voltage Vp as the operation power voltage. Inverters 462 and 463 operate using high voltage Vpp as the operation power voltage.

Inverters 461, 462, 463 and 464 are provided with diodes 465, 466, 467 and 468 for preventing reverse current at their outputs. Cathodes of diodes 465 and 464 are connected to one conduction terminal of a p-channel MOS transistor 471, and cathodes of diodes 467 and 468 are connected to one conduction terminal of a p-channel MOS 472. Transistor 471 receives on its gate a control signal /φQ, and is connected at the other conduction terminal to internal data line DB. Transistor 472 receives on its gate a control signal /φQ, and is connected at the other conduction terminal to internal data line /DB. Internal data lines DB and /DB are provided with a write driver 470, which produces logically complementary write signals from internal write data D and transmits the same onto internal data lines DB and /DB in response to internal write instruction signal WE during the normal operation.

Control signal /φQ is set to the active state of "L" in the high voltage application mode. Application of high voltages Vp and Vpp to inverters 461, 462, 463 and 464 is performed only in the high voltage application mode (this voltage change is achieved under the control of high voltage generating circuit 402 shown in FIG. 40).

When data signal WD is "H" (at power supply voltage Vcc level), complementary signal /WD is at the ground potential level and hence "L". In this case, the outputs of inverters 462 and 464 are at the ground potential level and hence "L". The voltage levels of signals output from inverters 461 and 463 are high voltage Vp and Vpp levels, respectively. Transistors 471 and 472 are on, and high voltage Vp is transmitted onto internal data line DB, and high voltage Vpp is transmitted onto internal data line DB. Thereby, high voltage Vp is transmitted to bit line BL, and high voltage Vpp is transmitted to bit line /BL.

Owing to provision of the write circuit shown in FIG. 42, high voltages Vpp and Vp can be transmitted to bit lines BL and /BL in the high voltage application cycle in accordance with storage data to be held.

[Modification 1]

Figure 43:
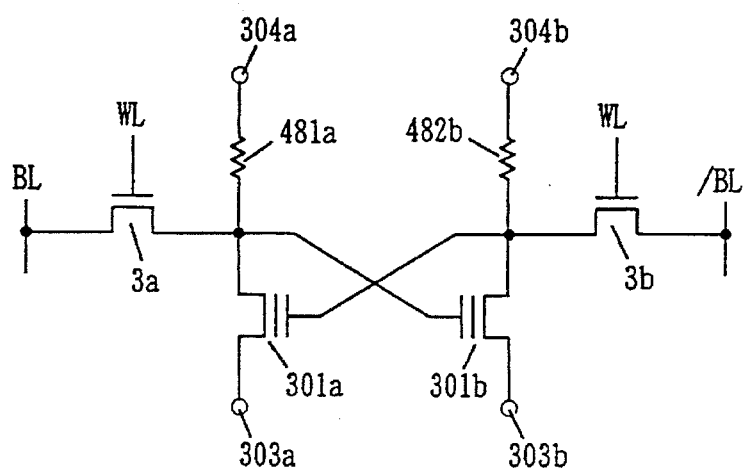
FIG. 43 shows a modification of the non-volatile memory device of the fourth embodiment of the invention.

FIG. 43 shows a modification of a memory cell of the non-volatile memory device according to the fourth embodiment of the invention. The memory cell shown in FIG. 43 includes, as a load element, a resistor element of a high resistance made of, e.g., polycrystalline silicon of a high resistance. The memory cell having the structure shown in FIG. 43 can change the storage information into the non-volatile form similarly to the memory cell already described. It can use and employ the same operation sequence and the peripheral circuitry.

As described above, the fourth embodiment can provide the fast accessible memory device which can surely store the information in the non-volatile manner.

[Embodiment 5]

Figure 44:
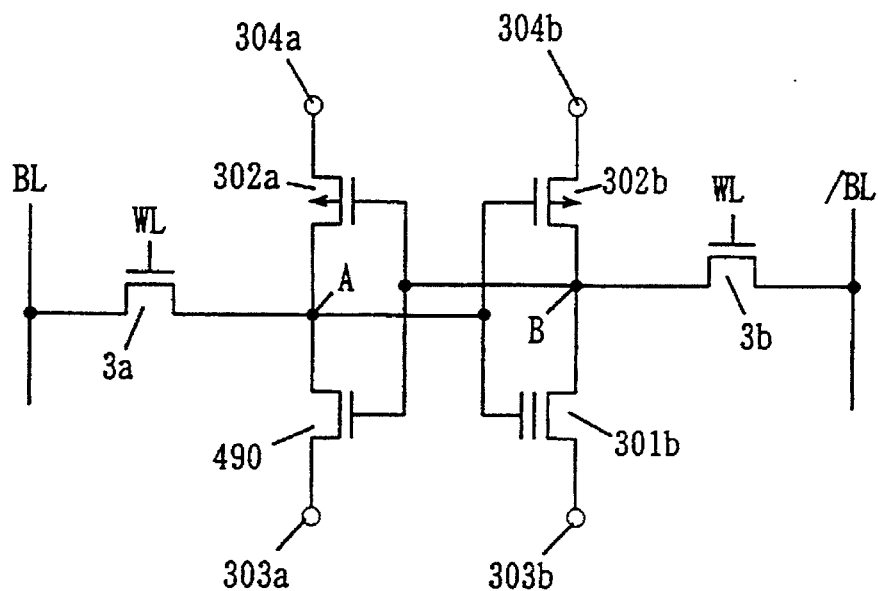
FIG. 44 shows a structure of a non-volatile memory device of a fifth embodiment of the invention.

FIG. 44 shows a structure of a memory cell of a non-volatile semiconductor memory device according to a fifth embodiment of the invention. In the structure of the memory cell shown in FIG. 44, an MOS transistor 490 having no floating gate is arranged between storage node A and node 303a, which is different from the structure of the memory cell in the fourth embodiment described with reference to FIG. 36. Other structures are the same as those of the memory cell shown in FIG. 36.

In the structure of the memory cell shown in FIG. 44, it is necessary to adjust the voltages applied to the control gate, storage node B and node 303b of floating gate type transistor 301b in accordance with the information to be stored (both in the non-volatile storage mode and erase mode). The reason for this is that the shift of the threshold voltage of floating gate type transistor 301b must be allowed in both directions, i.e., toward a higher value and a lower value. However, even this structure can non-volatilely store the information in principle, and specifically, the potentials of storage node A, storage node B and internal node 303b can be set to appropriate voltage values in accordance with the data to be held, for example, by utilizing the structure similar to the circuit structure already described with reference to the second and third embodiments.

In the erase mode, data to be held is read out, and the potentials of nodes A, B and 303b are set in accordance with this read data, whereby the initial state can be restored (by changing the threshold voltages in a manner opposite to that in the non-volatile storage operation). The threshold voltage of floating gate type transistor 301b is set to a value higher or lower than the fixed threshold voltage of MOS transistor 490.

Although FIG. 44 does not particularly show the structure of control circuit for non-volatilizing and erasing the information in the memory cell, these can be achieved by expanding a structure similar to that in the second and third embodiments already described.

[Modification]

Figure 45:
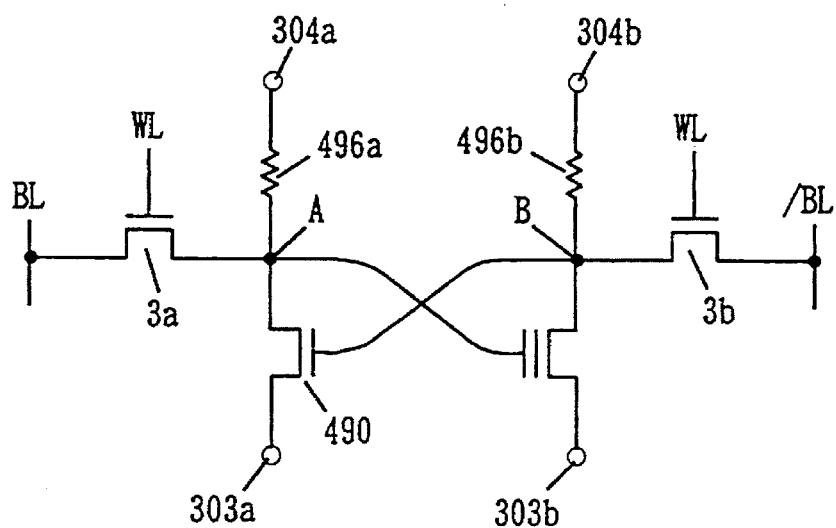
FIG. 45 shows a modification of the non-volatile semiconductor memory device of the fifth embodiment of the invention.

FIG. 45 shows a modification of the memory cell of the non-volatile memory device according to the fifth embodiment of the invention. In the structure of memory cell shown in FIG. 45, resistor elements 496a and 496a of a high resistance, e.g., made of polycrystalline silicon are arranged between power supply nodes 304a and 304b and storage nodes A and B, respectively. This structure differs from that of the memory cell shown in FIG. 44 merely in that the load elements are formed of the high-resistance resistors in place of the p-channel MOS transistors, and can non-volatilize the information similarly to the memory cell shown in FIG. 44. Instead of resistor elements 496a and 496b, n-channel MOS transistors of a depletion type may be used as the load elements. Also, thin-film transistors or the like may be used.

[Embodiment 6]

Figure 46:
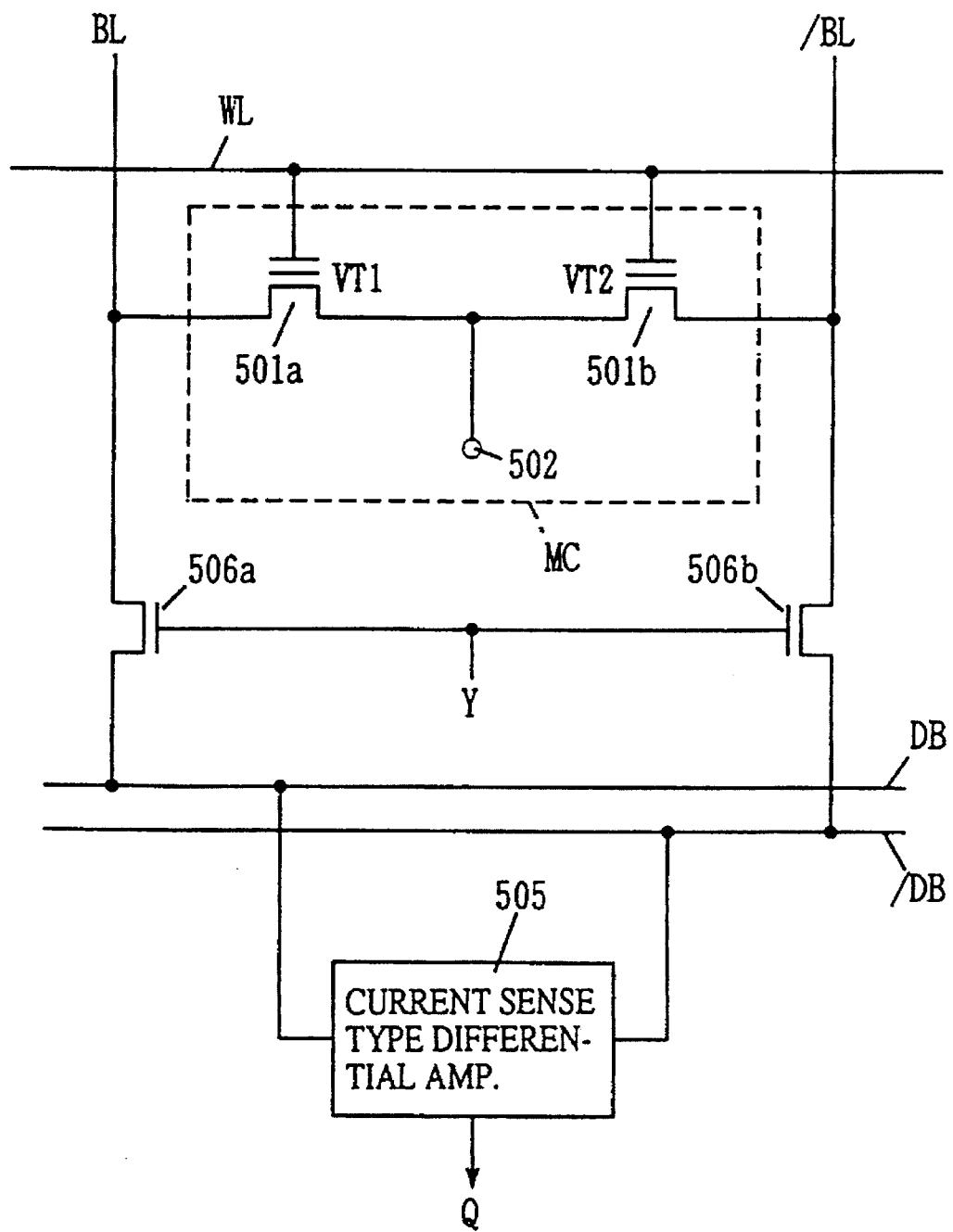
FIG. 46 shows a structure of a main portion of a non-volatile memory device of a sixth embodiment of the invention.

FIG. 46 shows a structure of a memory cell of a non-volatile memory device according to the sixth embodiment of the invention. In FIG. 46, memory cell MC includes two floating gate type transistors 501a and 501b. Floating gate type transistor 501a is connected at its control gate to word line WL, at one conduction terminal (drain) to bit line BL, and at another conduction terminal (source) to a node 502. Floating gate type transistor 501b is connected at its control gate to word line WL, at one conduction terminal to bit line /BL, and at another conduction terminal to a node 502. Threshold voltages VT1 and VT2 of floating gate type transistors 501a and 501b are set to values different from each other when non-volatilely storing information. Memory cells MC, one of which is shown in FIG. 46, are arranged in a matrix of rows and columns.

Bit lines BL and /BL are connected to internal data lines DB and /DB via column select gates 506a and 506b which are turned on in response to column select signal Y. Internal data lines DB and /DB are provided with a differential amplifier 505 of the current sense type. Differential amplifier 505 of the current sense type senses the quantities of current flowing through internal data lines DB and /DB, and differentially amplifies the detected quantities of current to produce internal read data Q (the structure of the differential amplifier of the current sense type will be described later).

In the normal operation, floating gate type transistors 501a and 501b have different threshold voltages VT1 and VT2. Node 502 is supplied with the ground potential.

Figure 47:
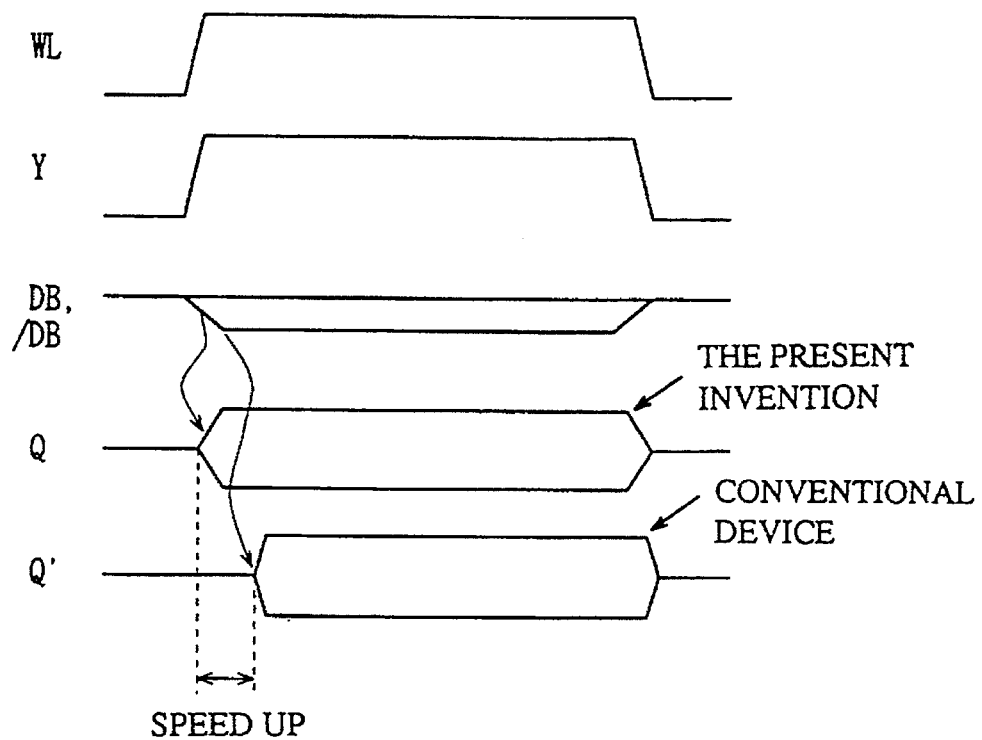
FIG. 47 is a signal waveform diagram representing data read operation of the sixth embodiment of the invention.

As shown in FIG. 47, the potential of word line WL rises to "H" (power supply voltage Vcc level) when word line is selected. If threshold voltage VT1 of floating gate type transistor 501a is higher than threshold voltage VT2 of floating gate type transistor 501b, the quantity of current flowing through bit line /BL is larger than that of current flowing through bit line BL. When column select signal Y is set to the selected state, bit lines BL and /BL are connected to internal data lines DB and /DB. The differential amplifier 505 of the current sense type differentially amplifies the difference between the currents flowing through data lines DB and /DB to produce internal data Q.

Figure 58:
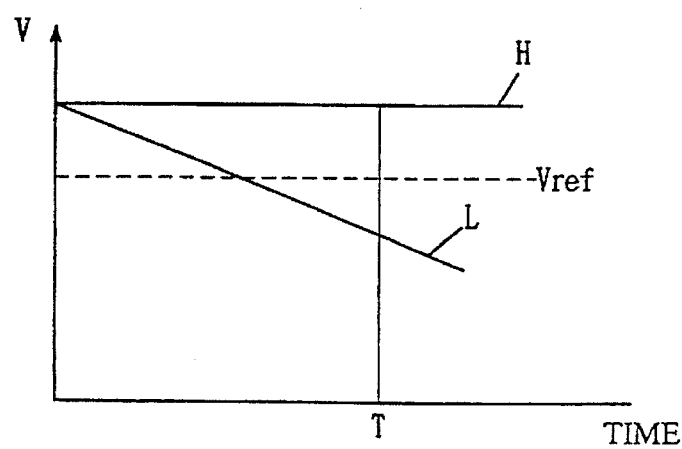
FIG. 58 represents data reading operation in the conventional non-volatile memory device.
Figure 59:
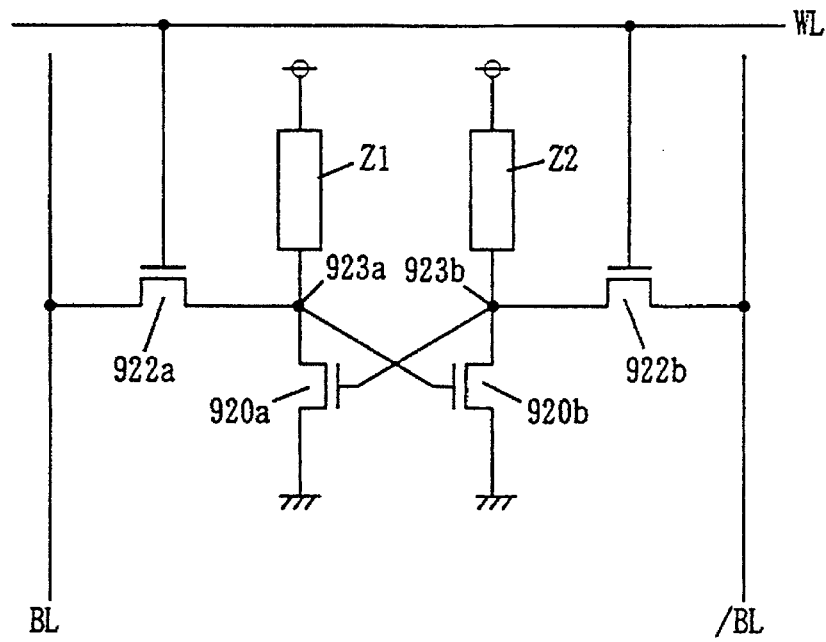
FIG. 59 shows a structure of a conventional SRAM.
Figure 60:
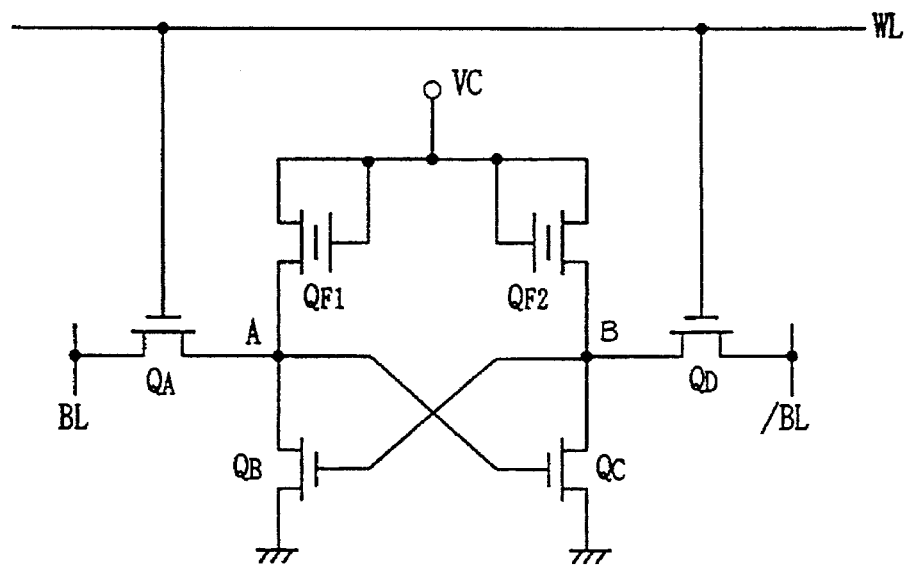
FIG. 60 shows a structure of a conventional non-volatile SRAM.

As shown in FIG. 47, current information on data lines DB and /DB on which logically complementary signals appear are differentially amplified. Therefore, when a minute current difference appears between internal data lines DB and /DB, this difference can be immediately amplified by differential amplifier 505 to read the internal data. Therefore, as shown in FIG. 47 for comparison, data can be read at a higher speed than the conventional structure which uses one bit line for reading data (internal read data Q' in FIG. 47). This is because in the conventional structure, presence/absence of the current flowing through one bit line is detected, as shown in FIG. 58, by converting the current flowing through the bit line (or internal data line) into the voltage and comparing the same with a reference voltage, which requires a significant time.

Operation of writing data includes the erase cycle and the write cycle for actually writing data, similarly to the operation of the ordinary "flash memory".

(i) Erase Cycle

The erase cycle includes the "pre-erase write" cycle for setting the threshold voltage of floating gate type transistors to a high constant voltage value, and the "erase" cycle for setting the threshold voltages of floating gate type transistors to the initial state.

Figure 48:
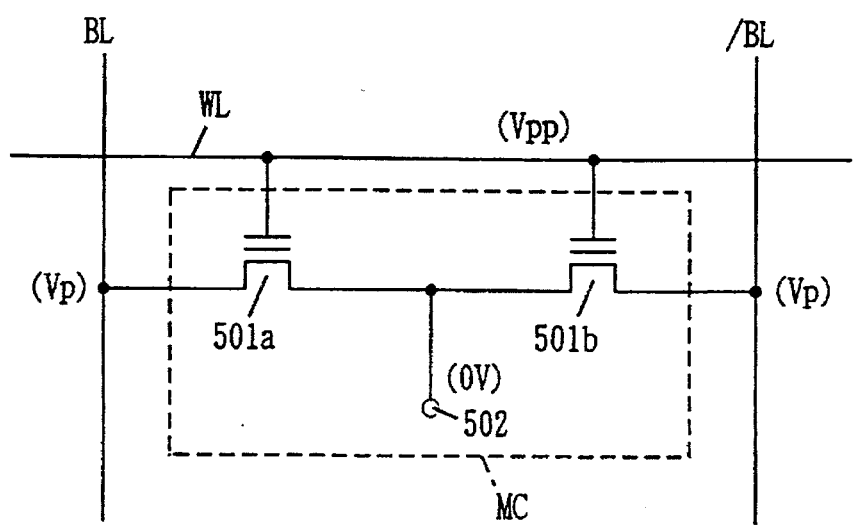
FIG. 48 shows conditions for voltage application during pre-erase write operation of the sixth embodiment of the invention.

(a) In the "pre-erase write" cycle, as shown in FIG. 48, high voltage Vpp is applied to word line WL, high voltage Vp is applied to bit lines BL and /BL, and node 502 is set to the ground potential (0 V). In this state, hot electrons are generated in both floating gate type transistors 501a and 501b, and electrons are injected into the floating gates, so that their threshold voltages change to high voltage values.

Figure 49:
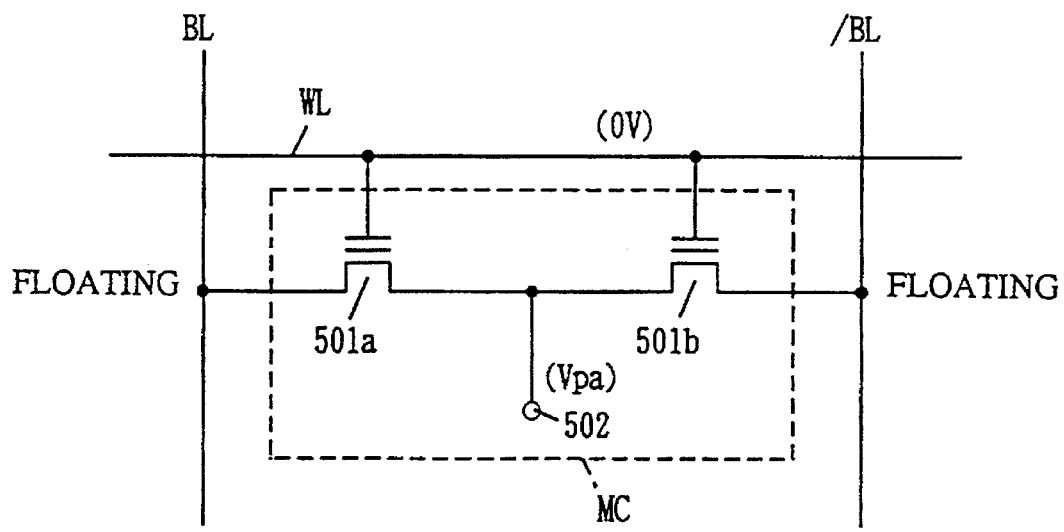
FIG. 49 shows conditions for voltage application in an erase cycle of the sixth embodiment of the invention.

(b) In the "erase" cycle, word line WL is set to the nonselected state of 0 V as shown in FIG. 49, and bit lines BL and /BL are set to the floating states. High voltage Vpa is applied to node 502. The ground potential is applied to a substrate region of floating gate type transistors 501a and 501b. In this state, a Fowler-Nordheim tunneling current is generated in both floating gate type transistors 501a and 501b, and electrons flow from floating gates to node 502, so that the threshold voltages of floating gate type transistors 501a and 501b return to the initial state, e.g., of 1.0 V.

The structure for setting bit lines BL and /BL to the floating gate state can be implemented merely by setting column select signal Y to the nonselected state of ground potential (0 V). If such a structure is employed that bit lines BL and /BL are precharged to a predetermined precharge potential, as will be described later, a precharge element for this is set to the off state in the erase cycle.

(ii) Write Cycle

Figure 50:
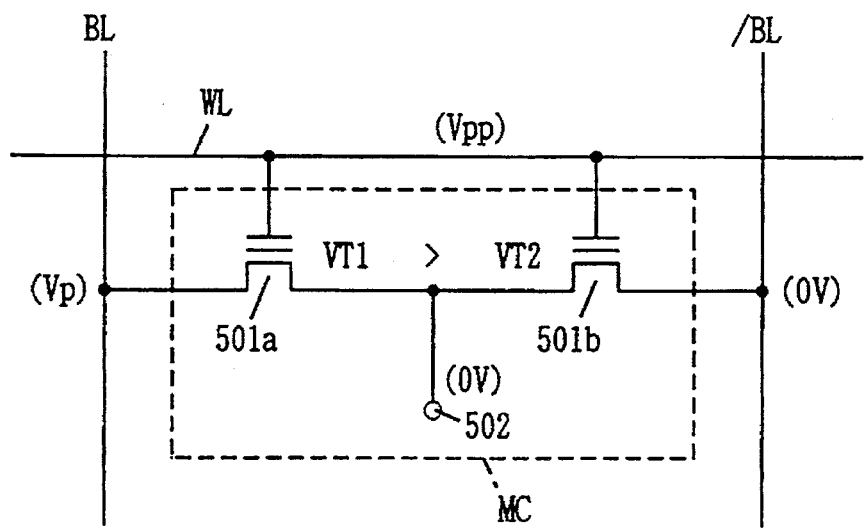
FIG. 50 shows an example of conditions for voltage application in a write cycle of the sixth embodiment.

After the erase operation, the voltage is applied in accordance with information to be stored. With reference to FIG. 50, description will now be given on the operation in which the threshold voltage of floating gate type transistor 501a is set to a value higher than that of floating gate type transistor 501b.

High voltage Vpp is applied to word line WL, and high voltage Vp is applied to bit line BL. The ground potential (0

V) is applied to bit line /BL and node 502. For example, high voltage Vpp is about 12 V, and high voltage Vp is about 7 V. In the floating gate type transistor 501a, the potential difference between the drain and source is equal to high voltage Vp, and a large amount of hot electrons are generated by avalanche breakdown near the drain region and within the channel region, so that the hot electrons thus generated are accelerated by high voltage Vpp applied to word line WL and are injected into the floating gate. In the floating gate type transistor 501b, the voltages of its source and drain are equal to each other, so that a high electric field and hence hot electrons are not generated. Therefore, the threshold voltage of floating gate type transistor 501b has the initial value. Thus, threshold voltage VT1 of floating gate type transistor 501a is higher than threshold voltage VT2 of floating gate type transistor 501b.

The structure in which one memory cell includes two floating gate type transistors can mitigate the necessity of strictly setting the threshold voltages of floating gate type transistors to a constant value. This is because due to a difference between the threshold voltages of two floating gate type transistors, data can be read with the differential amplifier. Therefore, the structure in which one non-volatile memory cell includes two floating gate transistors can provide an advantage that parameters in the manufacturing process can be controlled easily, in addition to the advantage that the access time is short.

Figure 51:
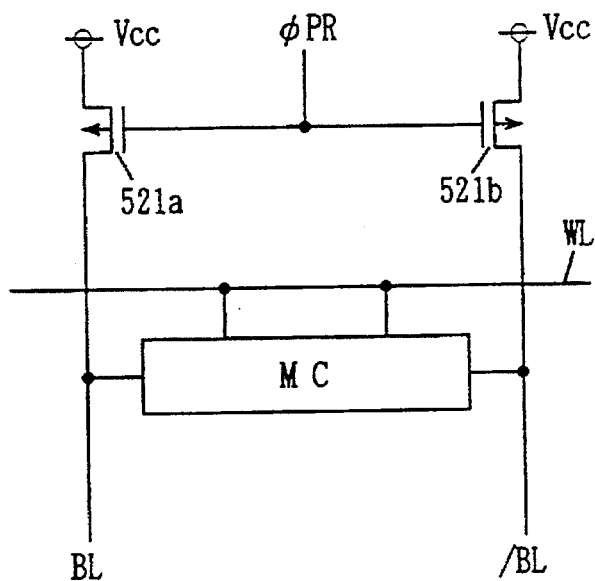
FIG. 51 shows a structure of bit line peripheral circuitry in the sixth embodiment.

FIG. 51 shows a structure of a bit line load circuit. In FIG. 51, precharge transistors 521a and 521b which are turned off in response to a control signal φPR are provided for bit lines BL and /BL, respectively. Precharge transistors 521a and 521b are formed of p-channel MOS transistors. Control signal φPR attains "H" to turn off precharge transistors 521a and 521b in the erase operation. Thereby, bit lines BL and /BL can be set to the floating state in the erase cycle. In memory cell MC containing the written information, if one of the floating gate type transistors is always off (in the case where the threshold voltage of one of the floating gate type transistors changes to a value not lower than power supply voltage Vcc in the write operation), the current does not flow through one of the bit lines. Such a structure may be employed that bit lines BL and /BL are precharged to a potential (e.g., Vcc/2) intermediate the power supply voltage Vcc and the ground potential, in which case the current consumption can be reduced. This bit line load circuit may be utilized in first to fifth embodiments.

Figure 52:
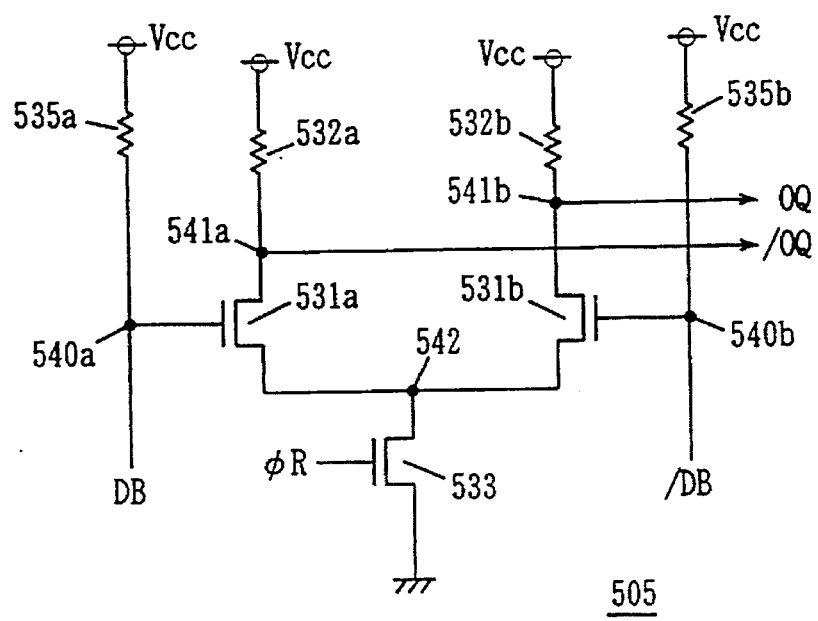
FIG. 52 shows an example of a structure of a differential amplifier of a current sense type shown in FIG. 46.

FIG. 52 shows an example of the structure of the current sense type differential amplifier. In FIG. 52, differential amplifier 505 of the current sense type includes a resistor element 535a for current/voltage conversion arranged between the power voltage supply node and a node 540a, a resistor element 535b for current/voltage conversion arranged between the power voltage supply node and a node 540b, and n-channel MOS transistors 531a and 531b differentially amplifying signal potentials on nodes 540a and 540b. Transistor 531a is connected at one conduction terminal to a node 541a, at its gate to node 540a, and at another conduction terminal to a node 542. Transistor 531b is connected at one conduction terminal to a node 541b, at another conduction terminal to node 542, and at its gate to a node 540b. Nodes 540a and 540b are connected to internal data lines DB and /DB, respectively.

Differential amplifier 505 further includes resistor elements 532a and 532b which are arranged between nodes 541a and 541b and the power voltage supply node, respectively, and an n-channel MOS transistor 533 which is arranged between node 542 and ground potential supply node and is turned on in response to read instruction signal φR. Turn-on of transistor 533 forms a current path for transistors 531a and 531b having commonly coupled sources.

When a larger current flows through internal data line DB, the potential of node 540a becomes lower than the potential of node 540b. Thereby, a current flows through transistor 531b, and the potential of node 541b lowers. The potential of node 541a has been pulled up by resistor element 532a to "H" level. Thereby, internal data OQ and /OQ can be produced in accordance with presence/absence of the current appearing on internal data lines DB and /DB.

Read data OQ and /OQ supplied from differential amplifier 505 may be further amplified by an amplifier circuit for supplying to an output buffer as internal read data Q. Resistor elements 535a and 535b for current/voltage conversion may be replaced with diode elements.

Differential amplifier 505 may be of the current mirror type or may include bipolar transistors.

Figure 53:
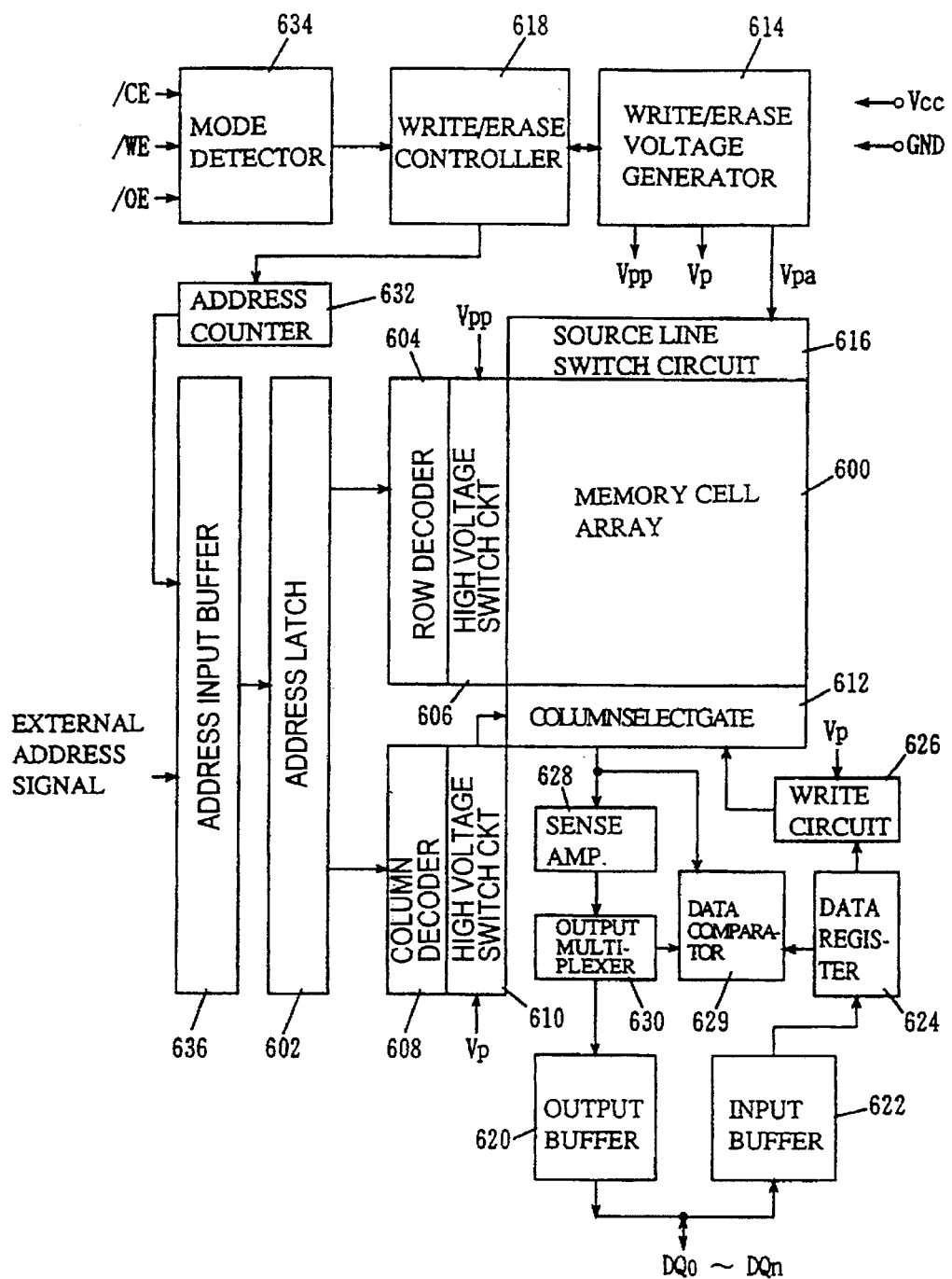
FIG. 53 shows a whole structure of the non-volatile memory device of the sixth embodiment of the invention.
Figure 54A:
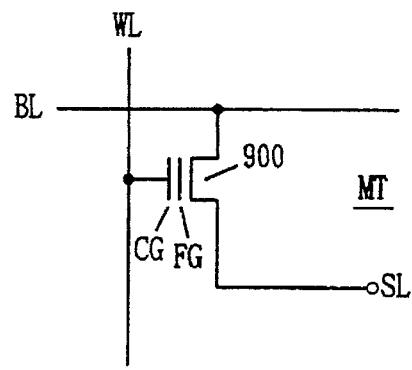
FIGS. 54A and 54B show a structure of a conventional non-volatile memory cell and a sectional structure of the same, respectively.
Figure 54B:
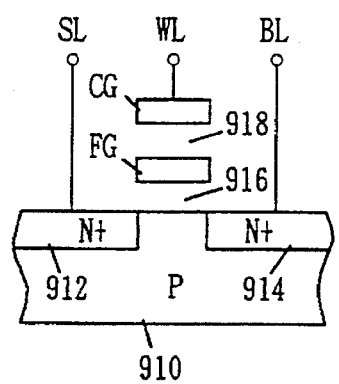
Figure 55:
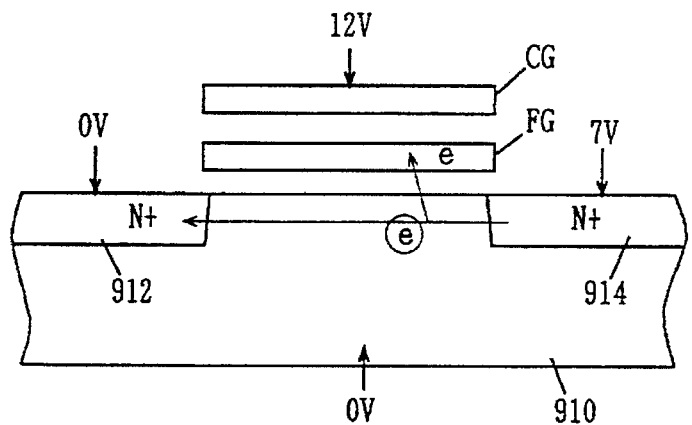
FIG. 55 represents operation of injecting electrons into a floating gate in the conventional non-volatile memory cell.
Figure 56:
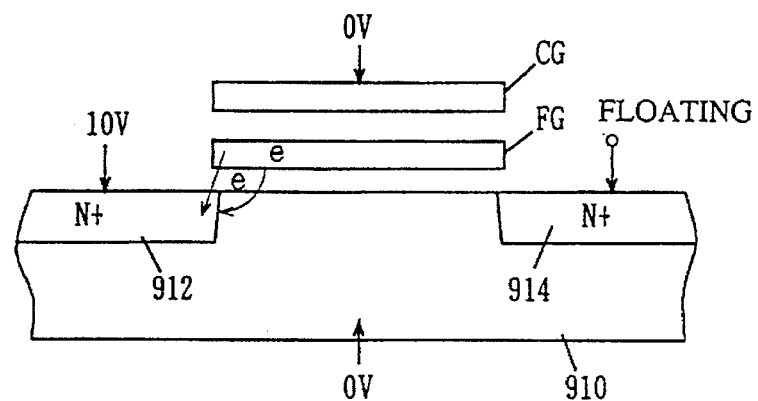
FIG. 56 represents operation of removing electrons from the floating gate in the conventional non-volatile memory cell.
Figure 57:
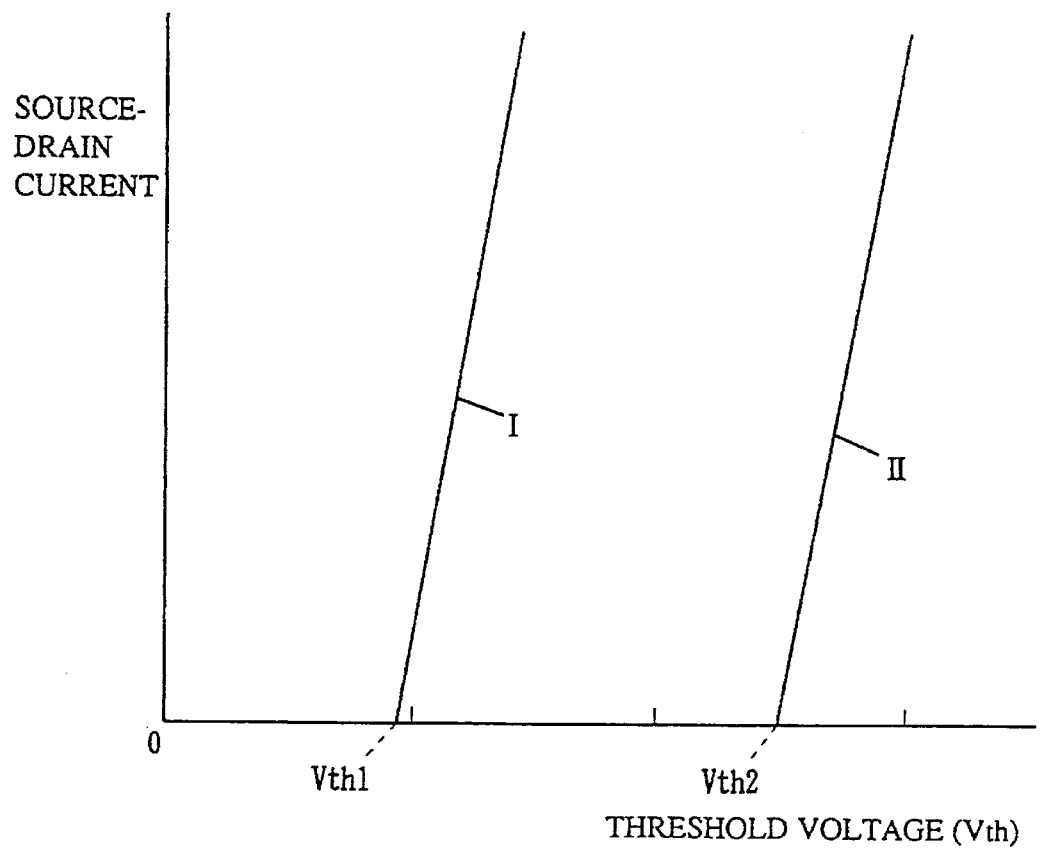
FIG. 57 represents a relationship between a quantity of electrons contained in the floating gate and its threshold voltage.

FIG. 53 shows a whole structure of the non-volatile memory device according to the sixth embodiment. In FIG. 53, the non-volatile memory device includes a memory cell array 600 including memory cells arranged in a matrix of rows and columns, a row decoder 604 which decodes an address signal sent from an address latch 602 and generates a word line designating signal for designating a corresponding word line, a high voltage switch circuit 606 which transmits a word line drive signal to the corresponding word line in memory cell array 600 in accordance with the word line designating signal sent from row decoder 604, a column decoder 608 which decodes the address signal sent from the address latch 602 and generates a column select signal for designating a corresponding column in memory cell array 600, a high voltage switch circuit 610 which converts the level of the column select signal sent from column decoder 608 in accordance with an operation mode for outputting, and a column select gate 612 which selects a corresponding bit line pair in the memory cell array 600 in accordance with the column select signal sent from high voltage switch 610.

High voltage switch circuit 606 driving the selected word line is supplied with high voltage Vpp or power supply voltage Vcc from a write/erase voltage generating circuit 614 which will be described later. High voltage switch circuit 610 generating the column select signal is supplied with high voltage Vp or power supply voltage Vcc from write/erase voltage generating circuit 614.

Memory cell array 600 is provided with a source line switch circuit 616 for setting the potential of a source line (node 502 shown in FIG. 48) of a memory cell. Source line switch circuit 616 may be constructed such that source potentials of the memory cells in one row are simultaneously set, or such that source potentials of the memory cells in one column or a unit sector are simultaneously set. The operation of source line switch circuit 616 is controlled by a write/erase control circuit 618 which will be described later.

The non-volatile memory device further includes an output buffer 620 externally outputting data, an input buffer 622 receiving externally applied write data, a data register 624 latching write data supplied from input buffer 622, and a write circuit 626 which performs the level conversion in accordance with data held by data register 624 and transmits data to selected bit lines BL and /BL. Write circuit 626 is supplied with high voltage Vp from write/erase voltage generating circuit 614. Write circuit 626 transmits high voltage Vp to bit lines BL and /BL in the "pre-write erase" operation. In the "write" cycle, high voltage Vp and the voltage of ground potential GND (0 V) are generated in accordance with data held by data register 624 and are transmitted onto selected bit lines /BL and /BL, respectively. The operation of this write circuit 626 is the same as that of an ordinary "flash memory" except for that logically complementary signals are generated in accordance with the write data. The structure of write circuit in the ordinary "flash memory" can be utilized.

The memory device further includes a sense amplifier 628 which senses information of the currents flowing through the bit line pair selected by column select gate 612, and an output multiplexer 630 which outputs the information sensed by sense amplifier 628 to one of output buffer 620 and data comparator 629. Output multiplexer 630 supplies the read data sent from sense amplifier 628 to data comparator 629 in the data write operation. In the normal operation, output buffer 630 transmits internal read data sent from sense amplifier 628 to output buffer 620. In the write cycle, data comparator 629 makes comparison between the data supplied from output multiplexer 630 and data held by data register 624 to determine whether the data is written correctly or not. In the erase cycle, data comparator 629 determines whether currents flow through both internal data lines DB and /DB or not, and determines whether the memory cell is set to the erased state or not. The operation of data comparator 629 is controlled by write/erase control circuit 618.

The memory device further includes a mode detecting circuit 634 which detects the designated operation mode in response to externally applied control signals /CE, WE and /OE, an address counter 632 which is activated under the control of write/erase control circuit 618 to generate the address in the write operation, and an address input buffer 636 which selects one of the output count of address counter 632 and the externally applied address signal under the control of write/erase control circuit 618. The output of address input buffer 636 is supplied to and latched by address latch 602.

Mode detecting circuit 634 activates output buffer 620 when the normal data read operation mode is designated. When the data write operation mode is designated, input buffer 622 is activated, and write/erase control circuit 618 is activated. When the data write is designated, write/erase control circuit 618 controls the operation required for the write cycle, pre-erase write cycle and erase cycle, and controls write/erase voltage generating circuit 614 to generate a necessary voltage. The structures of these peripheral circuits are the same as those of the normal "flash memory".

According to the sixth embodiment, as described above, since information is read onto a pair of complementary signal lines, data can be read fast. Since one memory cell includes two floating gate type transistors, the data read operation is performed by differentially amplifying storage information of these floating gate type transistors, so that it is not necessary to strictly set the threshold voltages of the floating gate type transistors contained in the memory cell to a constant value.

[Another Modification]

The memory cell of the sixth embodiment may be of an ultraviolet ray erasable type. Although this requires an expensive package having a transmission window for ultraviolet radiation, access speed can be further increased.

In the structures of non-volatile SRAMs of first to fifth embodiments, internal data lines used as the write data lines may be provided independently from the internal data lines used as the read data lines. The first to sixth embodiments may employ such a structure that the tunneling current is used for both the injection and removal of electrons with respect to the floating gates of floating gate type transistors. Also such a structure may be employed that the removal and injection of electrons are performed between the floating gate and the substrate (channel region).

According to the first to fifth embodiments, as described above, the floating gate type transistors are used as the components of the SRAM cells, these embodiments can provide the SRAM which can non-volatilely store the information.

According to the sixth embodiment, since one memory cell includes two floating gate type transistors, the structure differentially amplifying the complementary signals can be utilized, so that data can be read at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device comprising:

a plurality of memory cells arranged in a matrix of rows and columns, each of said plurality of memory cells including a pair of cross-coupled transistors connected such that said paired transistors latch signal potentials of first and second nodes receiving logically complementary data signals, and first and second floating gate type transistors connected between said first node and a third node and between said second node and a fourth node, respectively, and each of said first and second floating gate transistors having a control gate connected to a fifth node; and potential setting means for setting potentials of said third and fourth nodes to a first potential and setting a potential of said fifth node to a second potential higher than said first potential in a first operation mode, setting potentials of said third and fourth nodes to a third potential and setting a potential of said fifth node to a fourth potential lower than said first and third potentials in a second operation mode, and setting potentials of said third, fourth and fifth nodes to a potential intermediate said third and fourth potentials in a third operation mode.

2. A non-volatile semiconductor memory device according to claim 1, wherein said fourth potential is a ground potential, and said third operation mode is a normal access mode in which said plurality of memory cells are randomly accessed for data reading or data writing, and the potential between said third and fourth potential is an operation power supply potential.

3. A non-volatile semiconductor memory device according to claim 1, wherein said third potential is higher than said first potential, and said first potential is higher than a normal operation power supply potential utilized in a normal access mode in which said plurality of memory cells are randomly accessed for data reading or data writing.

4. A non-volatile semiconductor memory device according to claim 1, wherein said potential setting means includes, a mode detector coupled to receive a mode designating signal, for detecting an operation mode designated by said mode designating signal, a first potential generator activated when said mode detector detects said first operation mode, for generating said first potential, a second potential generator activated when said node detector detects said first operation mode, a third potential generator activated when said mode detector detects said second operation mode, for generating said third potential, a fourth potential generator generating said fourth potential, a means supplying a normal operation power supply potential, a first selector for selecting one of outputs of said first and third potential generators and said means for passage to said third and fourth nodes, in accordance with an output of said mode detector, and a second selector for selecting one of outputs of said second and fourth potential generators and said means for passage to said fifth node, in accordance with the output of said mode detector.

5. A non-volatile semiconductor memory device according to claim 1, wherein said first and second floating gate type transistors are brought into an over-erased state in said second operation mode, to have negative threshold voltages.

6. A non-volatile semiconductor memory device according to claim 1, further comprising, a plurality of word lines arranged corresponding to the rows of memory cells and each of said plurality of word lines connecting memory cells of a corresponding row, a plurality of pairs of bit lines arranged corresponding to the columns of memory cells, and means for bringing said plurality of word lines into a non-selected state to isolate said plurality of memory cells from corresponding pairs of bit lines in said first and second operation modes.

7. A non-volatile semiconductor memory device according to claim 1, further comprising, memory selection means for selecting a memory cell among said plurality of memory cells in accordance with an address signal, and write means for setting potentials at said first and second nodes of a memory cell selected by said memory selection means at said fourth potential level in said second operation mode.

8. A non-volatile memory cell for non-volatilely storing signal potentials of first and second nodes, comprising:

flip-flop means including a pair of cross-coupled transistors and for latching mutually and logically complementary signal potentials of said first and second nodes;

a pair of floating gate type transistors connected between a power supply node and said first and second nodes for non-volatilely storing signal potentials of said first and second nodes, said pair of floating gate type transistors having control gates connected to a control electrode node, said power supply node and said control electrode node receiving a predetermined power supply voltage in a normal operation mode, said power supply node and said control electrode node receiving a first high voltage higher than said power supply voltage and a second high voltage higher than said first high voltage, respectively, in an operation mode of non-volatilely storing the signal potentials of said first and second nodes, and said power supply node and said control electrode node receiving a third high voltage higher than said first high voltage and a ground potential, respectively, in an operation mode of erasing the non-volatilely stored signal potentials.

9. A non-volatile memory cell for non-volatilely storing potentials of first and second nodes, comprising:

flip-flop means including a pair of cross-coupled field-effect transistors, for latching mutually and logically complementary signal potentials of said first and second nodes;

a floating gate type transistor connected between a power supply node and said first node, said floating gate type transistor having a control gate connected to a control electrode node, one conduction node directly connected to said power supply node and another conduction node connected to said first node, said power supply node and said control electrode node receiving a predetermined power supply voltage in a normal operation mode, said power supply node and said control electrode node receiving voltages having a potential difference enough to cause injection of electrons into a floating gate with hot electrons generated by avalanche breakdown in said floating gate type transistor in an operation mode of non-volatilely storing signal potentials of said first and second nodes, said power supply node and said control electrode node receiving voltages having a potential difference enough to cause a tunneling current flowing from a floating gate to said power supply node in a floating gate type transistor containing the electrons injected in the floating gate out of said floating gate type transistor in an erase mode of erasing the non-volatilely stored signal potentials of said first and second nodes.

10. A non-volatile semiconductor memory cell, according to claim 9, further comprising a load element connected between a power source node supplying said predetermined power supply voltage and said second node.

11. A non-volatile semiconductor memory cell according to claim 10, wherein said load element comprises a resistance-connected, insulated gate type field effect transistor having a common conductivity type with said cross-coupled field-effect transistors.

12. A non-volatile semiconductor memory device according to claim 9, further comprising another floating gate type transistor connected between said power supply node and said second node and having a control gate connected to said control electrode node, one conduction node connected to said power supply node, and another conduction node connected to said second node.

13. A non-volatile memory device comprising:

a plurality of word lines arranged along a row direction;

a plurality of bit line pairs arranged along a column direction and each pair including first and second bit lines;

a plurality of memory cells arranged corresponding to respective crossings of said plurality of word lines and said plurality of bit line pairs, each of said plurality of memory cells including first and second storage nodes receiving mutually complementary data signals, first and second access transistors responsive to a signal potential on a corresponding word line to connect said first and second storage nodes to said first and second bit lines of a corresponding bit line pair, respectively, a first field-effect transistor having one conduction terminal connected to said first storage node, another conduction terminal connected to a first internal node and a control gate connected to said second storage node, and a second field-effect transistor having one conduction terminal connected to said second storage node, another conduction terminal connected to a second internal node and a control gate connected to said first storage node, at least one of said first and second field-effect transistors having a floating gate provided isolatedly from said control gate for accumulating electric charges;

selecting means for selecting a corresponding memory cell among said plurality of memory cells in accordance with an address signal;

data latch means for latching data of the memory cell selected by said selecting means;

potential transmitting means for transmitting first and second high voltages corresponding to the data latched by said data latch means to said first and second bit lines of a bit line pair provided corresponding to the memory cell selected by said selecting means in a first operation mode, respectively;

second potential transmitting means for transmitting higher one of said first and second high voltages to the word line connected to said memory cell selected by said selecting means in said first operation mode, and setting all the potentials of said plurality of word lines to a ground potential indicative of a nonselected state in a second operation mode; and source potential setting means for transmitting the power supply voltage and the ground potential to said first and second internal nodes of said memory cell selected by said selecting means in accordance with the data latched by said data latch means in said first operation mode, and setting said first and second internal nodes to a third high voltage level in said second operation mode.

14. A non-volatile semiconductor memory device according to claim 13 wherein each of said plurality of memory cells further includes a flip-flop having cross-coupled field effect transistors of a conductivity type opposite to that of said first and second field effect transistors to implement an inverter latch.

15. A non-volatile semiconductor memory device according to claim 13, wherein each of said first and second field effect transistors includes said floating gate.

16. A non-volatile semiconductor memory device according to claim 13, wherein only one of said first and second field effect transistors includes said floating gate.

17. A non-volatile semiconductor memory device according to claim 13, wherein said first and second internal nodes are set at a ground potential in a normal operation mode in which said plurality of memory cells are randomly accessed for data reading or data writing.

18. A semiconductor memory device according to claim 13, wherein each of said plurality of memory cells further includes a load element connected between said first storage node and a power supply node supplying said power supply potential, and another load element connected between said second storage node and said power supply node.

19. A non-volatile memory device comprising:

a plurality of word lines arranged along a row direction;

a plurality of bit line pairs arranged along a column direction and each pair including first and second bit lines;

a plurality of memory cells arranged corresponding to respective crossings of said plurality of word lines and said plurality of bit line pairs, each of said plurality of memory cells including first and second storage nodes holding mutually and logically complementary data signals, first and second access transistors responsive to a signal potential on a corresponding word line to connect said first and second storage nodes to said first and second bit lines of a corresponding bit line pair, and a flip-flop for holding signal potentials of said first and second storage nodes and having cross-coupled transistor pair including at least one floating gate type transistor, said flip-flop being connected between said first and second storage nodes and first and second internal nodes;

selecting means for selecting a corresponding memory cell among said plurality of memory cells in accordance with an address signal;

latch means for latching data of the memory cell selected by said selecting means;

bit line potential setting means for transmitting a first high potential higher than an operation power supply potential corresponding to the data latched by said data latch means and a ground potential to said first and second bit lines of the bit line pair connected to said memory cell selected by said selecting means in a non-volatile storage mode;

word line potential setting means for transmitting said first high potential to the word line connected to said memory cell selected by said selecting means in said non-volatile storage mode; and source potential setting means for transmitting, a second high potential intermediate said first high potential and said operation power supply potential to said first and second internal nodes of said memory cell selected by said selecting means in said non-volatile mode, transmitting a third high voltage between said first and second potentials to said first and second internal nodes in said erase mode, and setting said first and second internal nodes to said operation power supply potential in a normal operation mode.

20. A non-volatile semiconductor memory device according to claim 19, wherein said first potential and said second potential has such a potential difference that when said first and second potentials are applied to a control gate and one conduction terminal of said floating gate type transistors, hot electrons due to avalanche breakdown are generated to be injected into the floating gate, with another conduction terminal of said floating gate type transistor receiving a ground potential.

21. A non-volatile semiconductor memory device according to claim 19, wherein said floating gate type transistor causes a tunneling current from one conduction terminal into the floating gate when said third high potential and the ground potential are applied to the one conduction terminal and a control gate respectively of said floating gate type transistor.

22. A non-volatile semiconductor memory device according to claim 19, wherein each of said plurality of memory cells further includes another flip-flop coupled between said first and second storage nodes and a ground potential supply node including cross-coupled transistors having a common conductivity type with said floating gate type transistors.

23. A non-volatile semiconductor memory device according to claim 19, wherein said bit line potential setting means set the potential of the first and second bit lines coupled to the memory cell selected by said selecting means to a ground potential in the erase mode.

24. A non-volatile semiconductor memory device according to claim 19, further comprising, writing means coupled to said latching means and said plurality of pairs of bit lines for writing data latched by said latching means into the memory cell selected by said selecting means after the erase mode of operation is completed.

25. A non-volatile memory cell comprising:

a first floating gate type transistor having a control gate receiving a word line select signal, one conduction terminal connected to a first node, another conduction terminal connected to a first bit line, and a floating gate accumulating electric charges; and a second floating gate type transistor having a control gate receiving said word line select signal, one conduction terminal connected to said first node, another conduction terminal connected to a second bit line transmitting a data signal complementary to a data signal on said first bit line, and a floating gate accumulating electric charges, wherein said control gate of each of said first and second floating gate type transistors receives the word line select signal at a first high potential in a pre-erase write cycle and in a program cycle, and at a ground potential in an erase cycle, said one conduction terminal of said first and second floating gate type transistors receive a wound potential in the pre-erase cycle and in the program cycle and a second high potential lower than said first high potential, and the other conduction terminal of each of said first and second floating gate type transistors receives a third high potential lower than said second high potential in the pre-erase cycle, is brought into an electrically floating state in the erase cycle, and receives a data signal corresponding to data to be programmed in the program cycle, the data signal being set to the third high potential if it is a high level signal.

26. A non-volatile semiconductor memory cell according to claim 25, wherein said first and second bit lines are coupled to a current sense type differential amplifier when the cell is selected.

27. A non-volatile semiconductor memory cell according to claim 25, wherein said first and second bit lines are provided with load elements for setting said first and second bit lines to a predetermined potential in a normal mode of operation.

* * * * *